United States Patent [19]

Masuoka

[11] 4,437,172

[45] Mar. 13, 1984

[54] SEMICONDUCTOR MEMORY DEVICE

[75] Inventor: Fujio Masuoka, Yokohama, Japan

[73] Assignee: Tokyo Shibaura Denki Kabushiki Kaisha, Kawasaki, Japan

[21] Appl. No.: 321,320

[22] Filed: Nov. 13, 1981

[30] Foreign Application Priority Data

Dec. 8, 1980 [JP] Japan ................. 55/172915
Dec. 8, 1980 [JP] Japan ................. 55/172916
Dec. 8, 1980 [JP] Japan ................. 55/172917
Dec. 20, 1980 [JP] Japan ................. 55/180953
Jul. 30, 1981 [JP] Japan ................. 56/119780
Jul. 30, 1981 [JP] Japan ................. 56/119781

[51] Int. Cl.$^3$ ............................................. G11C 11/40
[52] U.S. Cl. .................................. 365/182; 365/185; 365/218; 357/41
[58] Field of Search ............... 365/182, 185, 218; 357/41

[56] References Cited

U.S. PATENT DOCUMENTS 4,119,995 10/1978 Simko .
4,203,158 5/1980 Frohman-Bentchkowsky et al. .................................. 365/185

FOREIGN PATENT DOCUMENTS 37201 10/1981 European Pat. Off. .
2455333 11/1980 France .
5213782 2/1977 Japan .

OTHER PUBLICATIONS

IBM Technical Disclosure Bulletin, Hoffman, Nov. 1979, "Floating Gate Nonvolatile Memory Cell" vol. 22, #6, pp. 2403-2404.
IEEE Transactions on Electron Devices, Gerber, Jul. 1980, "Low Voltage Single Supply CMOS Electrically Erasable Read-Only Memory".
1980 IEEE International Solid-State Circuit Conference 152 (Feb. 1980), A 16Kb Electrically Erasable Nonvolatile Memory.

Primary Examiner—Terrell W. Fears
Attorney, Agent, or Firm—Finnegan, Henderson, Farabow, Garrett & Dunner

[57] ABSTRACT

A semiconductor memory device constituted by an MOS transistor which has a control gate and a floating gate capable of storing data. An erase gate is further provided to discharge electrons from the floating gate by field emission. The semiconductor memory device is further provided with a first voltage supply circuit for supplying a voltage of high level for erasing the data to the erase gate and a second voltage supply circuit for supplying a voltage of low level to the control gate.

25 Claims, 93 Drawing Figures

F I G. 13E
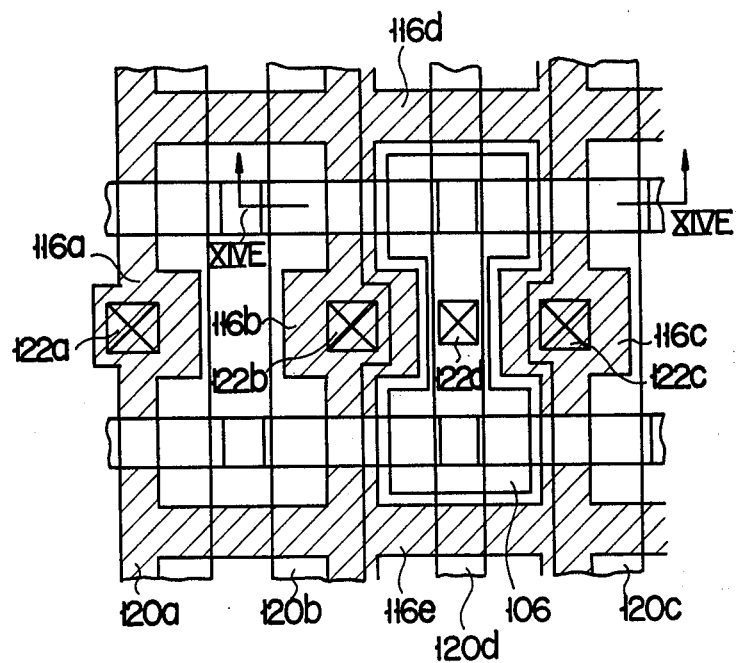

F I G. 19C
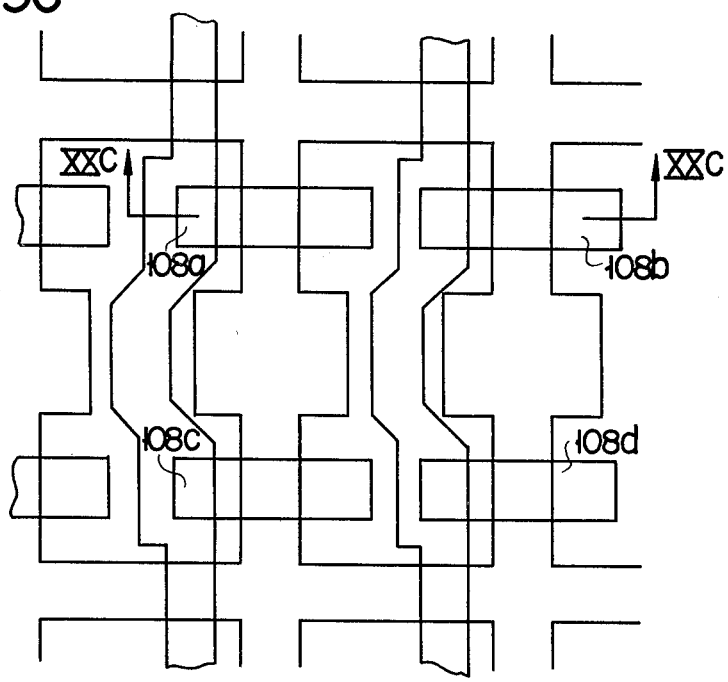
F I G. 19D
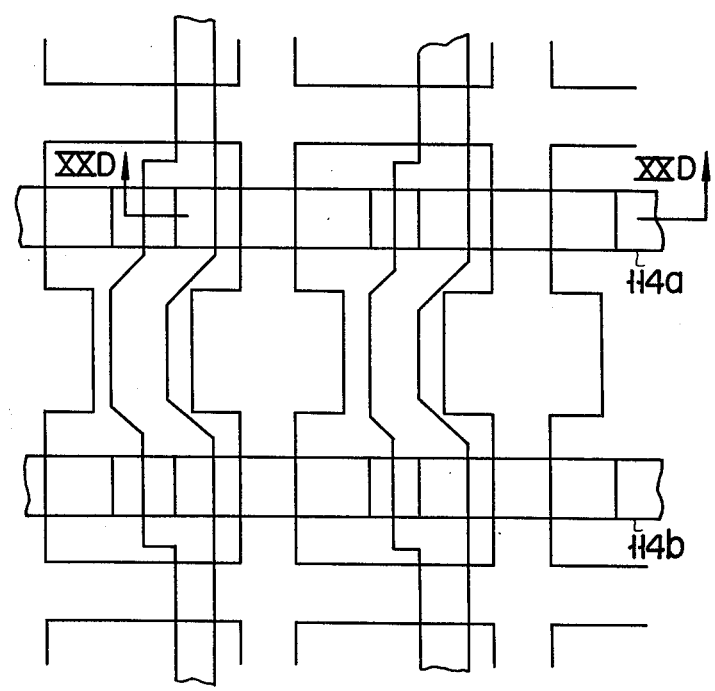

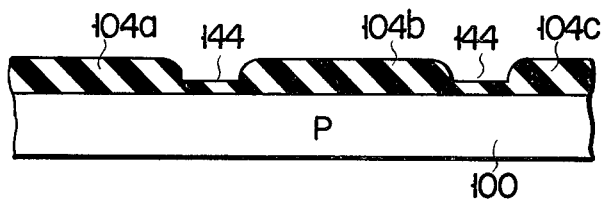
F I G. 20A
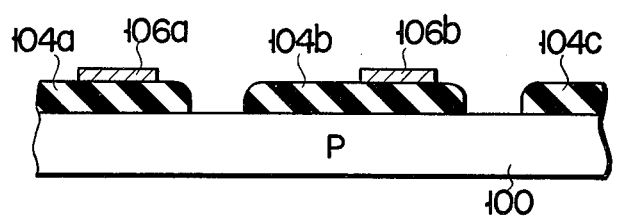
F I G. 20B
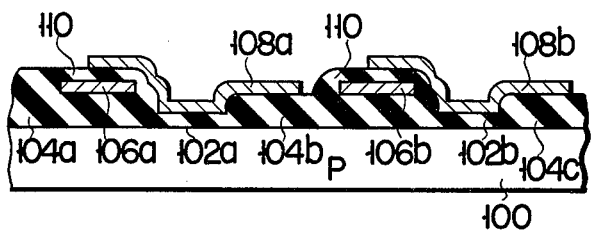
F I G. 20C
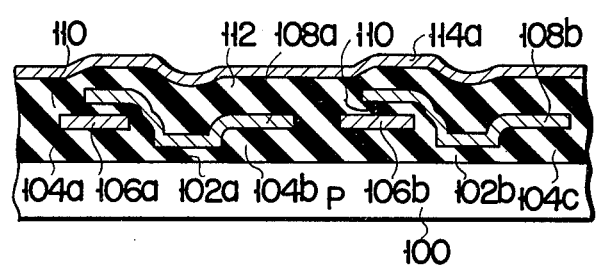
F I G. 20D
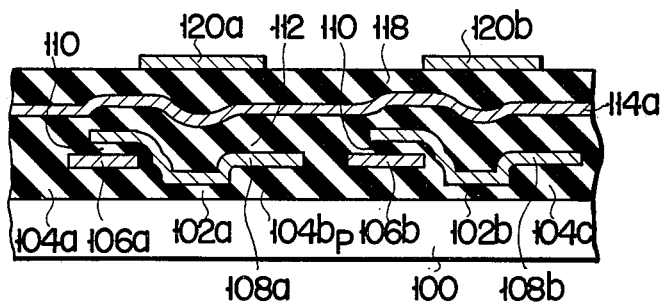
F I G. 20E F I G. 22
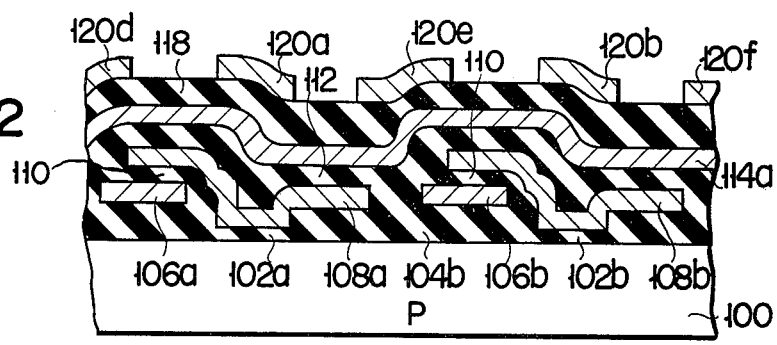
F I G. 23
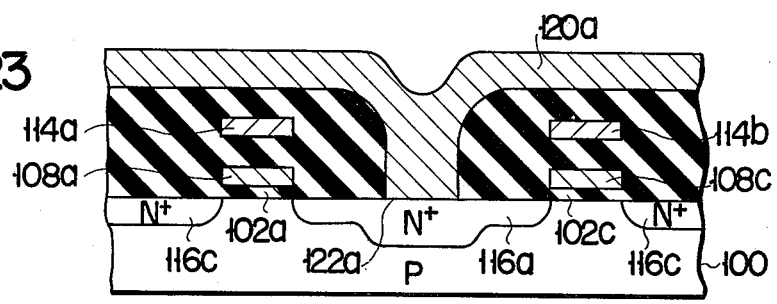
F I G. 24A
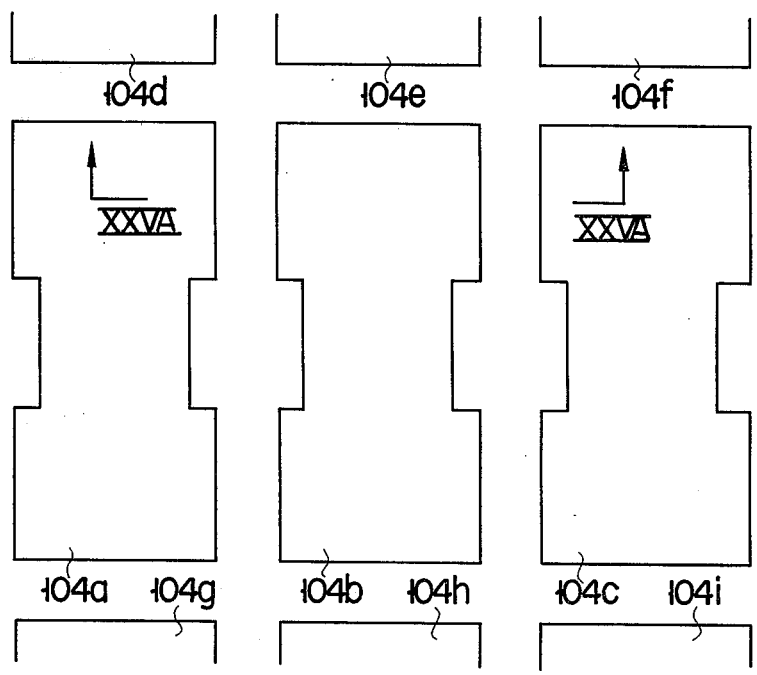

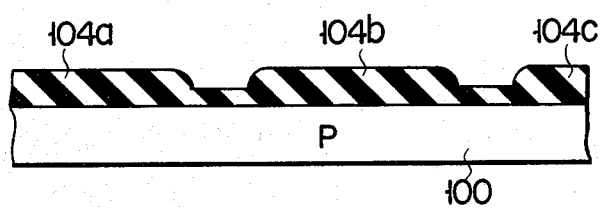
F I G. 25A
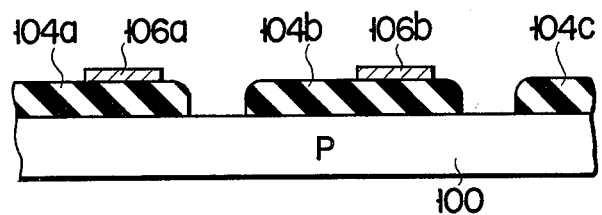
F I G. 25B
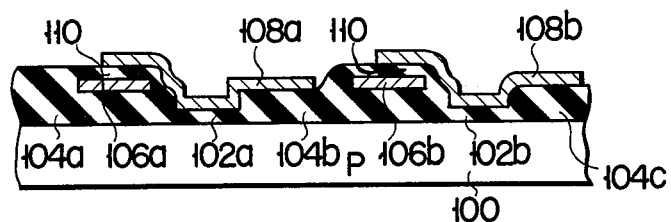
F I G. 25C
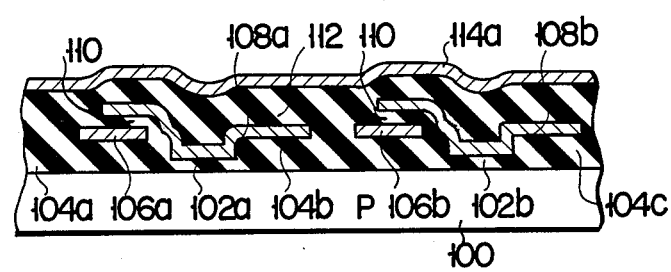
F I G. 25D
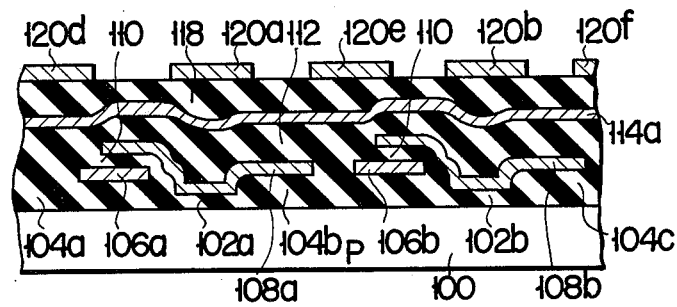
F I G. 25E F I G. 31E
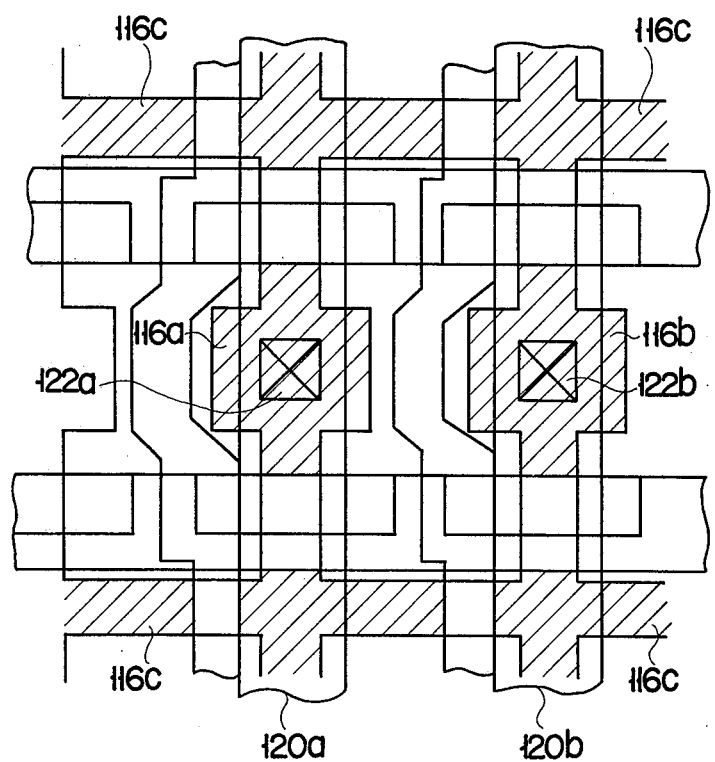

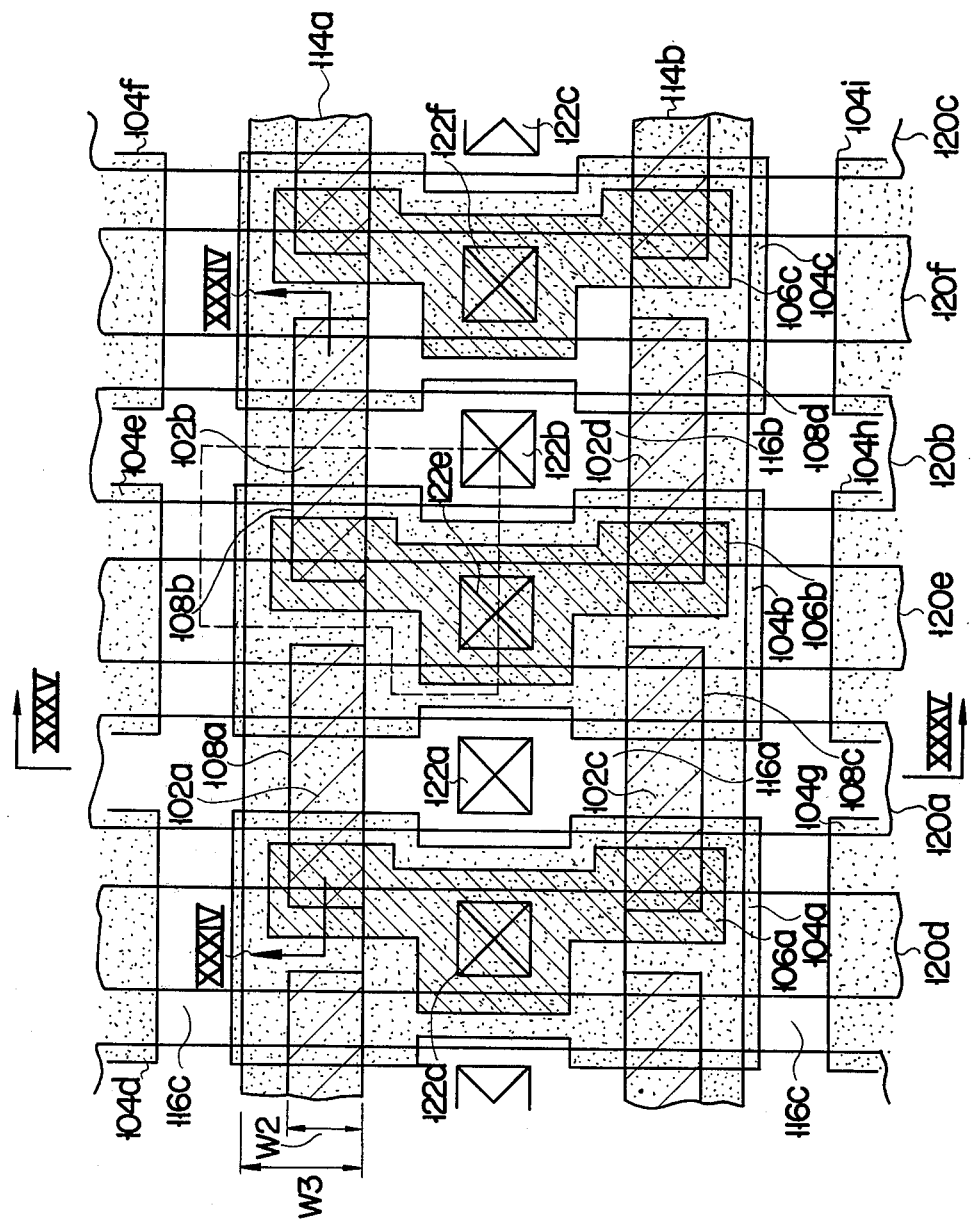
F I G. 33

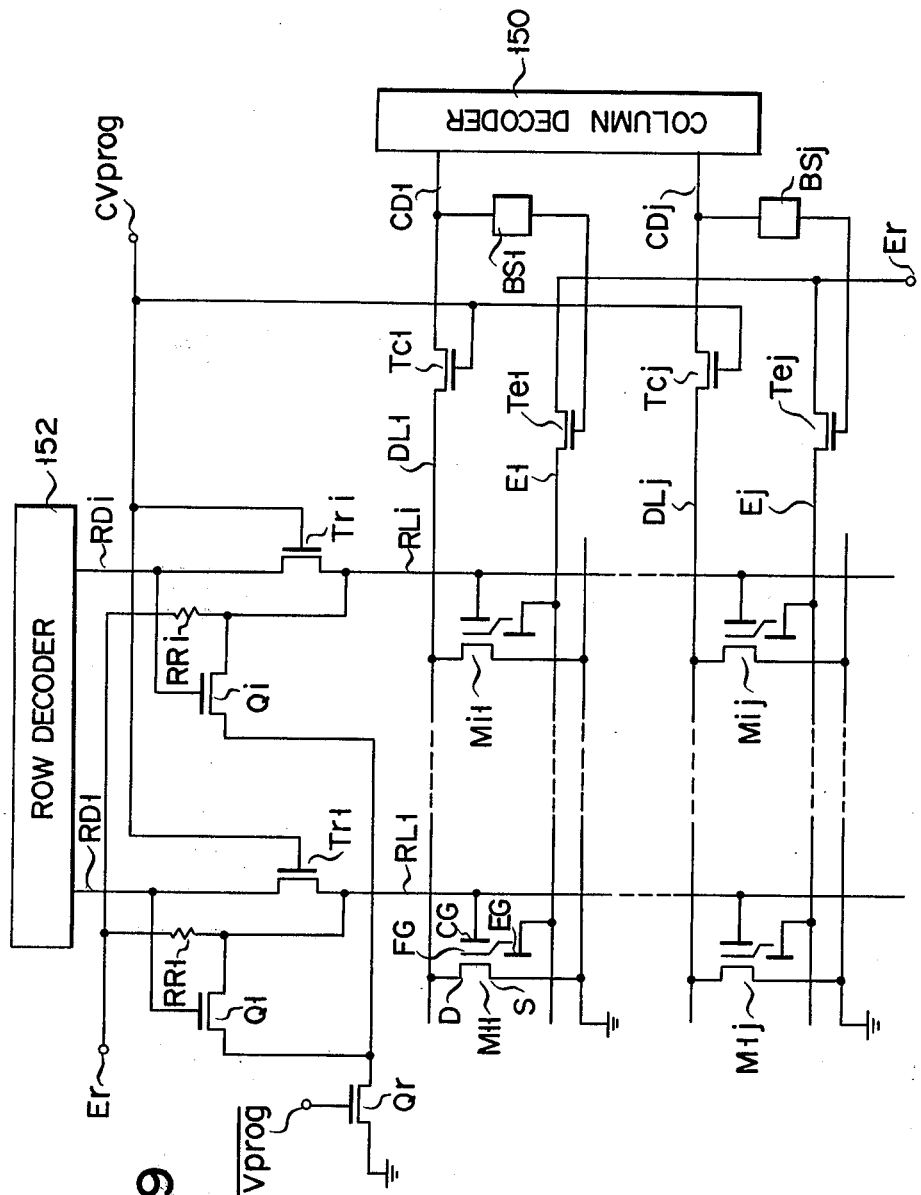
F I G. 39

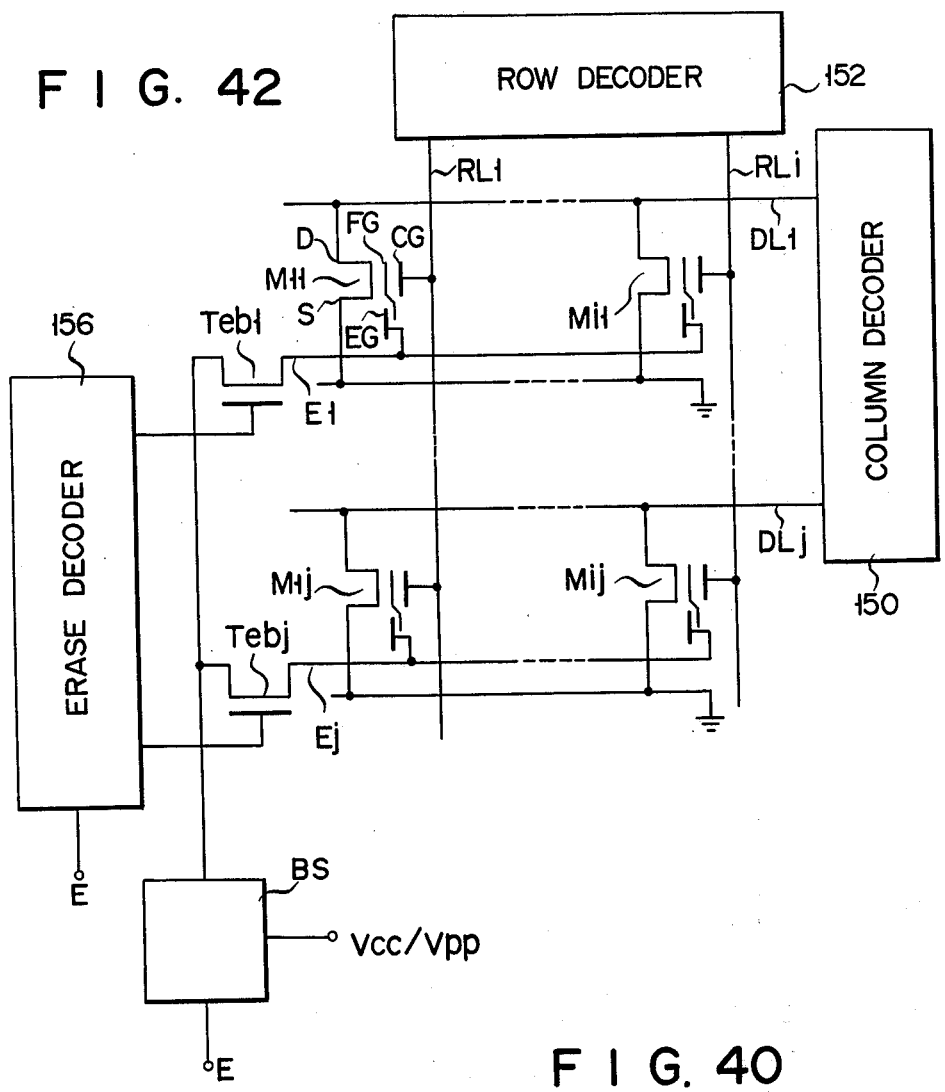
F I G. 42
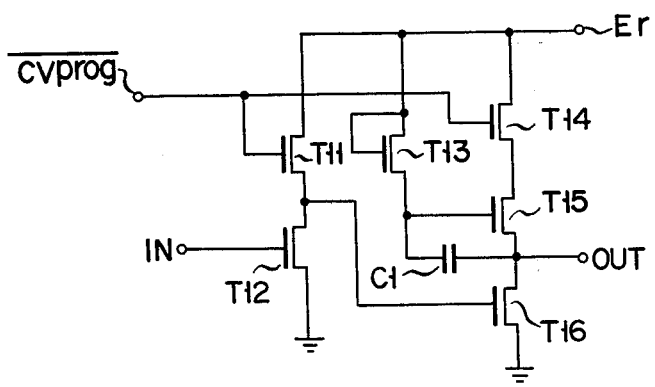
F I G. 40

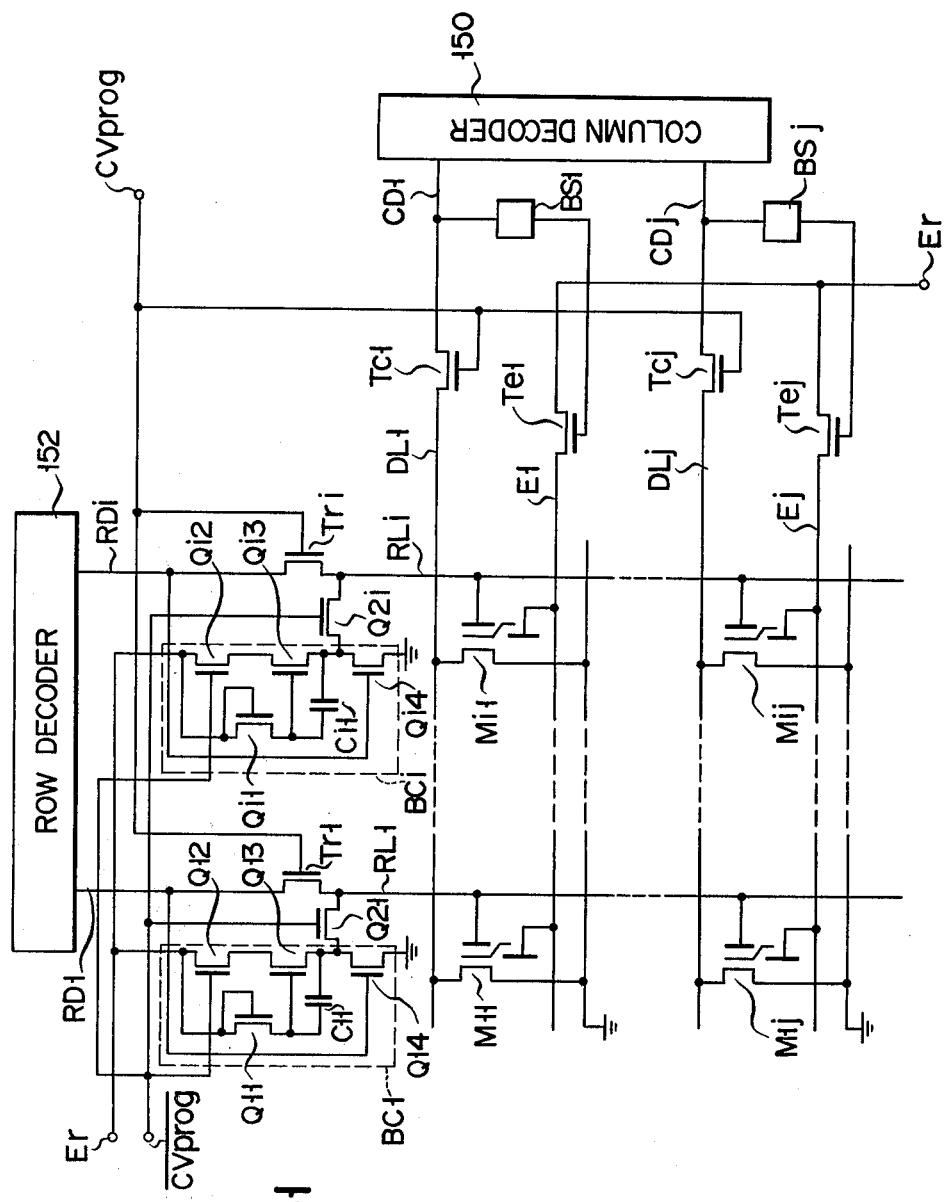
F I G. 41

F I G. 44
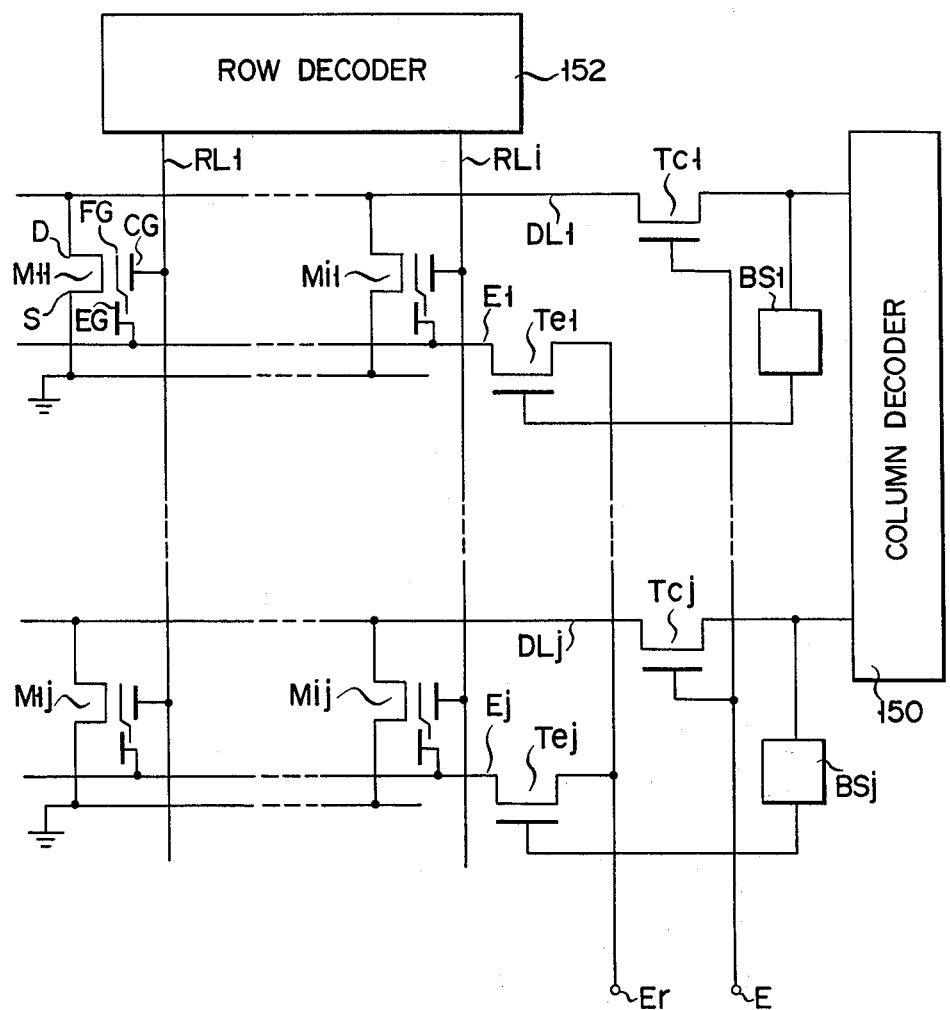

SEMICONDUCTOR MEMORY DEVICE

BACKGROUND OF THE INVENTION

The present invention relates to a semiconductor memory device suitable for an electrically erasable and electrically programmable read-only memory.

Writing and erasing of data after manufacture is possible with an erasable and electrically programmable read-only memory (EP-ROM) The EP-ROMs are roughly classified into the ultraviolet ray erasable type and into the electrically erasable type. A high packaging density may be accomplished with an EP-ROM of the ultraviolet ray erasable type, since one transistor may comprise one memory cell. The ultraviolet ray erasable type EP-ROMs of 32 kbit and 64 kbit have been developed so far. However, the EP-ROMs of the ultraviolet ray erasable type are defective in that manufacturing cost becomes high since a package is required which transmits the ultraviolet rays. On the other hand, a satisfactory packaging density may not be accomplished with the electrically erasable and programmable read-only memory (E²P-ROM) since at least two transistors constitute one memory cell. E²P-ROMs of 16 kbit have so far been developed. However, the E²P-ROMs of the electrically erasable type are advantageous in that manufacturing costs may be reduced by using a less expensive plastic material for the package FIG. 1 is a circuit diagram of a memory cell of a conventional E²P-ROM disclosed in "A 16 kb Electrically Erasable Nonvolatile Memory", ISSCC Digest of Technical Papers, 1980, Feb. pp 152 to 153 and 271 by W. S. Johnson et al. This memory cell comprise two transistors Q1 and Q2. The transistor Q1 comprises a select MOS transistor and the transistor Q2 comprises a double gate type MOS transistor having a control gate 50 and a floating gate 52. One doped region of the transistor Q1 is connected to a digit line 54, and the other doped region thereof is connected to one doped region of the transistor Q2. The gate of the transistor Q1 is connected to a select line 56. The other doped region of the transistor Q2 is grounded, and the control gate thereof is connected to a data program line 58.

The conventional E²P-ROMs of the construction as described above have the following drawbacks.

(a1) As may be apparent from FIG. 1, one memory cell comprises two transistors. Therefore, the number of elements becomes twice that of the EP-ROMs of the ultraviolet ray erasable type, resulting in half the packaging density. The EP-ROMs of the electrically erasable type are inferior in the packaging density to those of the ultraviolet ray erasable type.

(a2) Voltages of both polarities of positive and negative are required for writing and erasing of data. Therefore, power sources of both polarities of positive and negative are required for mounting the E²P-ROMs of this type on a printed circuit board and for electrically writing and erasing data therein.

(a3) Extra circuits are required to simultaneously erase data in units of words or all the bits, resulting in a low packaging density.

(a4) It is difficult to erase data of all the bits within a short period of time.

(a5) It is impossible to erase data with a unipolar power source of 5 V, for example.

SUMMARY OF THE INVENTION

It is the first object of the present invention to provide a semiconductor memory device which is capable of erasing data with high efficiency and without an erroneous operation.

It is the second object of the present invention to provide a semiconductor memory device which is capable of erasing data in each column unit.

It is the third object of the present invention to provide a semiconductor memory device which is capable of erasing data in each bit unit.

It is the fourth object of the present invention to provide a semiconductor memory device whose writing efficiency and reading efficiency are improved.

In order to achieve the first object of the present invention, an MOS transistor having a floating gate and a control gate is provided with an erase gate for discharging electrons from the floating gate by field emission. The transistor is further provided with a first means for applying a voltage of high level to the erase gate and a second means for applying a voltage of low level to the control gate when data is erased.

Furthermore, if the semiconductor memory device is arranged so that a relation $C_{FC} \geq 2C_{FB}$ is satisfied between a capacitance $C_{FC}$ across the floating gate and the control gate and a capacitance $C_{FB}$ across the floating gate and the semiconductor region, data is not erased when the voltage of high level is applied to the control gate and the erase gate, and data is erased from the floating gate when the voltage of low level is applied to the control gate and at the same time the voltage of high level is applied to the erase gate.

If a capacitance between the floating gate and the erasing gate is defined as $C_{FC}$ and if the semiconductor memory device is arranged so that a relation $C_{FC} + C_{FB} \geq 5C_{FE}$ is established, the electrons may be efficiently discharged from the floating gate to the erase gate by field emission when the voltage of low level is applied to the control gate.

In order to achieve the second object of the present invention, a means for applying a voltage of high level to the erase gate may be arranged for each erase line.

In order to achieve the third object of the present invention, a first means for applying a voltage of high level to the erase gate may be arranged for each erase line unit disposed in the direction of column, and a second means for applying a voltage of low level to the control gate is arranged for each row line unit.

In order to achieve the fourth object of the present invention, a means for applying substantially the same voltage to erase gates and control gates of memory cells in the same line as the memory cell selected for reading out or writing may be arranged.

BRIEF DESCRIPTION OF THE DRAWINGS

Other objects and advantages of the present invention will become apparent from the following detailed description when taken in conjunction with the accompanying drawings in which:

FIGS. 13A to 13E are plan views of a semiconductor substrate for explaining a method for manufacturing the second group of memory cells shown in FIG. 9;

FIGS. 19A to 19E are plan views of a semiconductor substrate for explaining a method for manufacturing the third group of memory cells shown in FIG. 15;

FIGS. 20A to 20E are sectional views along the lines XXA—XXA, XXB—XXB, . . . , XXE—XXE, respectively, of FIGS. 19A to 19E;

FIG. 22 is a sectional view along the line XXII—XXII of FIG. 21;

FIG. 23 is a sectional view along the line XXIII—XXIII of FIG. 21;

FIGS. 24A to 24E are sectional views of a semiconductor substrate for explaining a method for manufacturing the fourth group of memory cells shown in FIG. 21;

FIGS. 25A to 25E are sectional views along the lines XXVA—XXVA, XXVB—XXVB, . . . , XXVE—XXVE, respectively, of FIGS. 24A to 24E;

FIGS. 31A to 31E are plan views of a semiconductor substrate for explaining a method for manufacturing the fifth group of memory cells shown in FIG. 26;

FIG. 33 is a plan view of a sixth group of memory cells constituting the semiconductor memory device according to the present invention;

FIG. 39 is a circuit diagram of a second embodiment of the semiconductor memory device according to the present invention;

FIG. 40 is a circuit diagram of a boost circuit used in the second embodiment of FIG. 39;

FIG. 41 is a circuit diagram of a third embodiment of the semiconductor memory device according to the present invention;

FIG. 42 is a circuit diagram of a fourth embodiment of the semiconductor memory device according to the present invention;

FIG. 44 is a circuit diagram of a sixth embodiment of the semiconductor memory device according to the present invention.

DETAILED DESCRIPTION OF THE PREFERRED EMBODIMENTS

Figure 2:
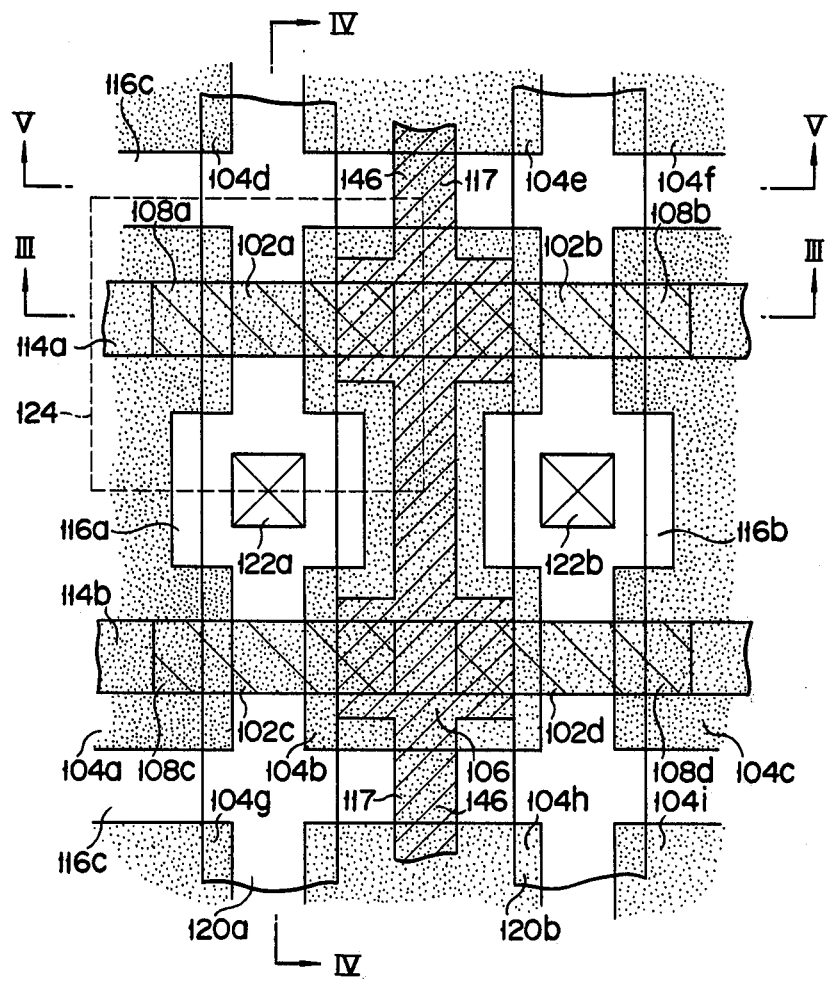
FIG. 2 is a plan view illustrating a first group of memory cells constituting the semiconductor memory device according to the present invention.
Figure 3:
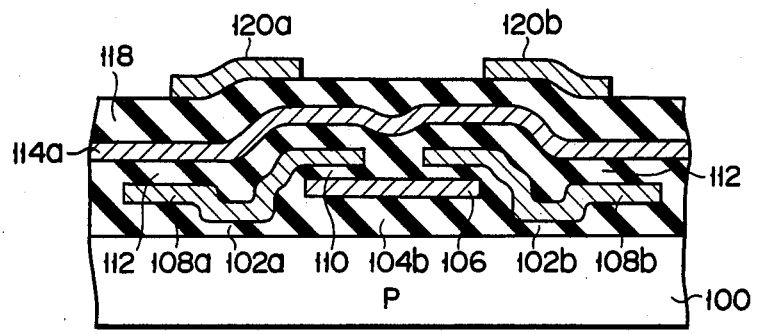
FIG. 3 is a sectional view along the line III—III of FIG. 2.
Figure 4:
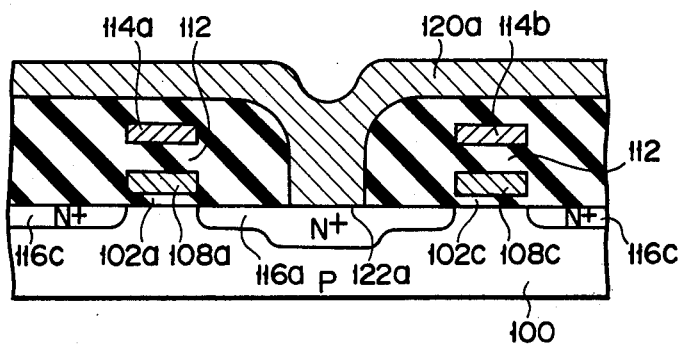
FIG. 4 is a sectional view along the line IV—IV of FIG. 2.
Figure 5:
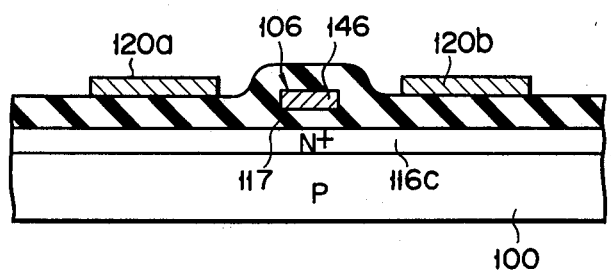
FIG. 5 is a sectional view along the line V—V of FIG. 2.

The first group of memory cells which constitute a semiconductor memory device according to the present invention will be described with reference to FIGS. 2 to 5 wherein FIG. 2 is a plan view of memory cells for 4 bits, FIG. 3 is a sectional view along the line III—III of FIG. 2, FIG. 4 is a sectional view along the line IV—IV of FIG. 2, and FIG. 5 is a sectional view along the line V—V of FIG. 2.

Referring to FIG. 2, the doped regions of the semiconductor substrate are indicated by the clear areas, the oxide areas are indicated by the dotted areas, and the polycrystalline silicon members are indicated by the cross-hatched areas. Gate insulating films 102a, 102b, 102c and 102d of 500 Å thickness each are formed on the surface of a P-type semiconductor substrate 100 with equal intervals in an X-Y matrix form. On the surface of the semiconductor substrate 100 are also formed field insulating films 104a, . . . 104i. The field insulating film 104b of 1 $\mu$ thickness is formed between the paired gate insulating films 102a and 102c are the paired gate insulating films 102b and 102d.

A first conductive layer 106 which has a thickness of 6,000 Å and which consists of polycrystalline silicon doped with phosphorus or arsenic is formed on the field insulating film 104b. Second conductive layers 108a, 108b, 108c and 108d which have a thickness of 5,000 Å and which consist of polycrystalline silicon are formed on the gate insulating films 102a, 102b, 102c and 102d, respectively, and are separate from one another. The right edges of the second conductive layers 108a and 108c overlap the left edge of the first conductive layer 106 with an insulating film 110 of 500 Å thickness interposed therebetween. The left edges of the second conductive layers 108b and 108d overlap the right edge of the first conductive layer 106 with this insulating film 110 interposed therebetween.

A third conductive layer 114a of polycrystalline silicon is formed on the second conductive layers 108a and 108b with an insulating film 112 having a thickness of 1,000 to 2,000 Å interposed therebetween. The third conductive layer 114a has substantially the same width as those of the second conductive layers 108a and 108b. Another third conductive layer 114b of polycrystalline silicon is formed on the other second conductive layers 108c and 108d with the insulating film 112 interposed therebetween. This third conductive layer 114b also has substantially the same width as those of the second conductive layers 108c and 108d.

An N$^+$-type semiconductor layer 116a is formed on the surface region of the semiconductor substrate 100 disposed between the gate insulating films 102a and 102c. Another N$^+$-type semiconductor layer 116b is formed on the surface region of the semiconductor substrate 100 disposed between the gate insulating films 102b and 102d. A continuous N$^+$-type semiconductor layer 116c is formed on the surface region of the semiconductor substrate 100 which is opposite to the N$^+$-type semiconductor layers 116a and 116b with respect to the gate insulating films 102a, 102b, 102c and 102d.

An insulating film 117 (FIG. 5) which has a thickness of 1,000 to 2,000 Å is formed at the part disposed between the N$^+$-type semiconductor layer 116c and part 146 of the first conductive layer 106 which is not on the field insulating film. This insulating film 117 is so formed to have a thickness greater than those of the gate insulating films 102a to 102d.

Fourth conductive layers 120a and 120b of aluminum are formed on the third conductive layers 114a and 114b with an insulating film 118 interposed therebetween. The conductive layer 120a and the N$^+$-type semiconductor layer 116a are connected by a contact hole 122a. The conductive layer 120b and the N$^+$-type semiconductor layer 116b are connected by a contact hole 122b. The N$^+$-type semiconductor layer 116c is connected to a point of reference potential, for example, a point of ground potential.

A region 124 surrounded by the broken lines in FIG. 2 shows a memory cell for 1 bit of the semiconductor memory device. As may be apparent from FIG. 3, this memory cell is a MOS transistor having the second conductive layer 108a as a floating gate, the third conductive layer 114a as a control gate, the first conductive layer 106 as an erase gate, the N$^+$-type semiconductor layer 116a as a drain, and the N$^+$-type semiconductor layer 116c as a source. Referring to FIG. 3, the control gate 114a is commonly used for memory cells of 2 bits, and the erase gate 106 is commonly used for the memory cells of 4 bits. A pair of memory cells having the common gate 114a are formed symmetrical about the erase gate 106. The control gate 114a is formed on the semiconductor substrate 100 with an insulating film interposed therebetween.

The floating gates 108a and 108b and the erase gate 106 are juxtaposed within the insulating film sandwiched by the control gate 114a and the semiconductor substrate 100. Since the erase gate 106 is formed on the field insulating film 104b, parts where the respective floating gates 108a and 108b and the erase gate 106 overlap are formed within the field region. At these overlapping parts, as shown in FIG. 3, the second conductive layer (floating gate) 108a is above the first conductive layer (erase gate) 106. Therefore, the distance between the semiconductor substrate 100 and the first conductive layer 106 is less than that between the semiconductor layer 100 and the second conductive layer 108a.

Figure 1:
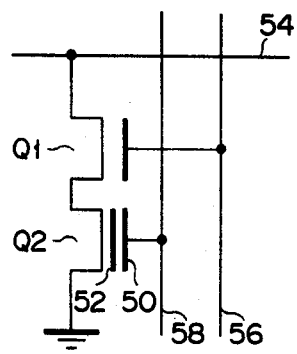
FIG. 1 is a circuit diagram of a memory cell of a conventional semiconductor memory device.
Figure 6:
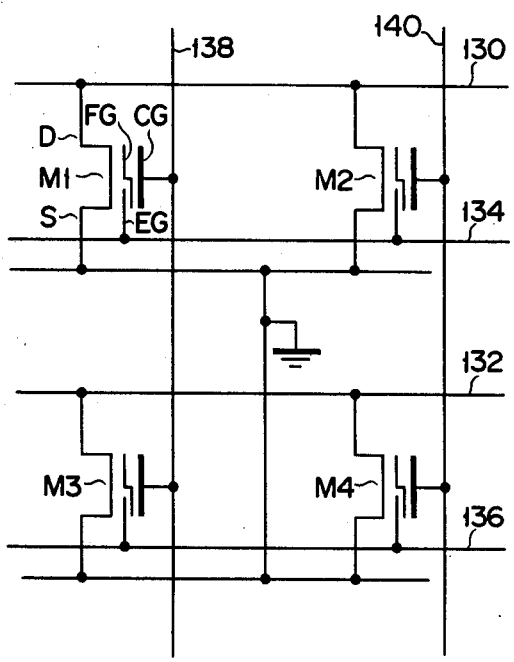
FIG. 6 is an equivalent circuit diagram of the group of memory cells shown FIG. 2.

FIG. 6 is an equivalent circuit diagram of the group of memory cells shown in FIG. 2. Digit lines 130 and 132 correspond to the fourth conductive layers 120a and 120b, respectively, shown in FIG. 2, erase lines 134 and 136 correspond to the first conductive layer 106, and select lines 138 and 140 correspond to the third conductive layers 114a and 114b. Each of memory cells M1 to M4 comprises a control gate CG, floating gate FG, an erase gate EG, a drain D and a source S. The drains D of the memory cells M1 and M2 are connected to the digit line 130, the drains D of the memory cells M3 and M4 are connected to the other digit line 132, and the sources S of all the memory cells are connected to a point of gound potential.

The mode of operation of the group of memory cells of FIG. 2 will be described with reference to the equivalent circuit diagram shown in FIG. 6. Description will be made with particular reference to the memory cell M1 shown in FIG. 6. Since the electrons are not injected to the floating gate FG of the memory cell M1 at the initial condition, the threshold voltage $V_{TH}$ of the memory cell M1 is at low level.

For writing data in this memory cell M1, a high voltage of positive polarity such as +20 V is applied to the select line 138, and a high voltage of positive polarity such as +20 V is applied to the digit line 130. Then, thermions flow from the source S to the drain D of the memory cell M1 and these thermions are injected to the floating gate FG from the channel region formed between the source and the drain. As a result of this, the threshold voltage $V_{TH}$ of the memory cell M1 is raised. For writing data, it is also possible to apply a high voltage pulse such as +20 V, or a dc voltage of +5 or 0 V to the erase line 134, or to open the erase line 134. It thus suffices to apply a predetermined voltage across the source and the drain and to apply a voltage of the same polarity to the first and third conductive layers.

For reading data from the memory cell M1, the select line 138 is selected and a high voltage such as +5 V is applied to the control gate CG of the memory cell M1. If the threshold voltage $V_{TH}$ is low when the high voltage is applied, the memory cell M1 is turned on. Then, a current flows from the digit line 130 through the memory cell M1 to the point of ground potential. If the threshold voltage $V_{TH}$ is high when the high voltage is applied, this memory cell M1 is off-state and the current does not flow. If logic level "1" is assigned to the condition wherein the current flows through the memory cell M1, and logic level "0" is assigned to the condition wherein the current does not flow through the memory cell M1, this memory cell may be used as a memory device. Since the floating gate FG is surrounded by the insulating films so as to be insulated from other elements, the electrons injected to the floating gate cannot be emitted outside the floating gate under the normal conditions. Therefore, this memory cell may be used as a nonvolatile memory device.

For erasing the data which has been written, the select line 138 and the digit line 130 are set at 0 V and a high voltage pulse such as +40 V is applied to the erase line 134. When this voltage is applied, field emission is caused between the floating gate FG and the erase gate EG of the memory cell M1 so that the electrons stored in the floating gate FG are emitted to the outside through the erase gate EG and the erase line 134. Consequently, the threshold voltage $V_{TH}$ of the memory cell M1 is restored to the low level as in the initial condition.

For erasing data, it suffices to set the source region, the drain region, and the third conductive layer at substantially the same potential and to apply a voltage of the same polarity as that for writing data to the first conductive layer. If the voltage to be applied to the first conductive layer is greater than that to be applied to the first conductive layer for writing data, erasing of data may be performed with better efficiency.

In erasing data, a high voltage is applied to the erase line 134. However, since the insulating film 117 (FIGS. 2 and 5), thicker than the gate insulating films 102a, 102b, 102c and 102d, is formed between the N+-type semiconductor layer 116c and the part 146 of the first conductive layer which is on the regions other than the field insulating film 104b, the leakage current does not flow through this part.

The group of memory cells constituting the semiconductor memory device of the above construction has various advantages to be described below.

(b1) One transistor may constitute one memory cell which is capable of electrically erasing data. Therefore, the packaging density of the E²P-ROMs using this memory cell may be made substantially the same for the EP-ROMs of the ultraviolet ray erasable type. Since less expensive plastic material may be used for the package, the manufacturing cost is less than that of the EP-ROMs of the ultraviolet erasable type.

(b2) Writing, erasing and reading out data of this memory cell may be performed with unipolar power sources. Power sources are only required to apply +20 V for writing, +40 V for erasing, and +5 V for reading, all of the positive polarity. Furthermore, it is possible to use only a single power source, that is, to dispense with all the other power sources by obtaining +20 V and +40 V from a voltage of +5 V through a booster. Since all the power sources may be mounted on the printed circuit board, the semiconductor memory device using this memory cell is capable of writing, erasing and reading out data.

(b3) Unlike conventional E²P-ROMs, the transistor for bit selection is unnecessary. Therefore data may be erased in units of words and all the bits are erased with ease.

(b4) Since the field emission is utilized for erasing data, data may be erased in a short period of time.

(b5) Since data is written by the injection of thermions and data is erased by the field emission, the insulating films around the floating gate may be formed relatively thick. Therefore, the nonvolatile characteristics, that is, the data holding characteristics, may be improved.

(b6) The method for manufacturing the memory cell described above only requires the process for forming a three-layered polycrystalline silicon film by the conventional silicon gate process and requires no other processes.

(b7) Since the thickness of the field insulating film below the erase gate is greater than that of the insulating film interposed between the erase gate and the floating gate, application of a high voltage to the erase gate for erasing of data only results in discharge between the floating gate and erase gate and does not result in discharge between the semiconductor substrate and the erase gate.

In the memory cell described above, the floating gate is located above the erase gate at the part where the floating gate overlaps the erase gate. However, the floating gate may be formed below the erase gate at this part. In this case, since the capacitance between the control gate and the floating gate becomes small, an extra voltage must be applied for reading out and writing data.

Figure 7A:
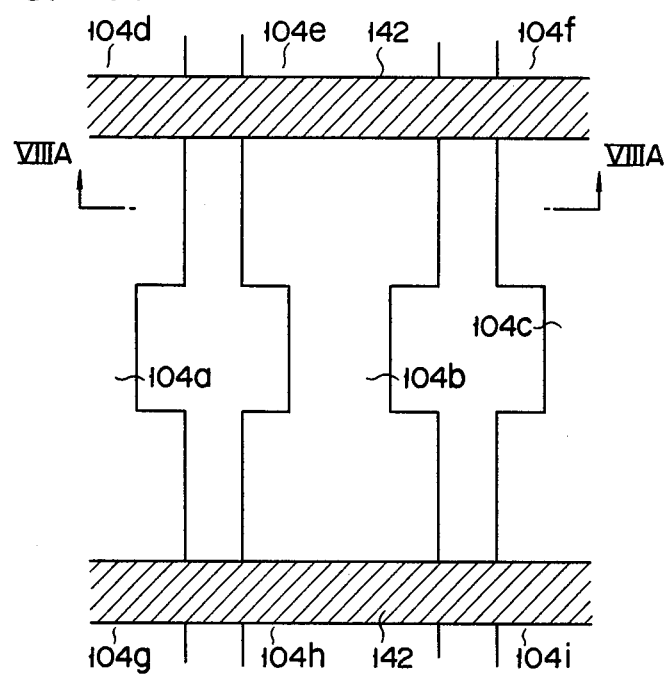
FIGS. 7A to 7E are plan views of a semiconductor substrate for explaining a method for manufacturing the group of memory cells in FIG. 2.
Figure 7B:
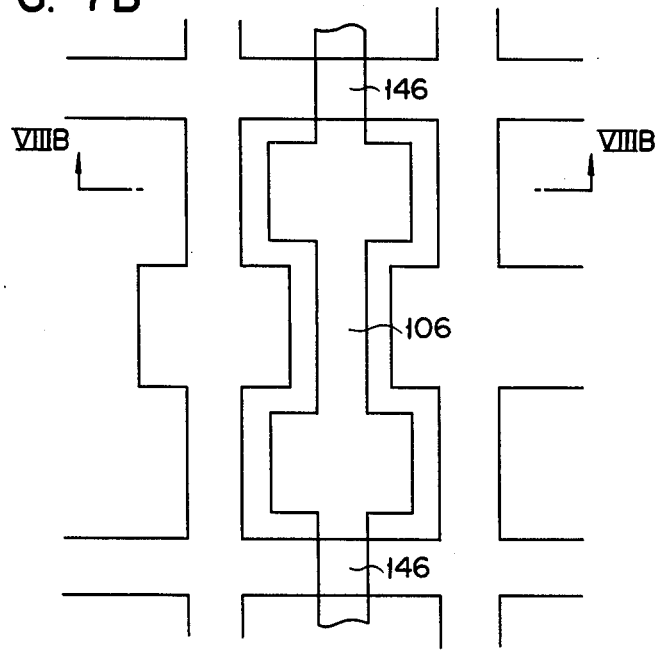

The method for manufacturing the group of memory cells shown in FIG. 2 will now be described with reference to FIGS. 7A to 7E and FIGS. 8A to 8E. FIGS. 7A to 7E are plan views of the semiconductor substrate and FIGS. 8A to 8E are sectional views along the lines VIIIA—VIIIA, VIIIB—VIIIB, . . . VIIIE—VIIIE, respectively, of FIGS. 7A to 7E. As shown in FIGS. 7A and 8A, an insulating film of 1 μ thickness is grown on the surface of the P-type silicon semiconductor substrate 100, and the field insulating films 104a, 104b, . . . 104i are formed by photolithography. In each of regions 142 indicated by hatched lines in FIG. 7A, is selectively diffused phosphorus or arsenic by the ion-implantation method or diffusion method. After this step of diffusing an impurity, the parts of the surface of the semiconductor substrate 100, other than those where the field insulating films 104a to 104i are formed, are exposed. On the exposed surfaces, a thermally oxidized film 144 of a relatively small thickness, i.e., 1,000 to 2,000 Å, is formed by the thermal oxidation method.

Figure 8A:
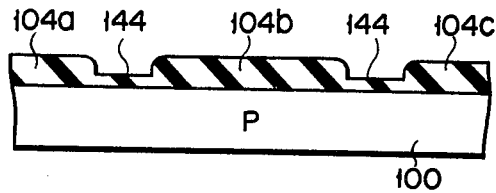
FIGS. 8A to 8E are sectional views along the lines VIIIA—VIIIA, VIIIB—VIIIB, . . . , VIIIE—VIIIE, respectively, of FIGS. 7A to 7E.
Figure 8B:
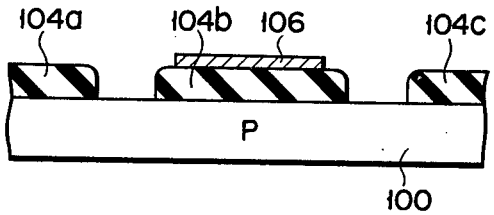

A polycrystalline silicon layer of 6,000 Å thickness is grown on the entire surface of the structure, and phosphorus or arsenic is doped in this polycrystalline silicon. This polycrystalline silicon layer is etched by photolithography to form the first conductive layer 106 as shown in FIGS. 7B and 8B. Using the first conductive layer as a mask, the thermally oxidized film 144 is removed, thereby forming the insulating film 117, having a thickness of 1,000 to 2,000 Å, below the part 146 of the first conductive layer 106. It is to be noted that the first conductive layer may be formed over the field insulating films 104a and 104c, adjacent to the field insulating film 104b.

Figure 7C:
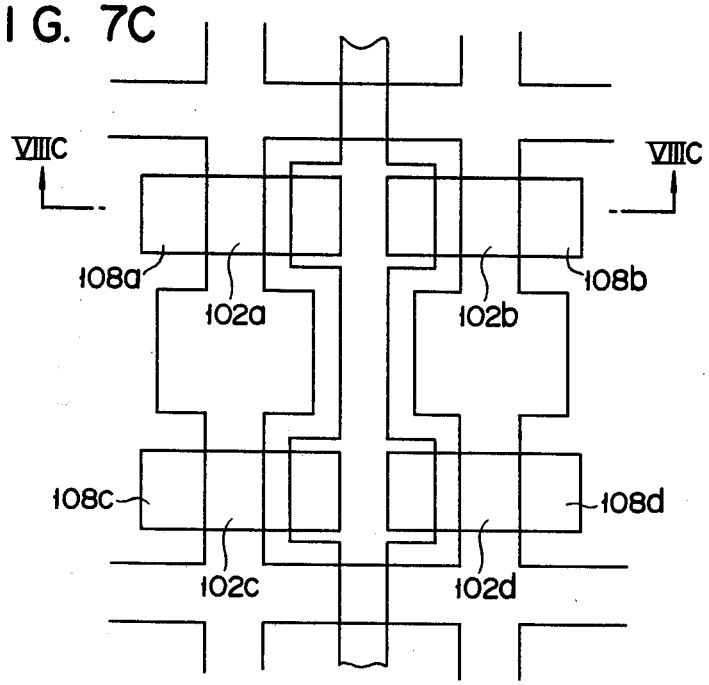
Figure 8C:
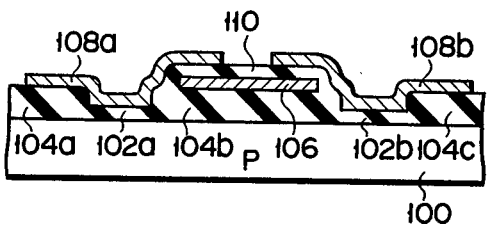

In the next step as shown in FIGS. 7C and 8C, the gate insulating films 102a, 102b, 102c and 102d and the insulating film 100 having a thickness of 500 Å, are formed by the thermal oxidation method on the exposed semiconductor substrate 100 and the first conductive layer 106. A polycrystalline silicon layer of 5,000 Å thickness is grown thereover by the CVD method. The second conductive layers 108a, 108b, 108c and 108d are formed on the gate insulating films 102a, 102b, 102c and 102d by photolithography.

Figure 7D:
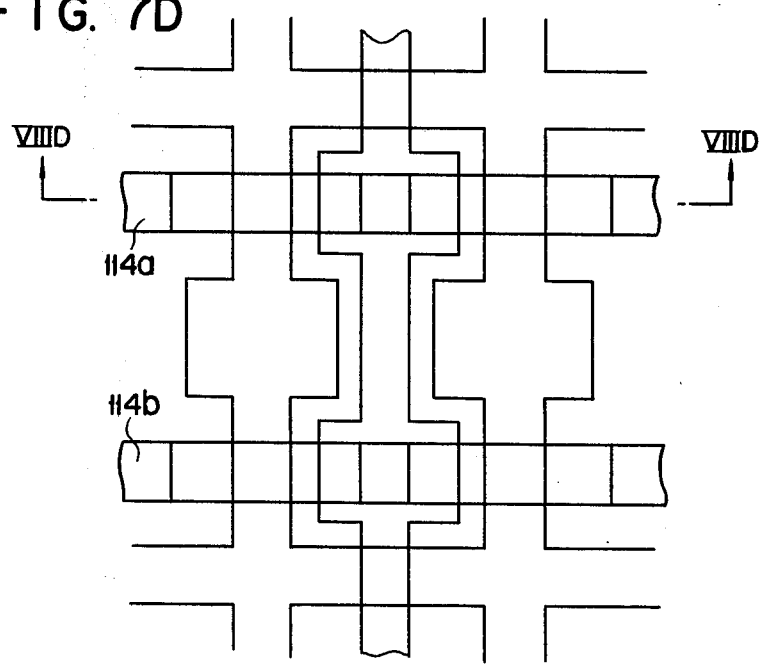
Figure 8D:
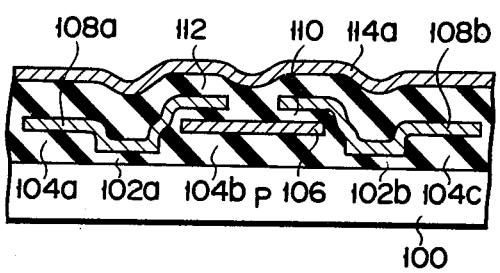

In the next step shown in FIGS. 7D and 8D, the insulating film 112, which has a thickness of 1,000 to 2,000 Å, is formed by the thermal oxidation method and a polycrystalline silicon layer is formed thereover. The polycrystalline silicon layer is etched by photolithography to form the third conductive layers 114a and 114b which are to function as the control gates. Then, using the third conductive layers as a mask, the second conductive layers 108a, 108b, 108c and 108d are etched to form the floating gates in a self-aligned manner.

Figure 7E:
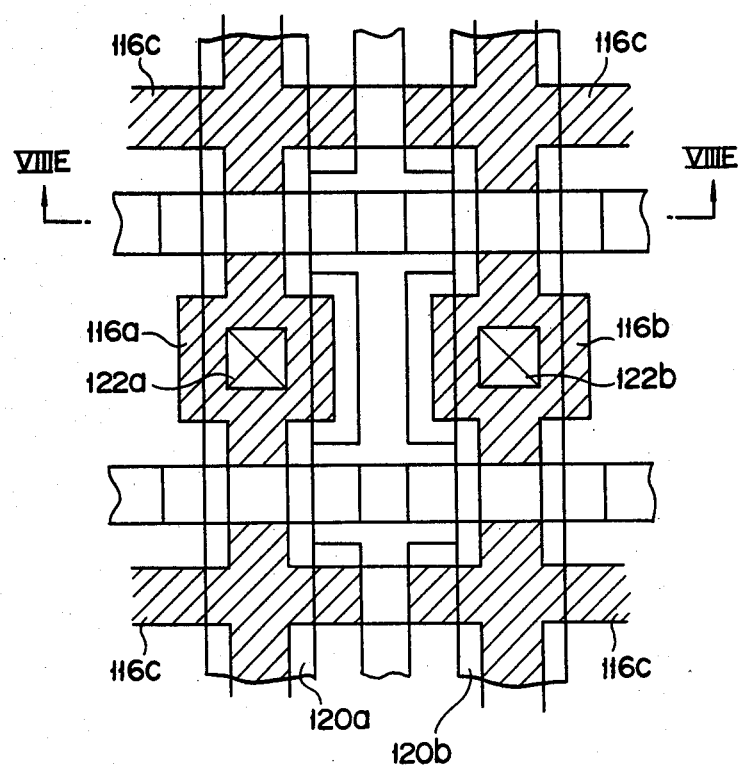
Figure 8E:
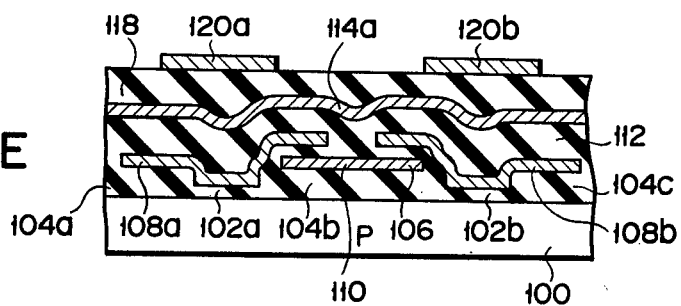

In the next step, using as a mask the second conductive layers 108a to 108d, the third conductive layers 114a and 114b, and the field insulating films 104a to 104i, phosphorus or arsenic is diffused in the regions indicated by the hatched lines in FIG. 7E to form the N+-type semiconductor layers 116a, 116b, and 116c. Thereafter, the insulating film 118 is deposited over the entire surface of the structure as shown in FIGS. 7E and 8E, to selectively form contact holes in the insulating film 118 which reach the N+-type semiconductor layers 116a and 116b. An aluminum film is then deposited over the insulating film 118 and the aluminum film is selectively etched by photolithography to form the fourth conductive layers 120a and 120b. The fourth conductive layers 120a and 120b are connected to the N+-type semiconductor layers 116a and 116b through the contact holes 122a and 122b, respectively.

The present invention is not limited to the group of memory cells described above. For example, it is also possible to form the first conductive layer on the field insulating film 104a and to make the other edges of the second conductive layers 108a and 108c overlap, with an insulating film interposed therebetween, with the first conductive layer on the field insulating film 104a. Alternatively, it is also possible to form the first conductive layer on the field insulating film 104c and to make the other edges of the second conductive layers 108b and 108d overlap, with an insulating film interposed therebetween, with the first conductive layer on the field insulating film 104c.

In the above-mentioned group of memory cells, the first conductive layer 106 functioning as the erase gate is common to the floating gates which are symmetrically arranged about this conductive layer. However, it is to be understood that the erase gate may be so formed as to erase the data of floating gate of only one memory cell.

The first conductive layer 106 and the second conductive layers 108a to 108d may be made of molybdenum.

Figure 9:
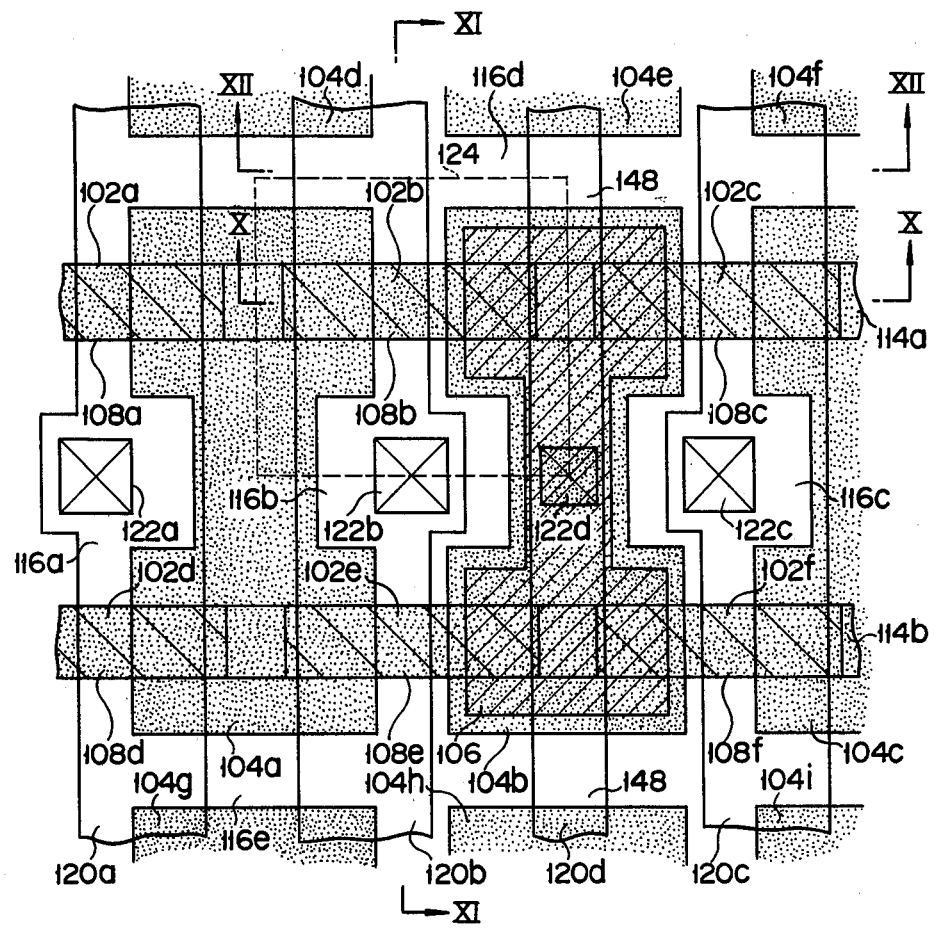
FIG. 9 is a plan view of a second group of memory cells constituting the semiconductor memory device according to the present invention.
Figure 10:
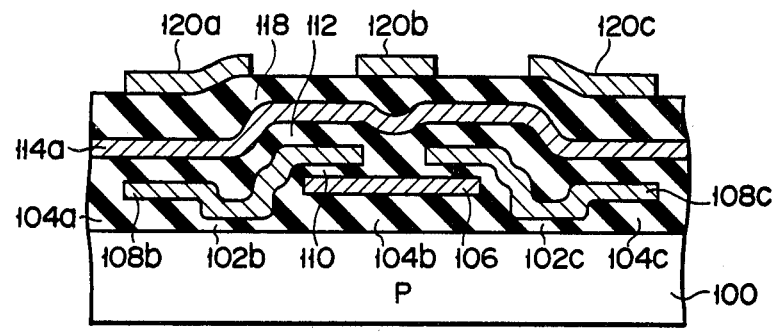
FIG. 10 is a sectional view along the line X—X of FIG. 9.
Figure 11:
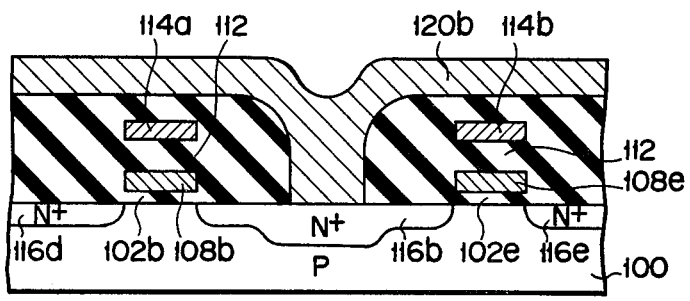
FIG. 11 is a sectional view along the line XI—XI of FIG. 9.
Figure 12:
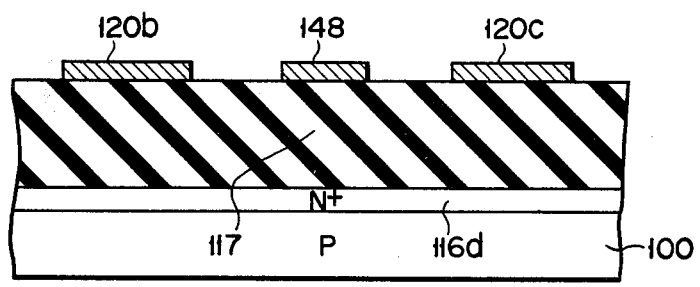
FIG. 12 is a sectional view along the line XII—XII of FIG. 9.

The second group of memory cells constituting a semiconductor memory device of the present invention will now be described referring to FIGS. 9 to 12. FIG. 9 is a plan view of a plurality of memory cells, FIG. 10 is a sectional view along the line X—X of FIG. 9, FIG. 11 is a sectional view along the line XI—XI of FIG. 9, and FIG. 12 is a sectional view along the line XII—XII of FIG. 9. Referring to FIG. 9, the doped regions of the semiconductor substrate 100 are indicated by the clear areas, the oxide areas are indicated by the dotted areas, and the polycrystalline silicon members are indicated by the cross-hatched areas.

The gate insulating films 102a to 102f of 500 Å thickness are formed on the surface of the P-type silicon semiconductor substrate 100 with equal intervals therebetween in an X-Y matrix form. The field insulating films 104a, 104b, . . . , 104i are also formed on the surface of the semiconductor substrate 100. The field insulating film 104a is formed between the paired gate insulating films 102a and 102d and the paired gate insulating films 102b and 102e. The field insulating film 104b is formed between the paired gate insulating films 102b and 102e and the paired gate insulating films 102c and 102f. The field insulating film 104c is formed at the other edges of the paired gate insulating films 102c and 102f.

The first conductive layer 106, having a thickness of 6,000 Å and consisting of polycrystalline silicon doped with phosphorus or arsenic, is formed in an island form. The second conductive layers 108a, 108b, 108c, 108d, 108e and 108f, having a thickness of 5,000 Å and consisting of polycrystalline silicon, are formed on the gate insulating films 102a, 102b, 102c, 102d, 102e and 102f, respectively, to be separate from each other. The respective right edges of the second conductive layers 108b and 108e overlap the left edge of the first conductive layer 106 with the insulating film 110 of 500 Å thickness interposed therebetween. The left edges of the second conductive layers 108c and 108f also overlap the right edge of the first conductive layer 106 with the insulating film 110 interposed therebetween.

The third insulating film 112, which has a thickness of 1,000 to 2,000 Å and which consists of polycrystalline silicon, is formed on the second conductive layers 108a, 108b and 108c with the insulating film 112 interposed therebetween.

The third conductive layer 114a has substantially the same width as those of the second conductive layers 108a, 108b and 108c. The third conductive layer 114b of polycrystalline silicon is formed on the second conductive layers 108d, 108e and 108f with the insulating film 112 interposed therebetween. The third insulating film 114b also has the same width as those of the second conductive layers 108d, 108e and 108f.

The N+-type semiconductor layer 116a is formed on the surface region of the semiconductor substrate 100 which is disposed between the gate insulating film 102a and the gate insulating film 102d. The N+-type semiconductor layer 116b is formed on the surface region of the semiconductor substrate 100 which is disposed between the gate insulating film 102b and the gate insulating film 102e. The N+-type semiconductor layer 116c is formed on the surface region of the semiconductor substrate 100 which is disposed between the gate insulating film 102c and the gate insulating film 102f. The continuous N+-type semiconductor layer 116d is formed on the surface region of the semiconductor substrate 100 which is opposite to the N+-type semiconductor layers 116a, 116b and 116c with respect to the gate insulating films 102a, 102b and 102c. A continuous semiconductor layer 116e is formed on the surface region of the semiconductor substrate 100 which is opposite to the N+-type semiconductor layers 116a, 116b and 116c with respect to the gate insulating films 102d, 102e and 102f.

The fourth conductive layers 120a, 120b, 120c and 120d, all of aluminum, are formed with the insulating film 118 interposed therebetween, on the third conductive layers 114a and 114b and the first conductive layer 106. The fourth conductive layer 120a and the N+-type semiconductor layer 116a are connected through the contact hole 122a. The fourth conductive layer 120b and the N+-type semiconductor layer 116b are connected through the contact hole 122b. The fourth conductive layer 120c and the N+-type semiconductive layer 116c are connected through a contact hole 122c. The fourth conductive layer 120d is connected to the first conductive layer 106 through a contact hole 122d.

The insulating film 117 of a thickness greater than that for the first embodiment is disposed between a part 148 of the fourth layer 120d which is not on the field insulating film 104b and the N+-type semiconductor layers 116d and 116e (FIG. 12). The thickness of the insulating film 117 is greater than those of the gate insulating films 102a to 102f. The N+-type semiconductor layers 116d and 116e are connected to a point of reference potential, for example, a point of ground potential.

The region 124 indicated by the broken line in FIG. 9 indicates a memory cell for 1 bit of the semiconductor memory device. This memory cell is a MOS transistor which has, as is apparent from FIG 9, the second conductive layer 108b as a floating gate, the third conductive layer 114a as a control gate, the first conductive layer 106 as an erase gate, the N+-type semiconductor layer 116b as a drain, and the N+-type semiconductor layer 116d as a source. As may be seen from FIG. 10, the control gate 114a is common to memory cells for 2 bits, and the island-shaped erase gate 106 is formed commonly for the memory cells for 4 bits.

A pair of memory cells having the common control gate 114a is formed symmetrically about the erase gate 106. The control gate 114a is formed on the semiconductor substrate 100 with the insulating film interposed therebetween. The floating gates 108b and 108c, and the erase gate 106 are juxtaposed in the insulating film interposed between the erase gate 114a and the semiconductor substrate 100. Since the erase gate 106 is formed on the field insulating film 104b, parts of the floating gates 108b and 108c overlapping with the erase gate 106 are present in the field region.

As also seen from FIG. 10, at this overlapping part, the floating gate (the second conductive layer) 108a is located above the erase gate (the first conductive layer) 106. Therefore, the distance between the semiconductor substrate 100 and the first conductive layer 106 is smaller than the distance between the semiconductor substrate 100 and the second conductive layer 108a.

The equivalent circuit of the group of memory cells shown in FIGS. 9 to 11 is of the same configuration as that shown in FIG. 6. The operation of this equivalent circuit is also the same as that in the first group of memory cell, so that the description thereof will be omitted.

The second group of memory cells has, in addition to the seven advantages of the first group of memory cells, two more advantages described below.

(b8) Since the erase line comprises the fourth conductive layer 120d of aluminum, the thick insulating film 117 may be formed between the N+-type semiconductor layers 116d and 116e and the part 148 of the fourth conductive layer formed on the region other than on the field insulating film 104b. Consequently, the current leakage is not caused even if a high voltage is applied to the erase line.

(b9) The fourth conductive layer 120d and the erase gate for 4 bits may be connected through a single contact hole if the erase gate is formed to be common for memory cells for 4 bits as in the second embodiment. Therefore, the number of the contact holes may be reduced and the packaging density may be improved.

Figure 13A:
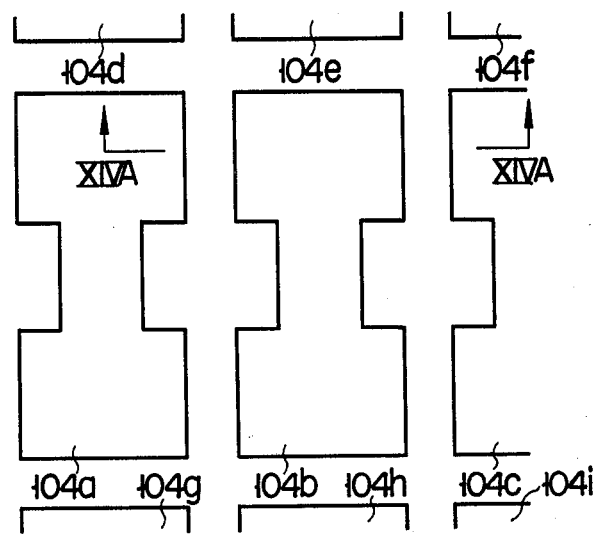
Figure 13B:
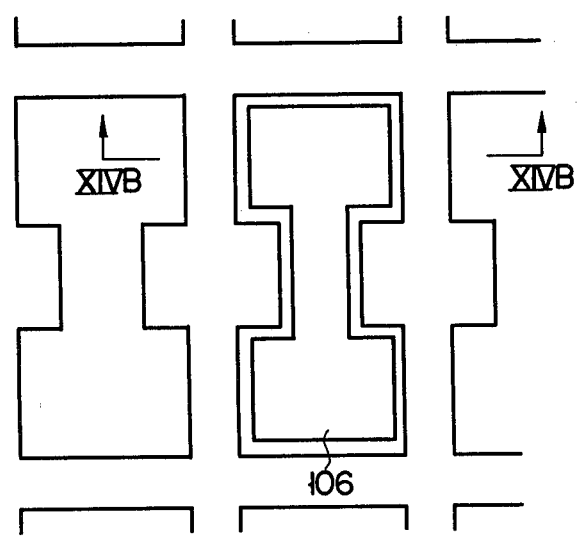

The method for manufacturing the second group of memory cells will be described with reference to FIGS. 13A to 13E and FIGS. 14A to 14E. FIGS. 13A to 13E are plan views of the semiconductor substrate, and FIGS. 14A to 14E are sectional views along the lines XIVA—XIVA, XIVB—XIVB, . . . , XIVE—XIVE, respectively, of FIGS. 13A to 13E. As shown in FIGS. 13A and 14A, an insulating film of 1 μ thickness is grown on the surface of the P-type silicon semiconductor substrate 100. The field insulating films 104a, 104b, 104c, 104d, 104e, 104f, 104g, 104h and 104i are formed by photolithography. A polycrystalline silicon layer of 6,000 Å thickness is grown over the entire surface of the structure. Phosphorus or arsenic is doped in this polycrystalline silicon layer. The polycrystalline silicon layer is etched by photolithography to form the first conductive layer 106 on the field insulating film 104b as shown in FIGS. 13B and 14B. The first conductive layer may also be formed as needed on the field insulating films 104a, 104b, 104c, 104d, 104e, 104f, 104g, 104h and 104i which are adjacent to the field insulating film 104b.

Figure 13C:
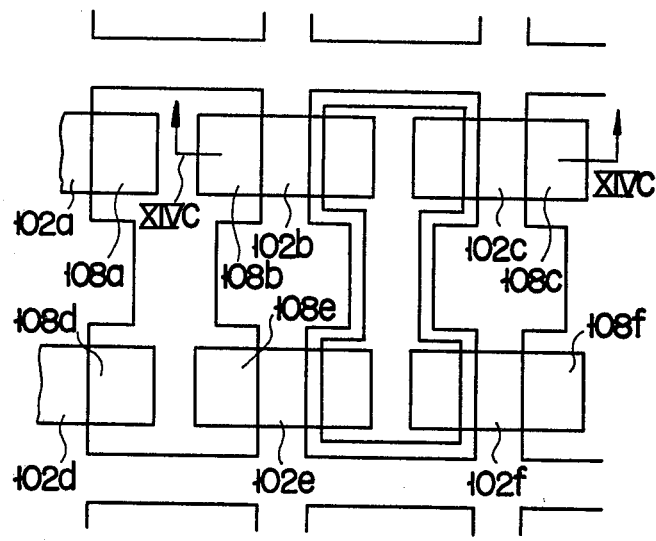
Figure 14A:
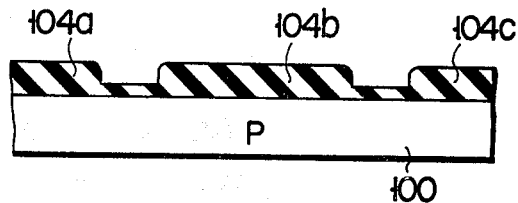
FIGS. 14A to 14E are sectional views along the lines XIVA—XIVA, XIVB—XIVB, . . . , XIVE—XIVE, respectively, of FIGS. 13A to 13E.
Figure 14B:
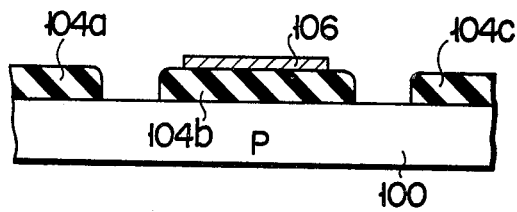
Figure 14C:
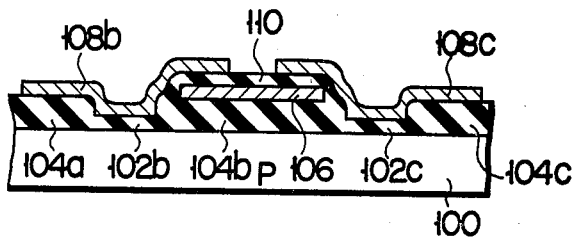

In the next step, as shown in FIGS. 13c and 14c, the insulating film 110 and the gate insulating films 102a, 102b, 102c, 102d, 102e and 102f which have a thickness of 500 Å are formed by the thermal oxidation method on the first conductive layer 106 and the exposed semiconductor substrate 100, respectively. A polycrystalline silicon layer of 5,000 Å is grown by the CVD method thereover, and the second conductive layers 108a to 108f as the floating gates are formed on the gate insulating films 102a to 102f and the insulating film 110.

Figure 13D:
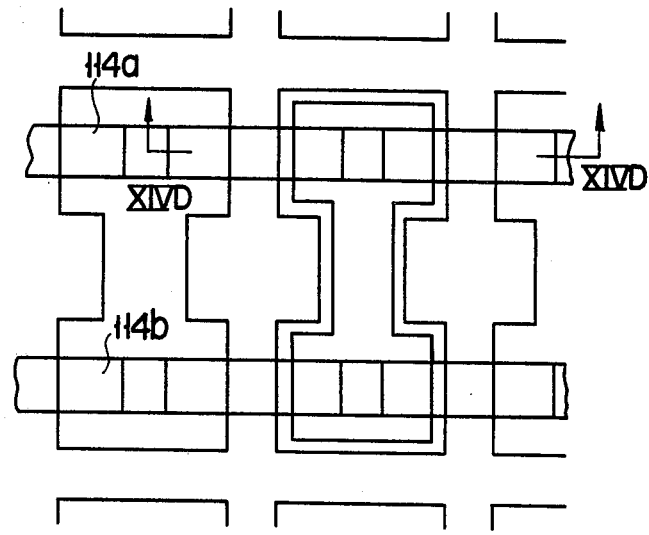
Figure 14D:
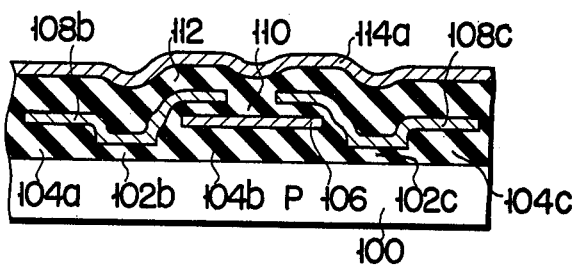

In the next step as shown in FIGS. 13D and 14D, the insulating film 112 which has a thickness of 1,000 to 2,000 Å is formed by the thermal oxidation method, and a polycrystalline silicon layer is formed thereover. The polycrystalline silicon layer is etched by photolithography to form the third conductive layers 114a and 114b to function as the control gates. Using the third conductive layers as a mask, the second conductive layers 108a to 108f are etched to form the floating gates in a self-aligned manner.

Figure 14E:
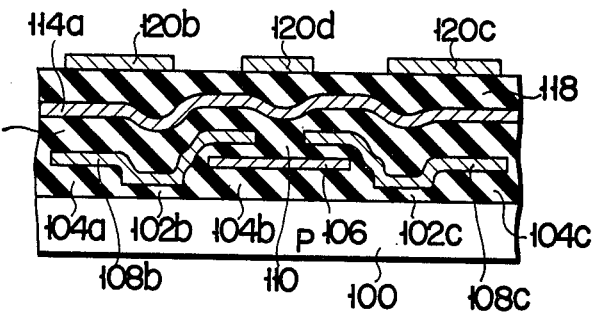

Using as a mask the second conductive layers 108a to 108f, the third conductive layers 114a and 114b, and the field insulating films 104a to 104i, phosphorus or arsenic is doped in the region indicated by the hatched lines in FIG. 13E to form the N+-type semiconductor layers 116a, 116b and 116c as the drains and $N^{30}$-type semiconductor layers 116d and 116e as the sources. Thereafter, as shown in FIGS. 13E and 14E, the insulating film 118 is deposited on the entire surface of the structure and holes are selectively formed which extend to the N+-type semiconductor layers 116a, 116b and 116c and the first conductive layer 106. After an aluminum film is deposited over the insulating film 118, this aluminum film is selectively etched by photolithography to form the fourth conductive layers 120a, 120b, 120c and 120d. The fourth conductive layers 120a, 120b and 120c are connected to the N+-type semiconductor layers 116a, 116b and 116c through the contact holes 122a, 122b and 122c, respectively. The fourth conductive layer 120d is connected to the first conductive layer 106 through the contact hole 122d.

In the second group of memory cells, one erase gate is commonly formed for memory cells for 4 bits. However, it is also possible to form one erase gate for a memory cell for 1 bit or to form one erase gate for memory cells for 2 bits.

Figure 15:
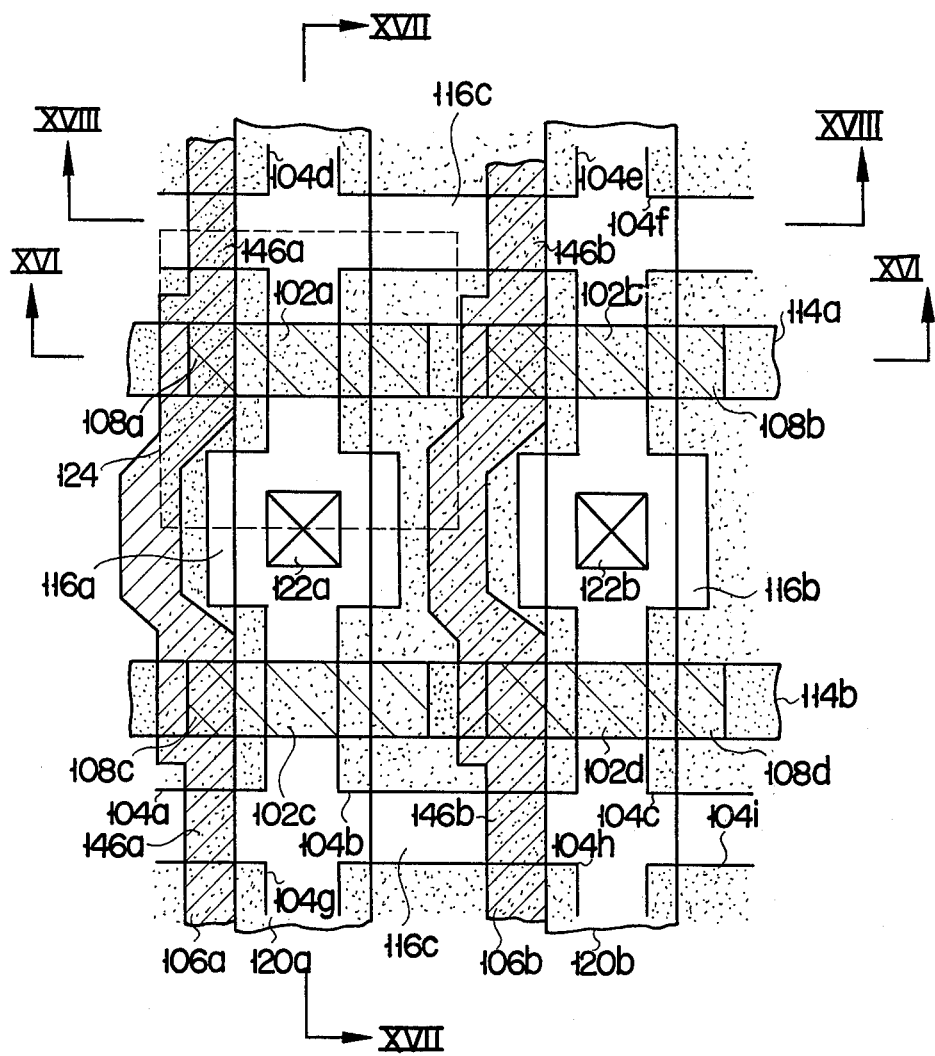
FIG. 15 is a plan view of a third group of memory cells constituting the semiconductor memory device according to the present invention.
Figure 16:
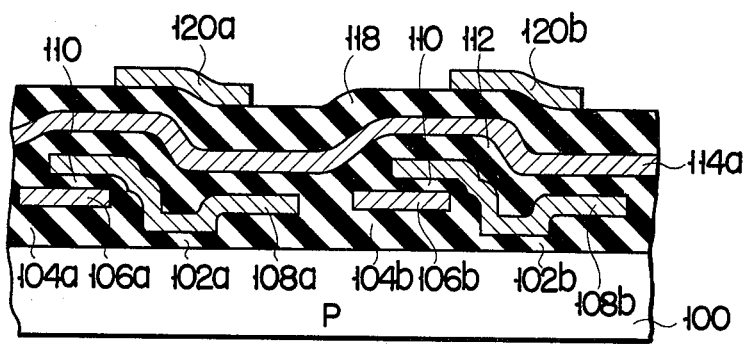
FIG. 16 is a sectional view along the line XVI—XVI of FIG. 15.
Figure 17:
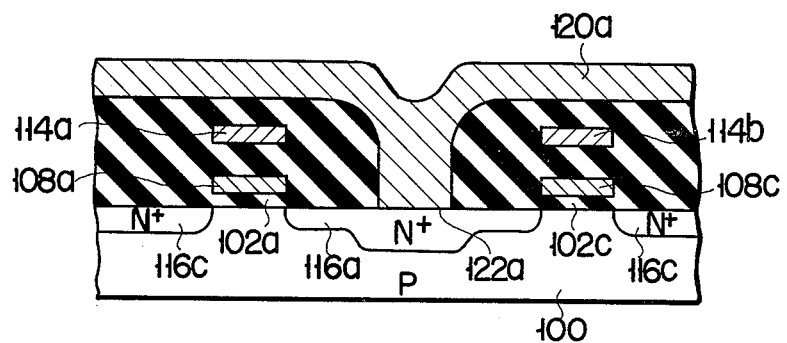
FIG. 17 is a sectional view along the line XVII—XVII of FIG. 15.
Figure 18:
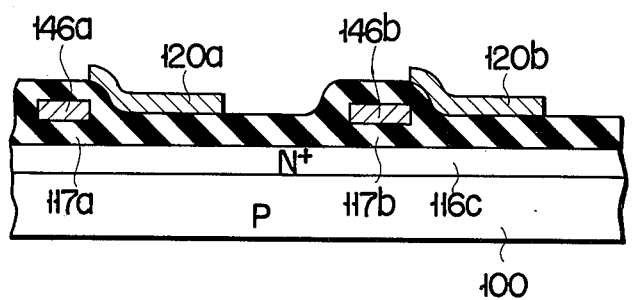
FIG. 18 is a sectional view along the line XVIII—XVIII of FIG. 15.

A third group of memory cells constituting the semiconductor memory device according to the present invention will now be described with reference to FIGS. 15 to 18. FIG. 15 is a plan view of 4-bit memory cells, FIG. 16 is a sectional view along the line XVI—XVI of FIG. 15, FIG. 17 is a sectional view along the line XVII—XVII of FIG. 15, and FIG. 18 is a sectional view along the line XVIII—XVIII of FIG. 15. Referring to FIG. 15, the doped regions of the semiconductor substrate are indicated by the clear areas, the oxide areas are indicated by the dotted areas, and the polycrystalline silicon members are indicated by the cross-hatched areas. The gate insulating films 102a, 102b, 102c and 102d which have a thickness of 500 Å are formed at equal intervals in the form of X-Y matrix on the surface of the p-type semiconductor substrate 100 of silicon. The field insulating films 104a, . . . , 104i are also formed on the surface of the semiconductor substrate 100. The first conductive layers 106a and 106b of polycrystalline silicon which contain phosphorus or arsenic and have a thickness of 6,000 Å are respectively formed on the field insulating films 104a and 104b. The first conductive layer 106a extends over a plurality of field insulating films 104d and 104g and the first conductive layer 106b extends over a plurality of field insulating films 104e and 104h.

The second conductive layers 108a, 108b, 108c, and 108d of polycrystalline silicon and 5,000 Å thickness are separately formed on the gate insulating films 102a, 102b, 102c and 102d, respectively. The left ends of the second conductive layers 108a and 108c are superposed on the right end of the first conductive layer 106a with the insulating film 110 having a thickness of 500 Å interposed therebetween. The left ends of the second conductive layers 108b and 108d are superposed on the right end of the first conductive layer 106b with the insulating film 110 of 500 Å thickness interposed therebetween.

The third conductive layer 114a of polycrystalline silicon is formed on the second conductive layers 108a and 108b with the insulating film 112 having a thickness of 1,000 to 2,000 Å interposed therebetween. The third conductive layer 114a has substantially the same width as the second conductive layers 108a and 108b. The third conductive layer 114b of polycrystalline silicon is formed on the second conductive layers 108c and 108d with the insulating film 112 interposed therebetween. The third conductive layer 114b has also substantially the same width as the second layers 108c and 108d.

The N+-type semiconductor layer 116a is formed on the surface region of the semiconductor substrate 100 interposed between the gate insulating film 102a and the gate insulating film 102c. The N+-type semiconductor layer 116b is formed on the surface region of the semiconductor substrate 100 interposed between the gate insulating film 102b and the gate insulating film 102d. The continuous N+-type semiconductor layer 116c is formed on the surface region of the semiconductor substrate 100, which opposes the N+-type semiconductor layers 116a and 116b with respect to the gate insulating films 102a, 102b, 102c and 102d.

The insulating films 117a and 117b which have a thickness of 1,000 to 2,000 Å are formed on an area interposed between the N+-type semiconductor layer 116c and portions 146a and 146b of the first conductive layers 106a and 106b. The portions 146a and 146b do not exist on the field insulating film (FIG. 5). These insulating films 117a and 117b are made thicker than the gate insulating films 102a to 102d. Furthermore, the fourth conductive layers 120a and 120b made of aluminum are formed on the third conductive layers 114a and 114b with the insulating film 118 interposed therebetween. One conductive layer 120a and the N+-type semiconductor layer 116a are connected through the contact hole 122a, while the other conductive layer 120b and the N+-type semiconductor layer 116b are connected through the contact hole 122b. The N+-type semiconductor layer 116c is connected to a point at a reference potential, for example, a point at the ground potential.

The region 124 surrounded by the broken line in FIG. 15 indicates a memory cell of one bit in the semiconductor memory device. This memory cell is a MOS transistor the second conductive layer 108a of which is the floating gate, the third conductive layer 114a of which is the control gate, the first conductive layer 106a of which is the erase gate, the N+-type semiconductor layer 116a of which is the drain, and the N+-type semiconductor layer 116c of which is the source, as seen from FIG. 16. The control gate 114a is formed on the semiconductor substrate 100 with the insulating film interposed therebetween, while the foating gate 108a and the erase gate 106a are juxtaposed within the insulating film interposed between the control gate 114a and the semiconductor substrate 100. Since the erase gate 106a is formed on the field insulating film 104b, an overlapped area of the floating gate 108a and the erase gate 106a is within the field region. Furthermore, as shown in FIG. 16, in the overlapped area described above, the second conductive layer (floating gate) 108a is located above the first conductive layer (erase gate) 106a. Therefore, the distance between the semiconductor substrate 100 and the first conductive layer 106a is shorter than that between the semiconductor substrate 100 and the second conductive layer 108a.

The equivalent circuit of the third group of memory cells shown in FIGS. 15 to 18 is the same as in FIG. 6. The mode of operation of the equivalent circuit shown in FIGS. 15 to 18 is also the same as that in FIG. 6, so that the description thereof will be omitted. The third group of memory cells has the same advantages as that of the first group of memory cells.

Figure 19A:
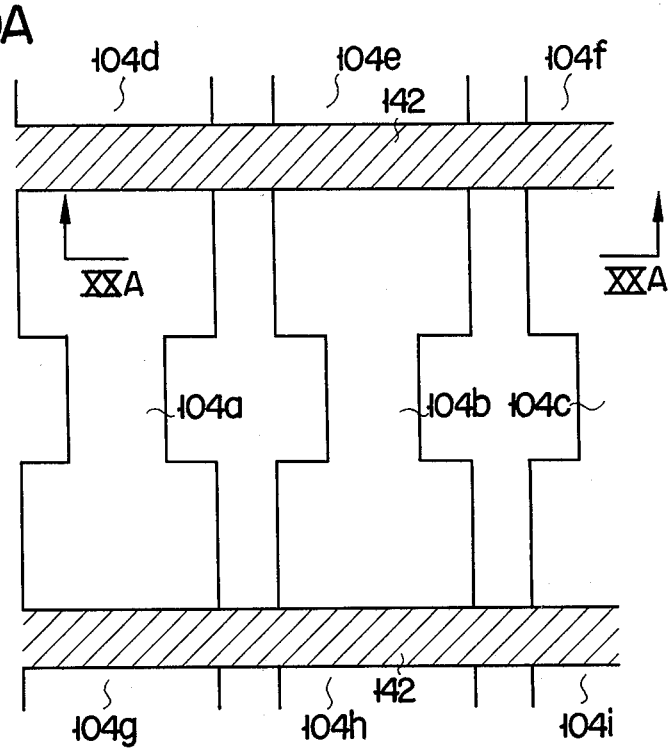

The method for manufacturing the group of memory cells shown in FIG. 15 will now be described with reference to FIGS. 19A to 19E and FIGS. 20A to 20E. FIGS. 19A to 19E are plan views of the semiconductor substrate and FIGS. 20A to 20E are sectional views along the lines XXA—XXA, XXB—XXB, . . . XXE—XXE, respectively, of FIGS. 19A to 19E. As shown in FIGS. 19A and 20A, an insulating film of 1 μ thickness is grown on the surface of the P-type silicon semiconductor substrate 100, and the field insulating films 104a, 104b, . . . 104i are formed by photolithography. In each of regions 142 indicated by hatched lines in FIG. 19A, phosphorus or arsenic is selectively diffused by the ion-implentation method or diffusion method. After this step of diffusing an impurity, the parts of the surface of the semiconductor substrate 100, other than those where the field insulating films 104a to 104i are formed, are exposed. On the exposed surfaces, a thermally oxidized film 144 of a relatively small thickness, i.e., 1,000 to 2,000 Å, is formed by the thermal oxidation method.

Figure 19B:
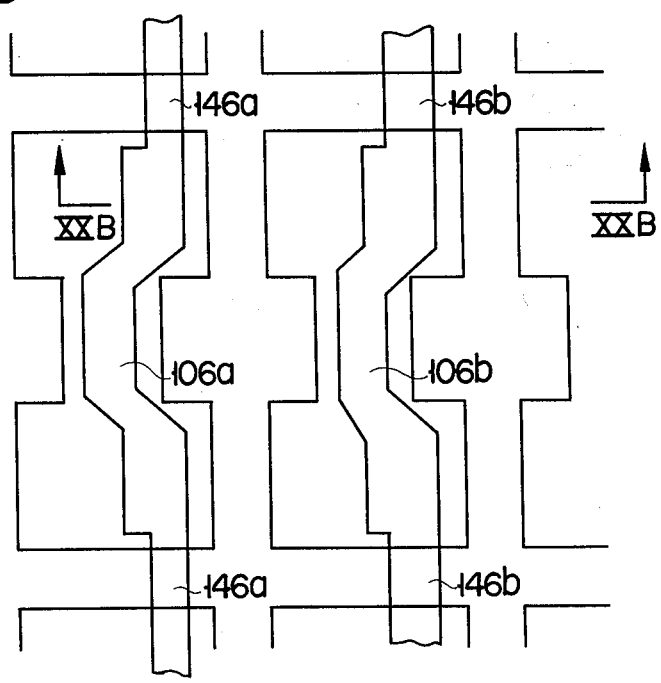

A polycrystalline silicon layer of 6,000 Å thickness is grown on the entire surface of the structure, and phosphorus or arsenic is doped in this polycrystalline silicon. This polycrystalline silicon layer is etched by photolithography to form the first conductive layers 106a and 106b as shown in FIGS. 19B and 20B. Using the first conductive layers as a mask, the thermally oxidized film 144 is removed, thereby forming insulating film 117a and 117b having a thickness of 1,000 to 2,000 Å, below the part 146a and 146b of the first conductive layers 106a and 106b.

In the next step as shown in FIGS. 19C and 20C, the gate insulating films 102a, 102b, 102c and 102d and the insulating film 100 having a thickness of 500 Å, are formed by the thermal oxidation method on the exposed semiconductor substrate 100 and the first conductive layer 106a and 106b. A polycrystalline silicon layer of 5,000 Å thickness is grown thereover by the CVD method. The second conductive layers 108a, 108b, 108c and 108d formed on the gate insulating films 102a, 102b, 102c and 102d by photolithography.

In the next step shown in FIGS. 19D and 20D, the insulating film 112, which has a thickness of 1,000 to 2,000 Å, is formed by the thermal oxidation method and a polycrystalline silicon layer is formed thereover. The polycrystalline silicon layer is etched by photolithography to form the third conductive layers 114a and 114b which are to function as the control gates. Then, using the third conductive layers as a mask, the second conductive layers 108a, 108b, 108c and 108d are etched to form the floating gates in a self-aligned manner.

Figure 19E:
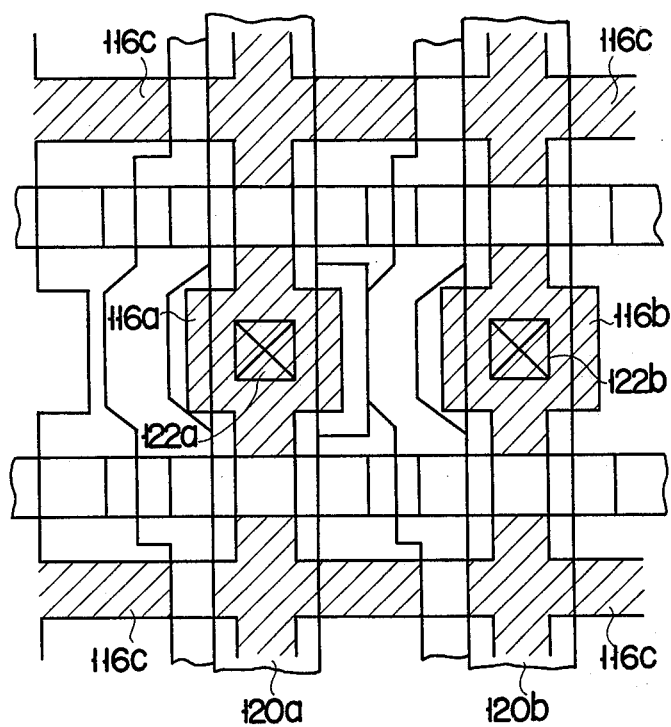

In the next step, using as a mask the second conductive layers 108a to 108d, the third conductive layers 114a and 114b, and the field insulating films 104a to 104i, phosphorus or arsenic is diffused in the regions indicated by the hatched lines in FIG. 19E to form the N+-type semiconductor layers 116a, 116b, and 116c. Thereafter, the insulating film 118 is deposited over the entire surface of the structure as shown in FIGS. 19E and 20E, to selectively form contact holes in the insulating film 118 which reach the N+-type semiconductor layers 116a and 116b. An aluminum film is then deposited over the insulating film 118 and the aluminum film is selectively etched by photolithography to form the fourth conductive layers 120a and 120b. The fourth conductive layers 120a and 120b are connected to the N+-type semiconductor layers 116a and 116b through the contact holes 122a and 122b, respectively.

Figure 21:
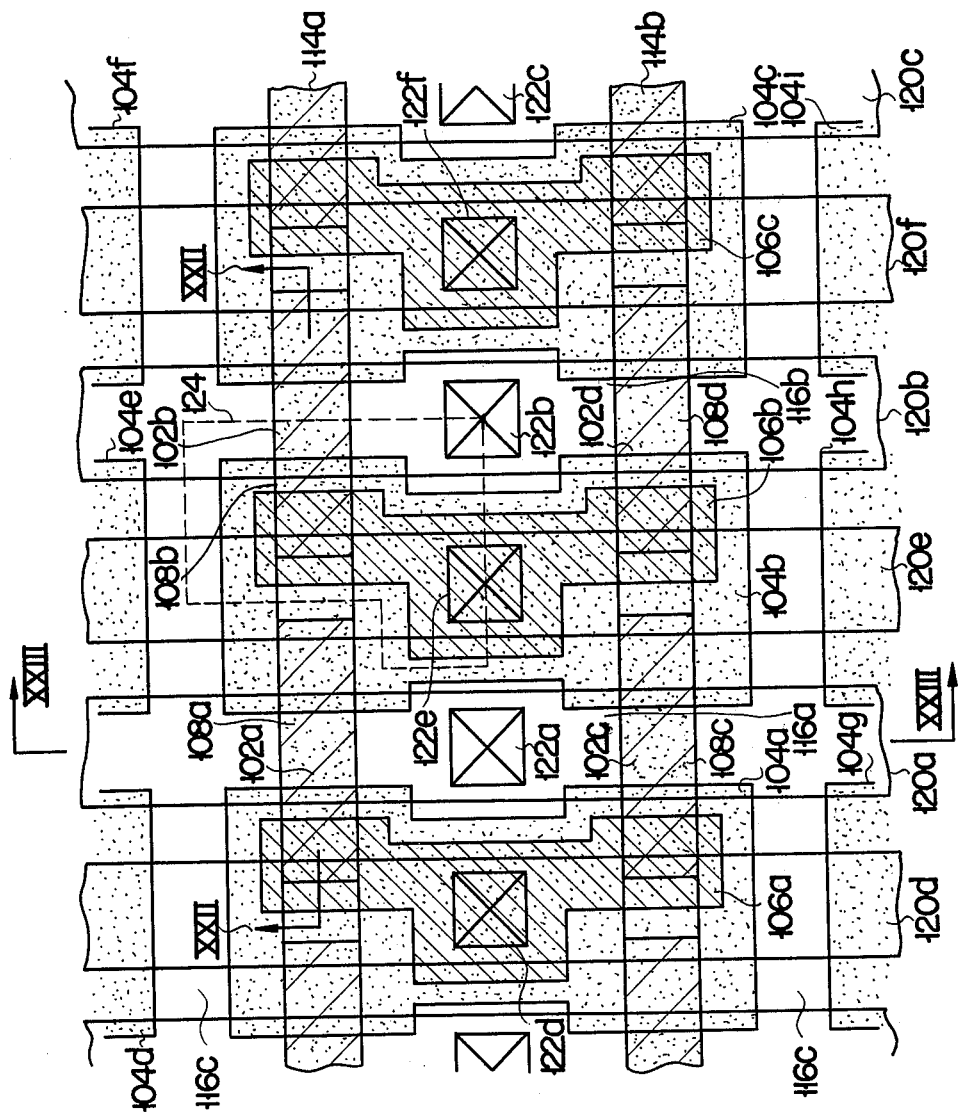
FIG. 21 is a plan view of a fourth group of memory cells constituting the semiconductor memory device according to the present invention.

The fourth group of memory cells constituting a semiconductor memory device of the present invention will now be described referring to FIGS. 21 to 23. FIG. 21 is a plan view of a plurality of memory cells, FIG. 22 is a sectional view along the line XXII—XXII of FIG. 21, and FIG. 23 is a sectional view along the line XXIII—XXIII of FIG. 21. Referring to FIG. 21, the doped regions of the semiconductor substrate 100 are indicated by the clear areas, the oxide areas are indicated by the dotted areas, and the polycrystalline silicon members are indicated by the cross-hatched areas.

The gate insulating films 102a to 102d of 500 Å thickness are formed on the surface of the P-type silicon semiconductor substrate 100 with equal intervals therebetween in an X-Y matrix form. The field insulating films 104a, 104b, . . . , 104i are also formed on the surface of the semiconductor substrate 100. The first conductive layers 106a, 106b and 106c, which have a thickness of 6,000 Å and which are made of polycrystalline silicon containing phosphorus or arsenic, are respectively formed on the field insulating films 104a, 104b and 104c in the form of islands. The second conductive layers 108a to 108d which have a thickness of 5,000 Å and which are made of polycrystalline silicon are separately formed on the gate insulating films 102a, 102b, 102c and 102d.

The left ends of the second conductive layers 108a and 108c overlap with the right end of the first conductive layer 106a through the insulating film 110 which has a thickness of 500 Å. The left edges of the second conductive layers 108b and 108d also overlap the right edge of the first conductive layer 106b with the insulating film 110 interposed therebetween.

The third insulating film 112, which has a thickness of 1,000 to 2,000 Å and which consists of polycrystalline silicon, is formed on the second conductive layers 108a and 108b with the insulating film 112 interposed therebetween. The third conductive layer 114a has substantially the same width as those of the second conductive layers 108a and 108b. The third conductive layer 114b of polycrystalline silicon is formed on the second conductive layers 108c and 108d with the insulating film 112 interposed therebetween. The third insulating film 114b also has the same width as those of the second conductive layers 108c and 108d.

The N+-type semiconductor layer 116a is formed on the surface region of the semiconductor substrate 100 which is disposed between the gate insulating film 102a and the gate insulating film 102c. The N+-type semiconductor layer 116b is formed on the surface region of the semiconductor substrate 100 which is disposed between the gate insulating film 102b and the gate insulating film 102d. The continuous N+-type semiconductor layer 116c is formed on the surface region of the semiconductor substrate 100 which is opposite to the N+-type semiconductor layers 116a and 116b with respect to the gate insulating films 102a and 102b and the gate insulating films 102c and 102d.

Furthermore, the fourth conductive layers 120a to 120f which are made of aluminum are formed on the third conductive layers 114a and 114b and the first conductive layer 106a with the insulating film 118 interposed therebetween. The fourth conductive layer 120a and the N+-type semiconductor layer 116a are connected through the contact hole 122a, while the fourth conductive layer 120b and the N+-type semiconductor layer 116b are connected through the contact hole 122b. Furthermore, the fourth conductive layers 120d to 120f are connected to the first conductive layers 106a to 106c through the contact holes 122d to 122f, respectively. The N+-type semiconductor layer 116c is connected to a point at a reference potential, for example, a point at the ground potential.

The region 124 indicated by the broken line in FIG. 21 indicates a memory cell for 1 bit of the semiconductor memory device. This memory cell is a MOS transistor which has, as apparent from FIG. 22, the second conductive layer 108b as a floating gate, the third conductive layer 114a as a control gate, the first conductive layer 106b as an erase gate, the N+-type semiconductor layer 116b as a drain, and the N+-type semiconductor layer 116c as a source. The control gate 114a is formed on the semiconductor substrate 100 with the insulating film interposed therebetween. The floating gate 108b and the erase gate 106b are juxtaposed in the insulating film interposed between the erase gate 114a and the semiconductor substrate 100. Since the erase gate 106b is formed on the field insulating film 104b, parts of the floating gates 108b overlapping with the erase gate 106b are present in the field region.

As also seen from FIG. 22, at this overlapping part, the floating gate (the second conductive layer) 108a is located above the erase gate (the first conductive layer) 106b. Therefore, the distance between the semiconductor substrate 100 and the first conductive layer 106 is smaller than the distance between the semiconductor substrate 100 and the second conductive layer 108a. As may be apparent from FIG. 21, the first conductive layers 106a, 106b and 106c are commonly formed in a 2-bit memory cell, respectively.

The equivalent circuit of the fourth group of memory cells shown in FIGS. 21 to 23 is the same as that in FIG. 6. The mode of operation of the equivalent circuit shown in FIGS. 21 to 23 is the same as that in FIG. 6, so that the description thereof will be omitted. The fourth group of memory cells has the same advantages as the second group of memory cells except for item (b9).

Figure 24B:
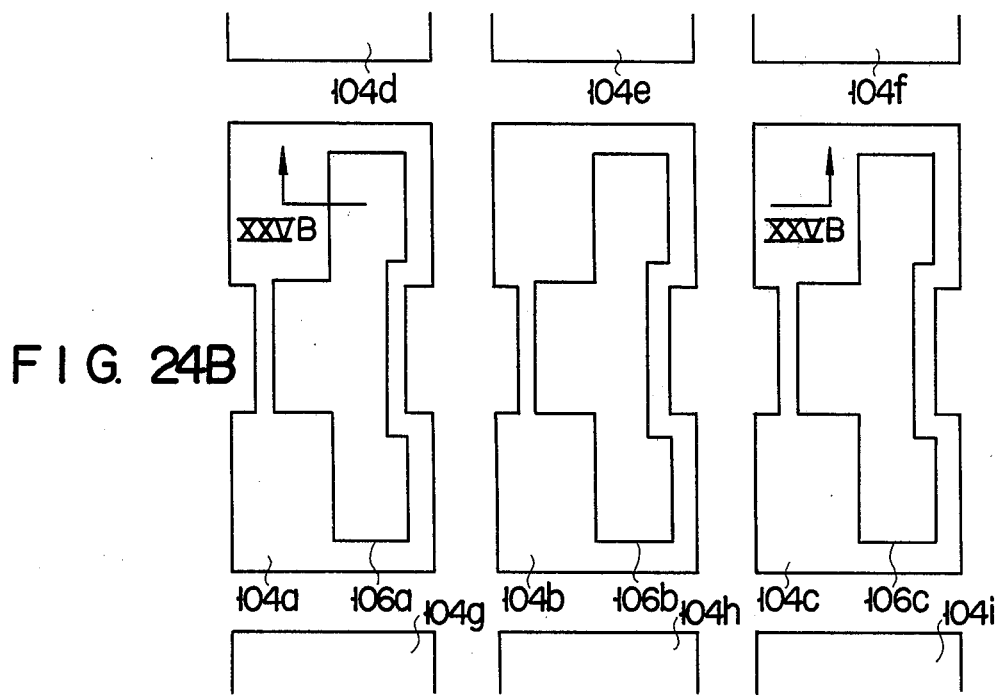

The method for manufacturing the fourth group of memory cells will be described with reference to FIGS. 24A to 24E and FIGS. 25A to 25E. FIGS. 24A to 24E are plan views of the semiconductor substrate, and FIGS. 25A to 25E are sectional views along the lines XXVA—XXVA, XXVB—XXVB, . . . , XXVE—XXVE, respectively, of FIGS. 24A to 24E. As shown in FIGS. 24A and 25A, an insulating film of 1 μ thickness is grown on the surface of the P-type silicon semiconductor substrate 100. The field insulating films 104a, 104b, 104c, 104d, 104e, 104f, 104g, 104h and 104i are formed by photolithography.

A polycrystalline silicon layer of 6,000 Å thickness is grown over the entire surface of the structure. Phosphorus or arsenic is doped in this polycrystalline silicon layer. The polycrystalline silicon layer is etched by photolithography to form the first conductive layer 106a, 106b and 106c on the field insulating film 104a, 104b and 104c as shown in FIGS. 24B and 25B. The first conductive layer may also be formed as needed on the field insulating films 104d, 104e, 104f, 104g, 104h and 104i which are adjacent to the field insulating film 104a, 104b and 104c.

Figure 24C:
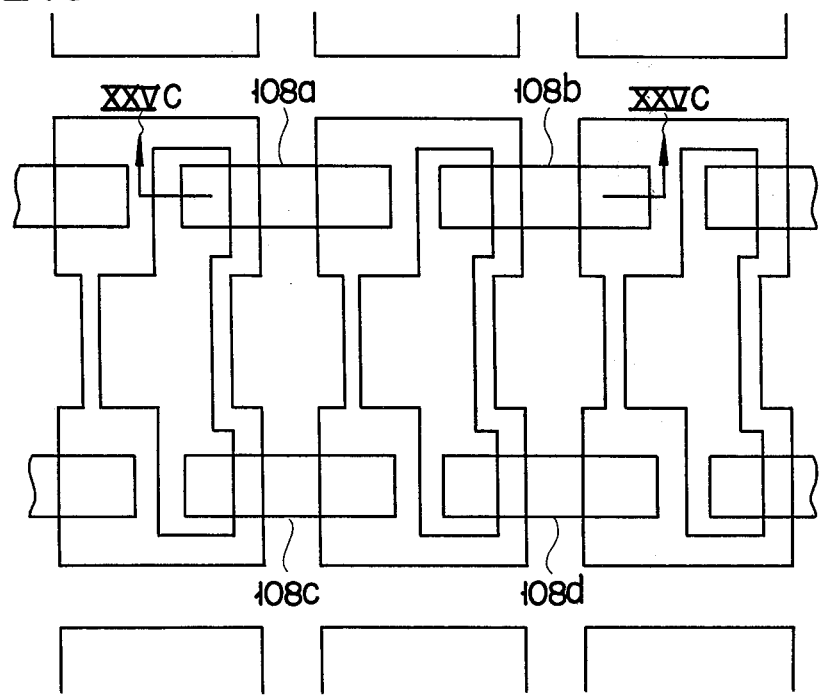

In the next step, as shown in FIGS. 24c and 25c, the insulating film 110 and the gate insulating films 102a, 102b, 102c and 102d which have a thickness of 500 Å are formed by the thermal oxidation method on the first conductive layer 106a, 106b and 106c and the exposed semiconductor substrate 100, respectively. A polycrystalline silicon layer of 5,000 Å is grown by the CVD method thereover, and the second conductive layers 108a to 108d as the floating gates are formed on the gate insulating films 102a to 102d and the insulating film 110.

Figure 24D:
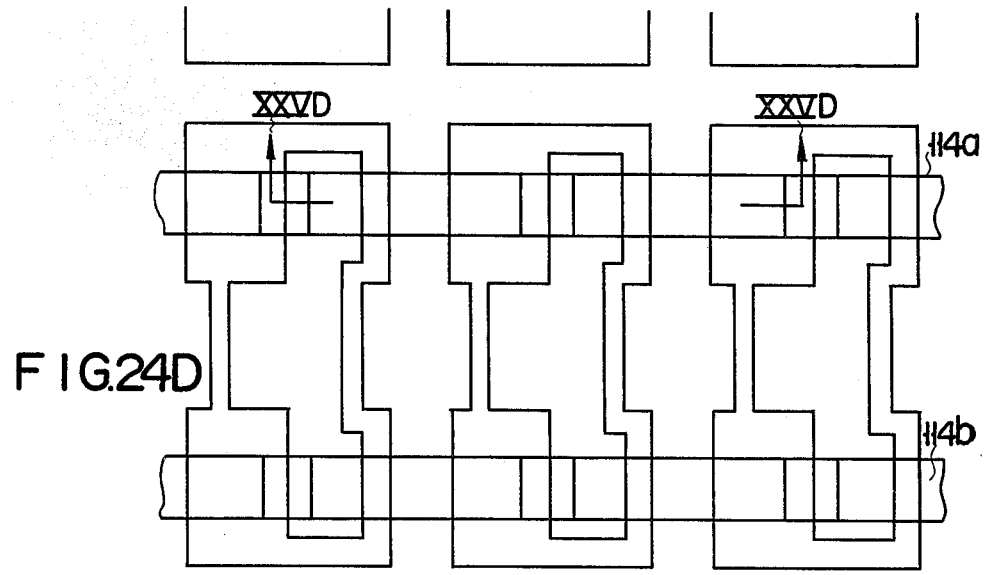

In the next step as shown in FIGS. 24D and 25D, the insulating film 112 which has a thickness of 1,000 to 2,000 Å is formed by the thermal oxidation method, and a polycrystalline silicon layer is formed thereover. The polycrystalline silicon layer is etched by photolithography to form the third conductive layers 114a and 114b to function as the control gates. Using the third conductive layers as a mask, the second conductive layers 108a to 108d are etched to form the floating gates in a self-aligned manner.

Figure 24E:
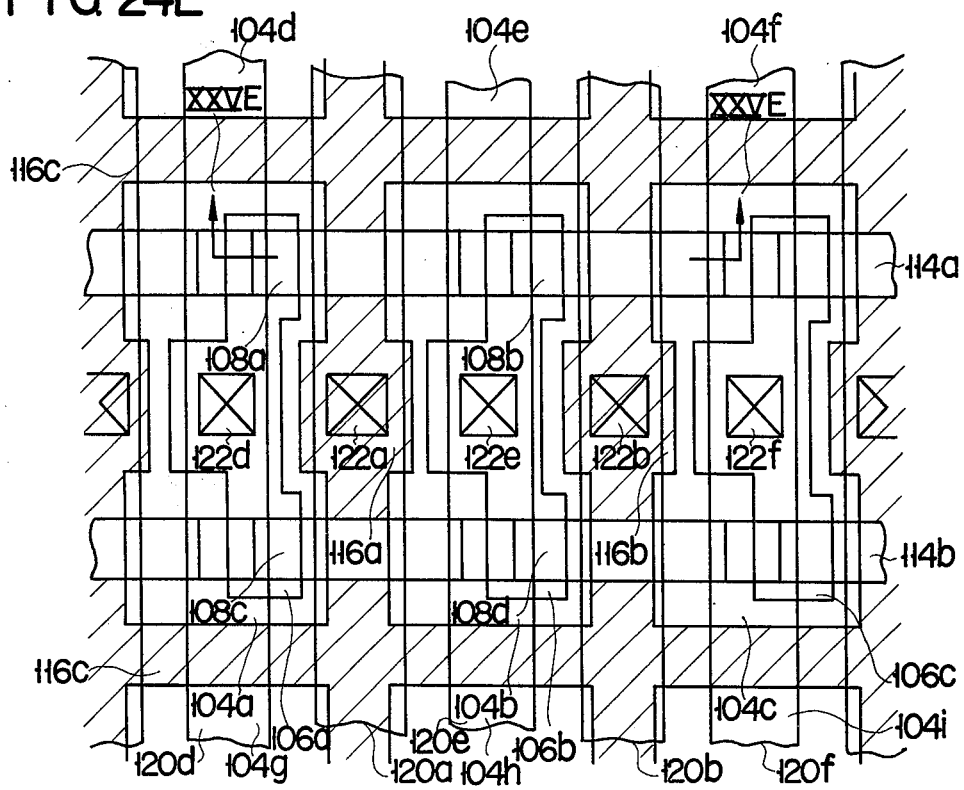

Using as a mask the second conductive layers 108a to 108d, the third conductive layers 114a and 114b, and the field insulating films 104a to 104i, phosphorus or arsenic is doped in the region indicated by the hatched lines in FIG. 24E to form the N+-type semiconductor layers 116a and 116b as the drains and N+-type semiconductor layer 116c as the source. Thereafter, as shown in FIGS. 24E and 25E, the insulating film 118 is deposited on the entire surface of the structure and holes are selectively formed which extend to the N+-type semiconductor layers 116a, 116b and the first conductive layers 106a, 106b and 106c. After an aluminum film is deposited over the insulating film 118, this aluminum film is selectively etched by photolithography to form the fourth conductive layers 120a, 120b, 120d, 120e and 120f. The fourth conductive layers 120a and 120b are respectively connected to the N+-type semiconductor layers 116a and 116b through the contact holes 122a and 122b. The fourth conductive layers 120d, 120e and 120f are respectively connected to the first conductive layers 106a, 106b and 106c through the contact holes 122d, 122e and 122f.

Figure 26:
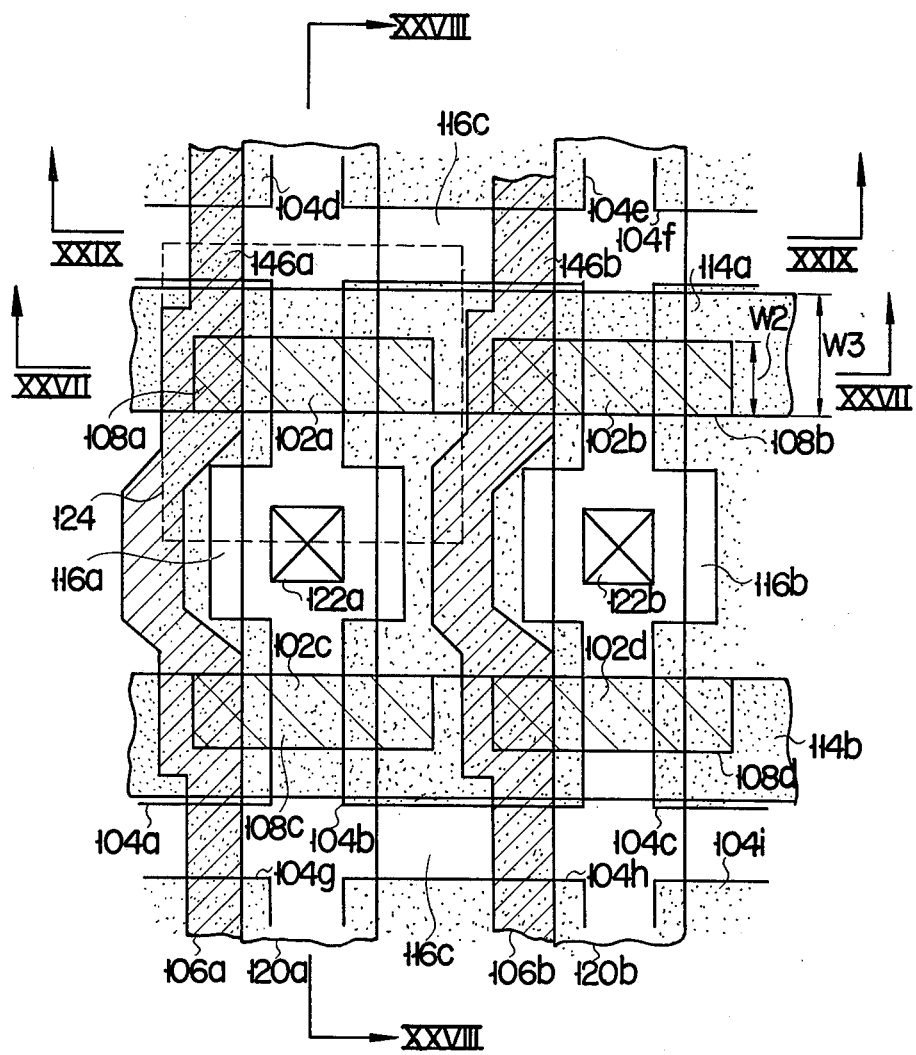
FIG. 26 is a plan view of a fifth group of memory cells constituting the semiconductor memory device according to the present invention.
Figure 27:
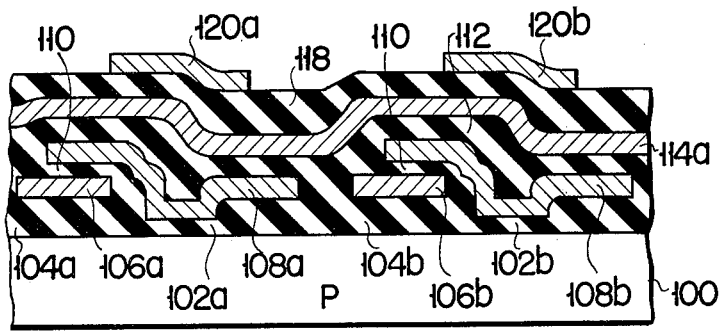
FIG. 27 is a sectional view along the line XXVII—XXVII of FIG. 26.
Figure 28:
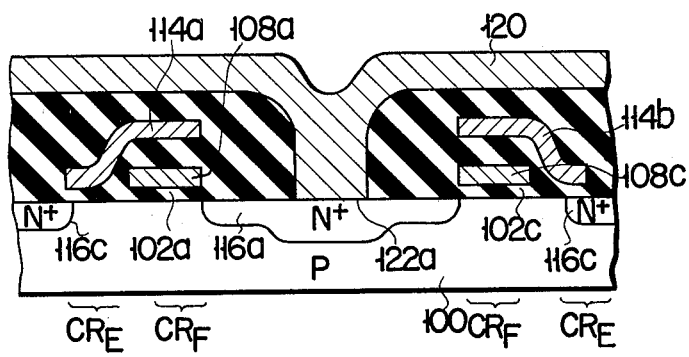
FIG. 28 is a sectional view along the line XXVIII—XXVIII of FIG. 26.
Figure 29:
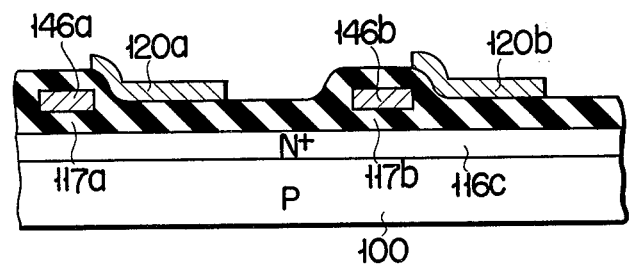
FIG. 29 is a sectional view along the line XXIX—XXIX of FIG. 26.

The fifth group of the memory cells constituting the semiconductor memory device according to the present invention will now be described with reference to FIGS. 26 to 29. FIG. 26 is a plan view of a 4-bit memory cell, FIG. 27 is a sectional view along the line XXVII—XXVII of FIG. 26, FIG. 28 is a sectional view along the line XXVIII—XXVIII of FIG. 26, and FIG. 29 is a sectional view along the line XXIX—XXIX of FIG. 26. Referring to FIG. 26, the doped regions of the semiconductor substrate are indicated by the clear areas, the oxide areas are indicated by the dotted areas, and the polycrystalline silicon members are indicated by the cross-hatched areas. The same reference numerals in FIGS. 26 to 29 corresponding to those in FIGS. 15 to 18 denote the same parts.

The above-described memory cell group differs from the third group of memory cell of FIG. 15 in that the width W2 of the second conductive layers 108a, 108b, 108c and 108d functioning as the floating gates is narrower than the width W3 of the third conductive layers 114a and 114b functioning as the control gates. The difference also resides in that the width W2 of the second conductive layers 108a to 108d along the direction of channel is smaller than the channel length, and the width W3 of the third conductive layers 114a and 114b along the direction of channel is equal to or greater than the channel length. As may be seen from FIG. 28, the substrate region in which the channels are formed consists of a substrate region $CR_F$ on which are formed the second conductive layers 108a and 108b with the gate insulating films 102a and 102c interposed therebetween and a substrate region $CR_E$ on which are formed the third conductive layers 114a and 114b with the gate insulating flims 102a and 102c interposed therebetween.

Figure 30:
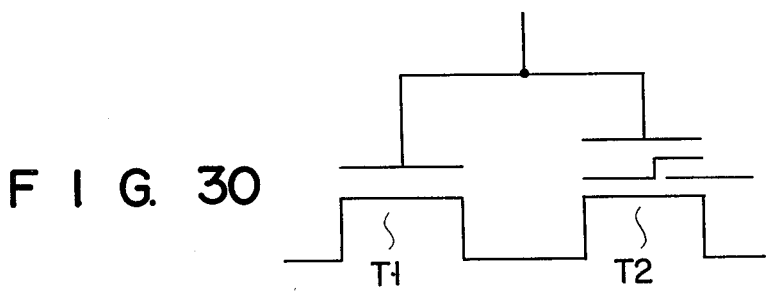
FIG. 30 is an equivalent circuit diagram of a 1-bit memory cell of the fifth group of memory cells of FIG. 26.

In the memory cell group shown in FIG. 26, the memory cell for 1 bit indicated by the broken line may be represented by the equivalent circuit diagram shown in FIG. 30. This memory cell thus consists of an enhancement type MOS transistor T1 in which a channel is formed in the substrate region $CR_E$, and a double gate type MOS transistor T2 in which a channel is formed in the substrate region $CR_F$ and which has an erase gate. These transistors T1 and T2 are series-connected.

In the memory cell of this construction, even when the electrons are excessively discharged from the floating gate FG of the enhancement type MOS transistor T2 to convert the MOS transistor T2 to the depletion type MOS transistor, the enhancement type MOS transistor T1 is kept off as long as the third conductive layers 114a and 114b are at 0 V or at ground potential. Since a current does not flow to a memory cell which is not selected, data may be read out from the memory cell independently of the condition of the MOS transistor T2.

Figure 31A:
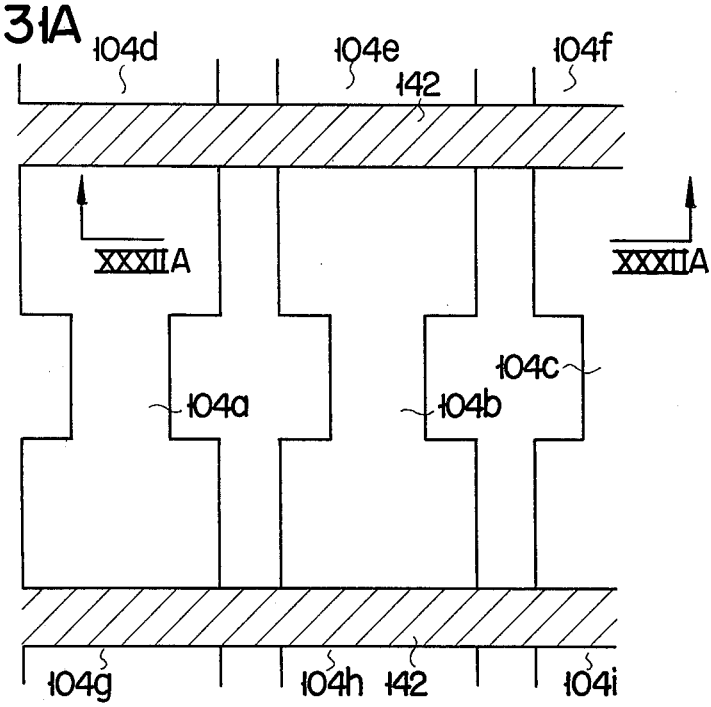
Figure 31B:
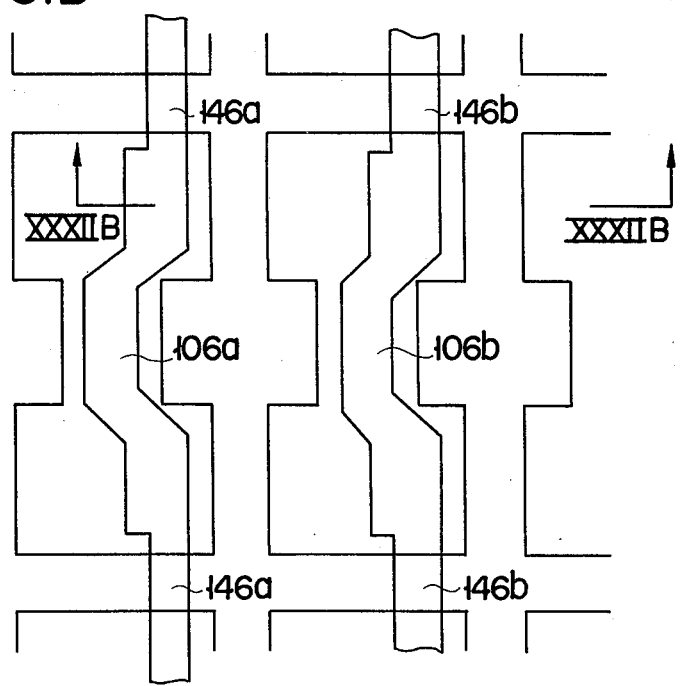
Figure 31C:
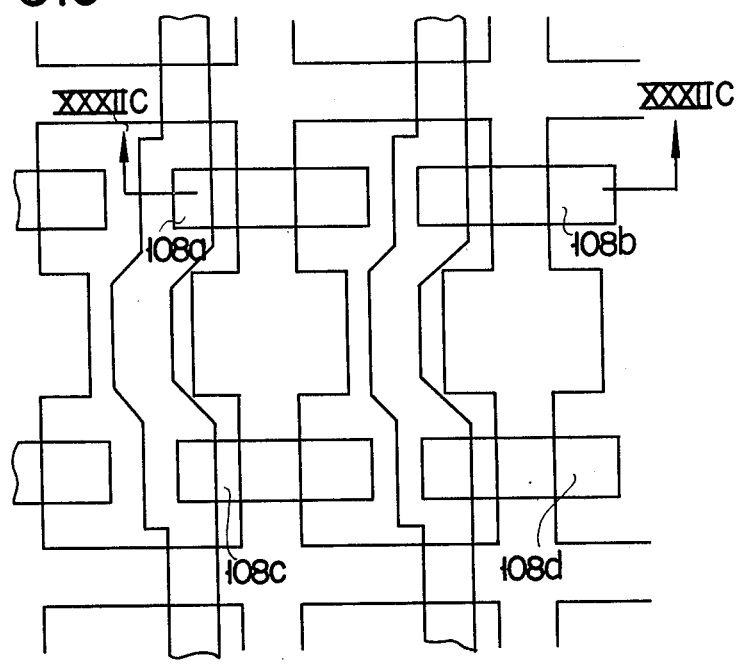
Figure 31D:
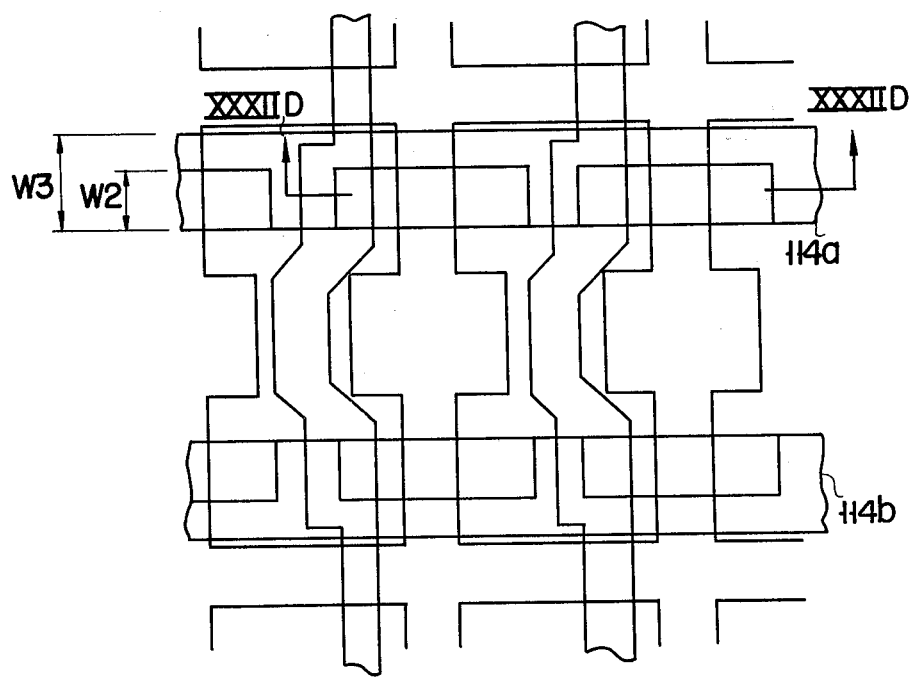
Figure 32A:
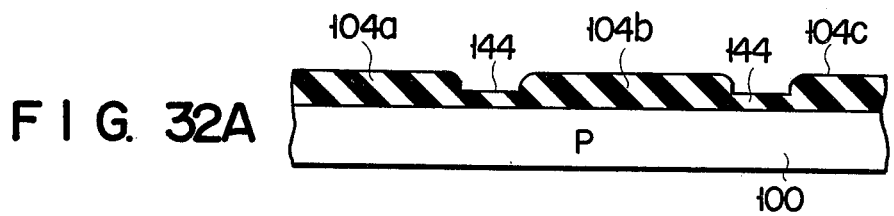
FIGS. 32A to 32E are sectional views along the lines XXXIIA—XXXIIA, XXXIIB—XXXIIB, XXXIIE—XXXIIE, respectively, of FIGS. 31A to 31E.
Figure 32B:
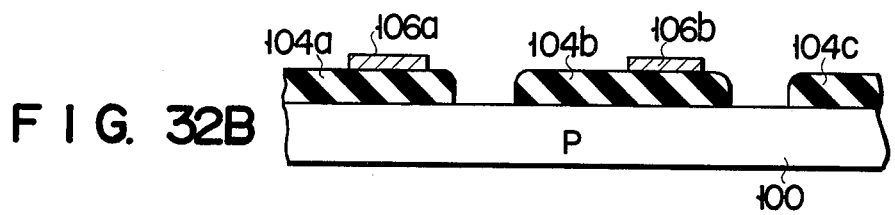
Figure 32C:
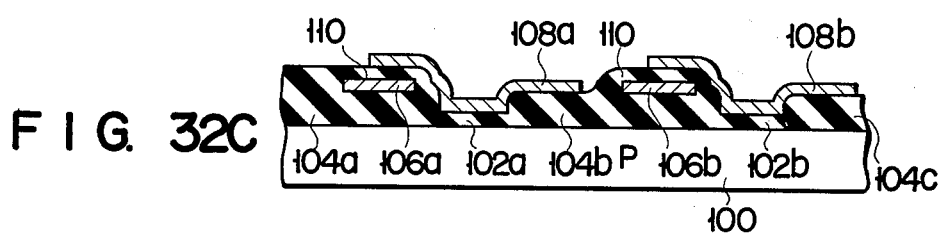
Figure 32D:
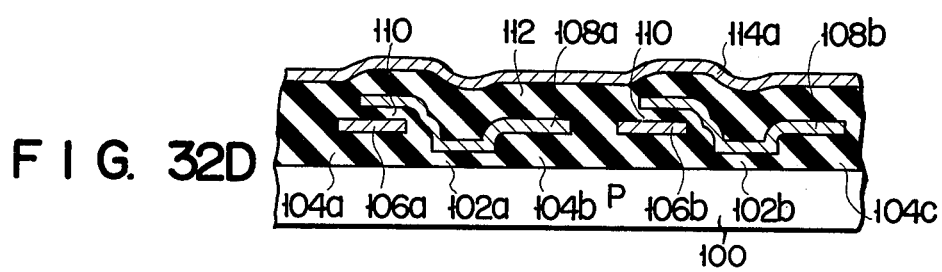
Figure 32E:
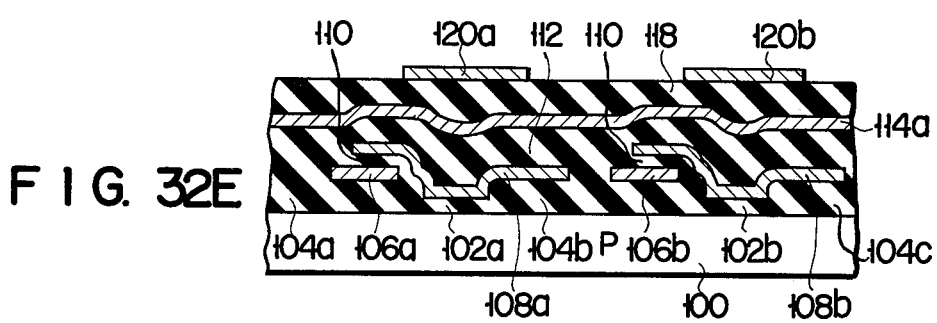

The method for manufacturing the fifth group of memory cells of the present invention will now be described with reference to FIGS. 31A to 31E and FIGS. 32A to 32E. FIGS. 31A to 31E are plan views of the semiconductor substrate, and FIGS. 32A to 32E are sectional views along the lines XXXIIA—XXXIIA, XXXIIB—XXXIIB, . . . , XXXIIE—XXXIIE, respectively, of FIGS. 31A to 31E. The method for manufacturing the fifth group of memory cells is similar to that for the third group. Therefore, the same reference numerals denote the same parts as in FIGS. 19A to 19E and FIGS. 20A to 20E, and only different steps will be described. First, after forming the second conductive layers 108a, 108b, 108c and 108d as shown in FIGS. 31C and 32C, the insulating film 112 which has a thickness of 1,000 to 2,000 Å is formed by the thermal oxidation method as shown in FIG. 32D. A polycrystalline silicon layer is deposited over this insulating film 112. The polycrystalline silicon layer is etched by photolithography to form the third conductive layers 114a and 114b having the width W3. In this step, one side each of the second conductive layers 108a, 108b, 108c and 108d is self-aligned with one side each of the third conductive layers 114a and 114b, so that the second conductive layers 108a, 108b, 108c and 108d have the width W2.

In the next step as shown in FIG. 31E, using as a mask the third conductive layers 114a and 114b and the field insulating films 104a to 104i, phosphorus or arsenic is diffused in the region indicated by the hatched lines to form the N+-type semiconductor layers 116a and 116b functioning as the drains and the N+-type semiconductor layer 116c functioning as the source. The following steps are the same as those in the method for manufacturing the third group of memory cells.

Figure 34:
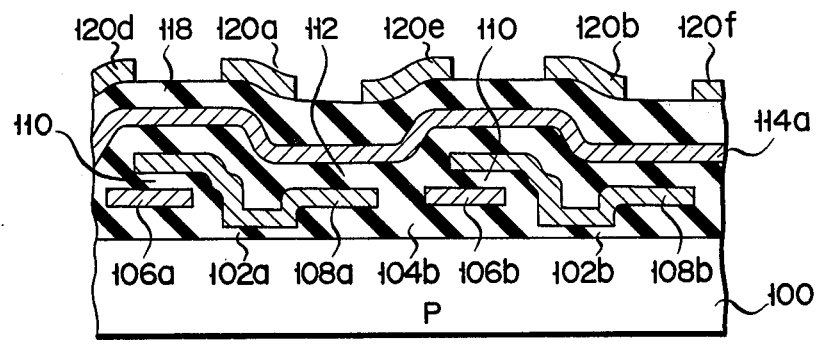
FIG. 34 is a sectional view along the line XXXIV—XXXIV of FIG. 33.
Figure 36A:
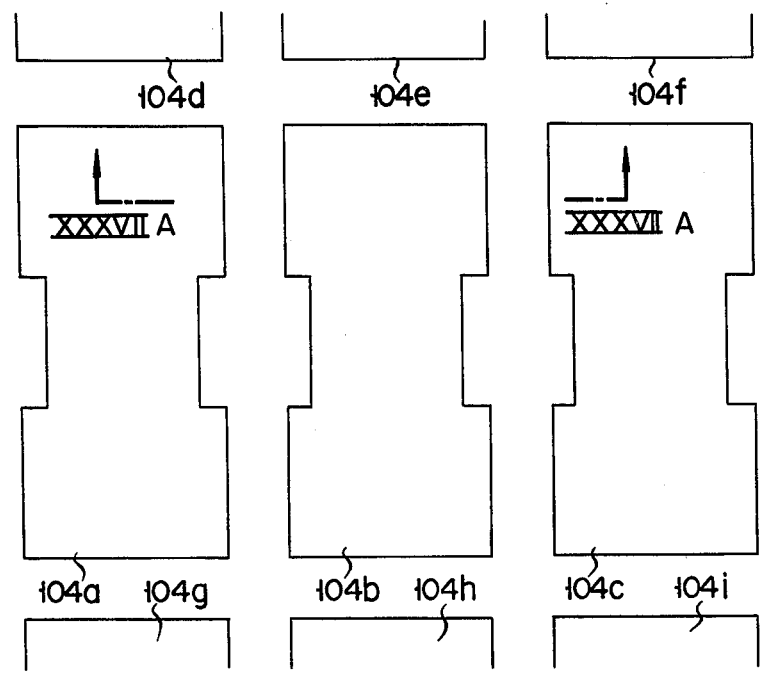
FIGS. 36A to 36E are sectional views of a semiconductor substrate for explaining a method for manufacturing the sixth group of memory cells shown in FIG. 33.
Figure 35:
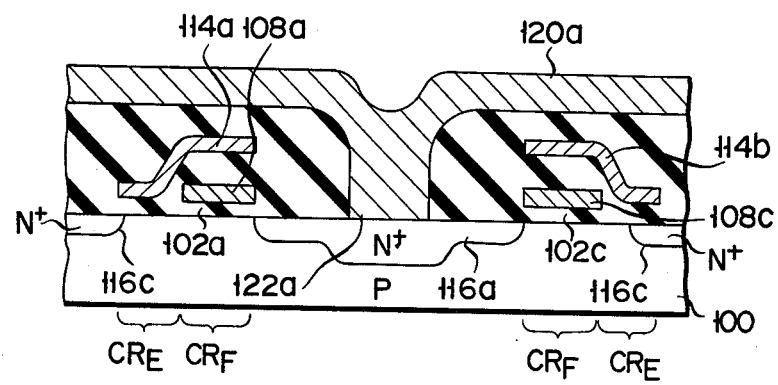
FIG. 35 is a sectional view along the line XXXV—XXXV of FIG. 33.

The sixth group of memory cells constituting a semiconductor memory device of the present invention will now be described with reference to FIGS. 33 to 35. FIG. 33 is a plan view of the sixth group of memory cells, FIG. 34 is a sectional view along the line XXXIV—XXXIV of FIG. 33, FIG. 35 is a sectional view along the line XXXV—XXXV of FIG. 33. Referring to FIG. 33, the doped regions of the semiconductor substrate are indicated by clear areas, the oxide areas are indicated by the dotted areas, and the polycrystalline silicon members are indicated by the cross-hatched areas. Since the sixth group of memory cells has the similar structure as that of the fourth group, the same reference numerals denote the same parts as in FIGS. 21 to 23.

The sixth group of memory cells differs from the fourth group shown in FIG. 21 in that the width W2 of the second conductive layers 108a, 108b, 108c and 108d functioning as the floating gates is narrower than the width W3 of the third conductive layers 114a and 114b functioning as the control gates. The difference also resides in that the width W2 of the second conductive layers 108a to 108d along the direction of channel is shorter than the channel length, and the width W3 of the third conductive layers 114a and 114b along the direction of channel is equal to or greater than the channel length. As may be seen from FIG. 35, the substrate region at which the channel is formed consists of the substrate region $CR_F$ on which the second conductive layers 108a and 108c is formed with the gate insulating films 102a and 102c interposed therebetween and the substrate region $CR_E$ on which the third conductive layers 114a and 114b are formed with the gate insulating films 102a and 102c interposed therebetween.

In the group of memory cells shown in FIG. 33, the memory cell for 1 bit present in the region 124 surrounded by the broken lines may be represented by the equivalent circuit diagram as shown in FIG. 30, the description of which has been already made. Thus, this memory cell consists of the enhancement type MOS transistor T1 in which the channel is formed in the substrate region $CR_E$ shown in FIG. 35 and the double gate type MOS transistor T2 in which the channel is formed in the substrate region $CR_F$ and which has the erase gate. These transistors T1 and T2 are series-connected.

In the memory cells of this construction, as in the case of the fifth group of memory cells, even if the electrons are excessively discharged from the floating gate FG of the enhancement type MOS transistor T2 and the MOS transistor T2 is converted to the depletion type MOS transistor, the enhancement type MOS transistor T1 is kept off as long as the third conductive layers 114a and 114b are at 0 V or at ground potential. Therefore, data may be read out from the memory cell independently of the condition of the MOS transistor T2 since a current does not flow to the memory cell which is not selected.

Figure 36B:
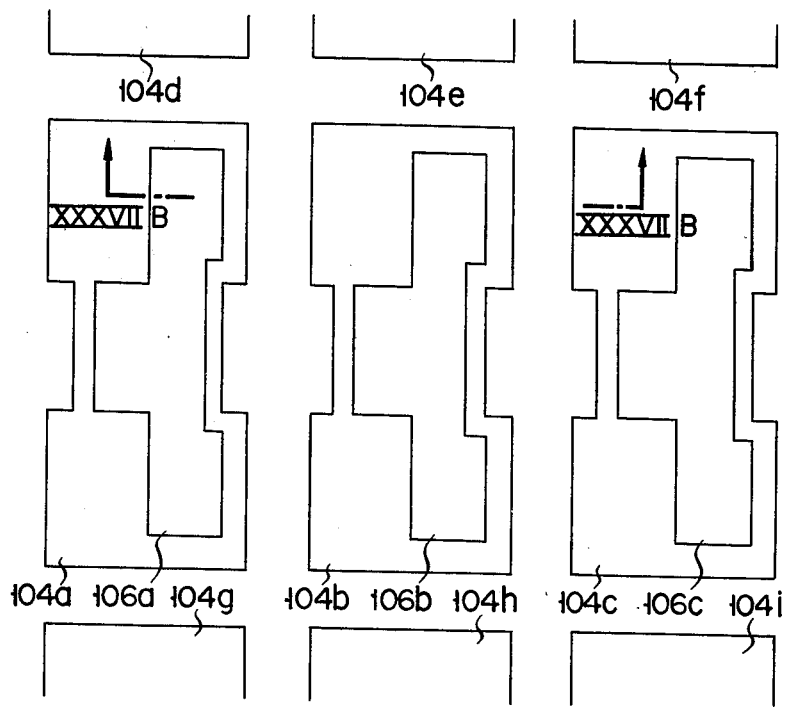
Figure 36C:
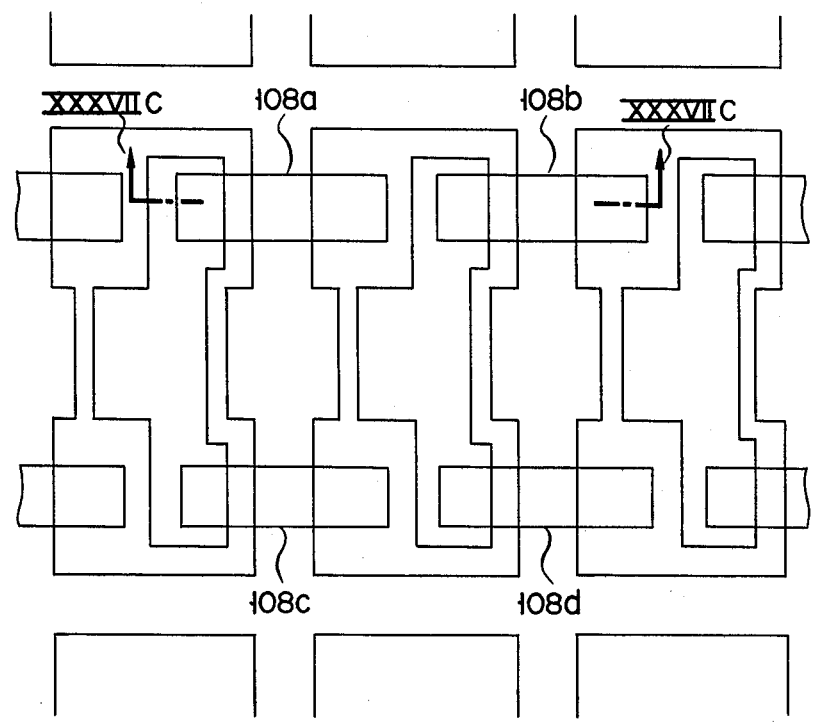
Figure 36D:
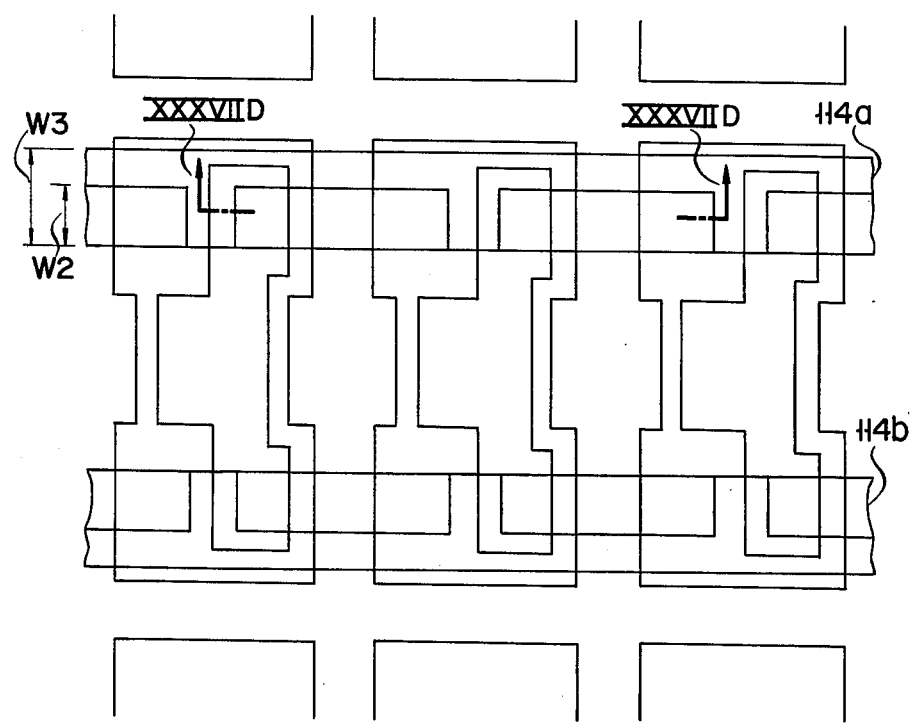

The method for manufacturing the sixth group of memory cells according to the present invention will now be described with reference to FIGS. 36A to 36E and FIGS. 37A to 37E. FIGS. 36A to 36E are plan views of the semiconductor substrate, and FIGS. 37A to 37E are sectional views along the lines XXXVIIA—XXXVIIA, XXXVIIB—XXXVIIB, . . . , XXXVIIE—XXXVIIE, respectively, of FIGS. 36A to 36E. The method for manufacturing the sixth group of memory cells is similar to that for the fourth group. Therefore, the same reference numerals denote the same parts as in FIGS. 24A to 24E and FIGS. 25A to 25E, and only different steps will be described. After forming the second conductive layers 108a, 108b, 108c and 108d as shown in FIGS. 36C and 37C, the insulating film 112, having a thickness of 1,000 to 2,000 Å, is formed by the thermal oxidation method as shown in FIG. 37D. A polycrystalline silicon layer is deposited on the insulating film 112, and this polycrystalline silicon layer is etched by photolithography to form the third conductive layers 114a and 114b having the width W3. Simultaneously with this, one side each of the second conductive layers 108a, 108b, 108c and 108d is self-aligned with one side each of the third conductive layers 114a and 114b, so that the second conductive layers 108a to 108d may have the width W2.

Figure 36E:
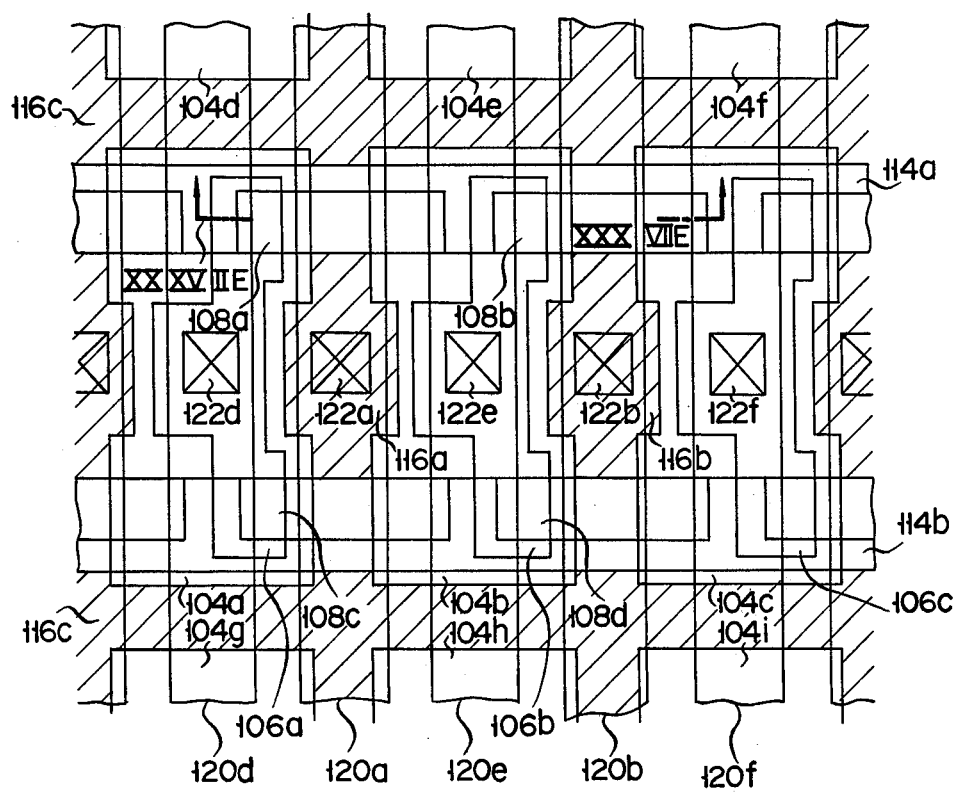
Figure 37A:
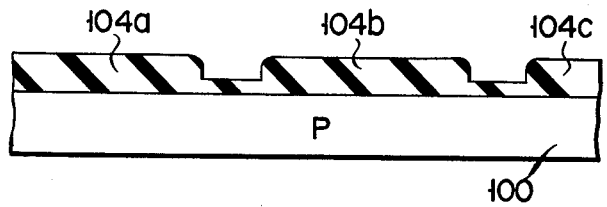
FIGS. 37A to 37E are sectional views along the lines XXXVIIA—XXXVIIA, XXXVIIB—XXXVIIB, . . . , XXXVIIE—XXXVIIE, respectively, of FIGS. 36A to 36E.
Figure 37B:
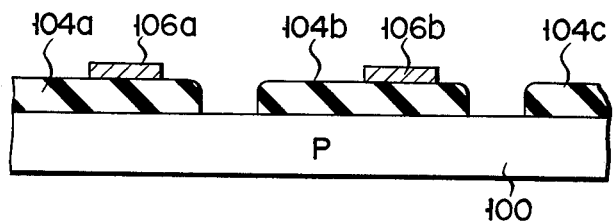
Figure 37C:
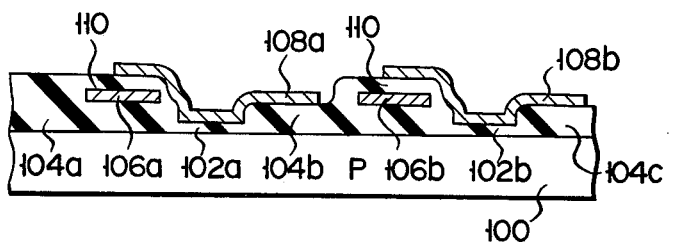
Figure 37D:
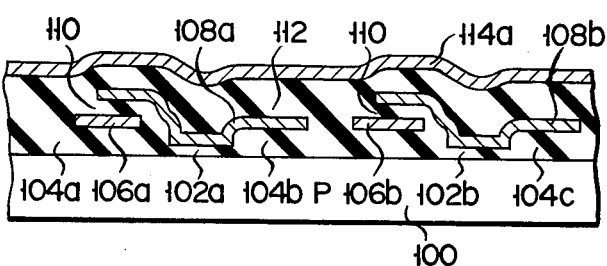
Figure 37E:
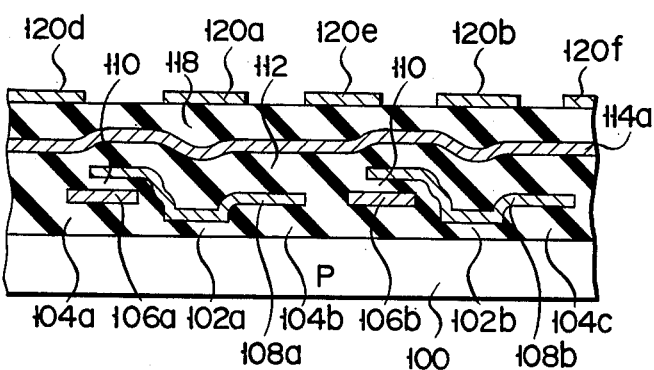

In the next step as shown in FIG. 36E, using as a mask the third conductive layers 114a and 114b and the field insulating films 104a to 104i, phosphorus or arsenic is doped in the region indicated by hatched lines to form the N+-type semiconductor layers 116a and 116b functioning as the drains and the N+-type semiconductor layers 116c functioning as the sources. The following steps are the same as those described with reference to the fourth group of memory cells.

Figure 38:
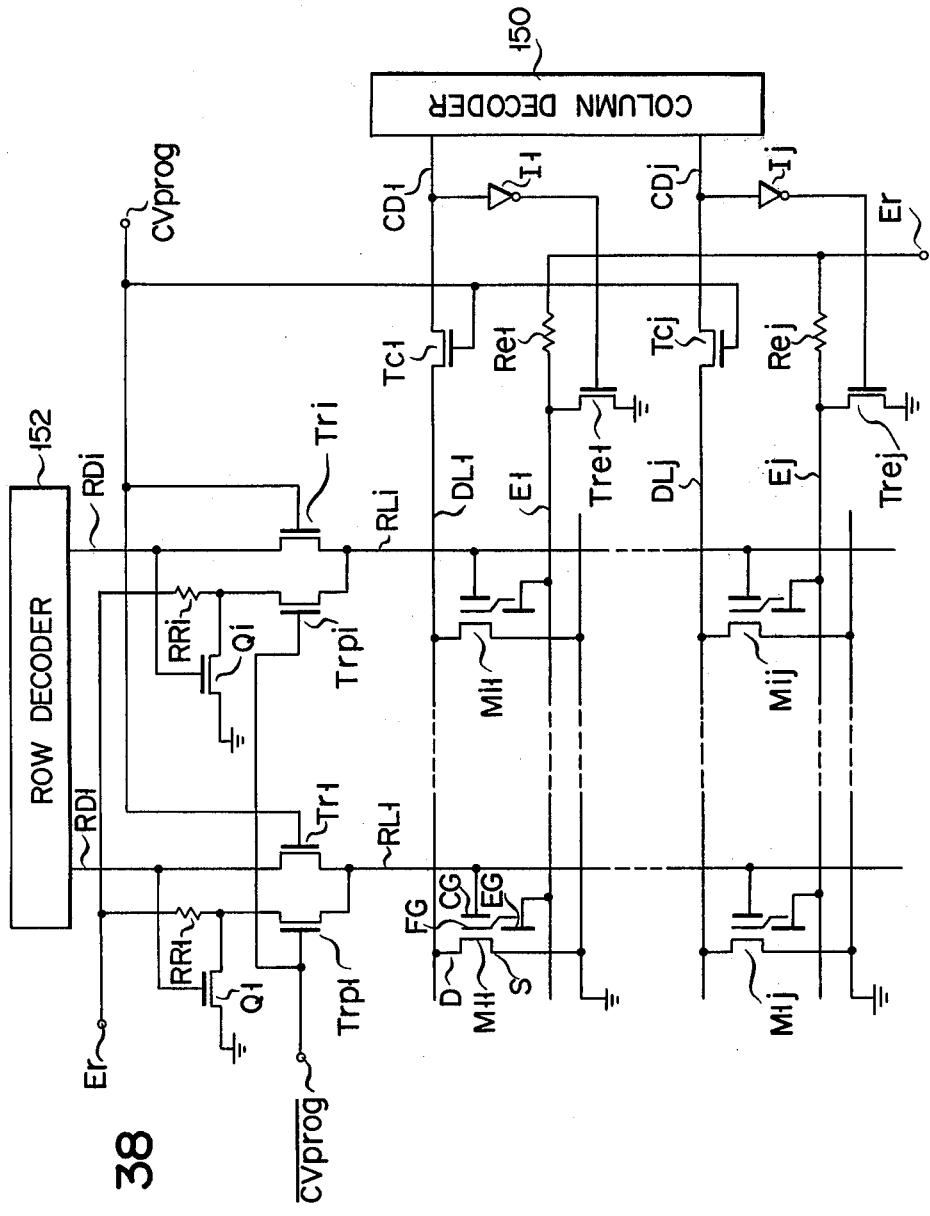
FIG. 38 is a circuit diagram of a first embodiment of the semiconductor memory device according to the present invention.

FIG. 38 shows the first embodiment of the semiconductor memory device which has i×j bits constituted by any one of the first to sixth memory cells described above. If the semiconductor memory device is constituted by any one of the third to sixth memory cells, data writing and erasure in units of bits may be performed. The memory cell is arranged in a matrix form which numbers i in the column direction and j in the row direction. Each of the respective memory cells M11 to Mij comprises the control gate CG, the floating gate FG, the erase gate EG, the drain D and the source S. The drains D of the memory cells in the same column are commonly connected to the digit lines $DL_1$ to $DL_j$, respectively. The sources S of the respective memory cells are grounded. The control gates of the memory cells arranged in one row are commonly connected to row lines RL1 to RLi, respectively.

A column address is input to the column decoder 150, one output end of which is selected according to this column address when reading out or writing data. Then, a high voltage such as +5 V or +20 V is applied from the selected output end and low voltages such as 0 V are output from the nonselected output ends. A row address is input to the row decoder 152, one output end of which is selected according to this row address when reading out or writing data. Then, a high voltage is output from the selected output end and low voltages are output from all the nonselected output ends. The digit lines DL1 to DLj are connected to output ends CD1 and CDj of the column decoder 150 through MOS transistors Tc1 to Tcj, respectively.

Erase lines E1 to Ej are connected to the erase terminal Er for erasing data through resistors Re1 to Rej, respectively. The erase lines E1 to Ej are grounded through MOS transistors Tre1 to Trej. The output ends CD1 to DCj of the column decoder 150 are connected to the gates of the transistors Tre1 to Trej through inverters I1 to Ij, respectively. The gates of the transistors Tc1 to Tcj are commonly connected to a terminal CVprog.

Row lines RL1 to RLi are connected to output ends RD1 to RDi of the row decoder 152 through the MOS transistors Tr1 to Tri, respectively. The gates of the transistors Tr1 to Tri are commonly connected to the terminal CVprog. The row lines RL1 to RLi are connected to one end each of MOS transistors Trp1 to Trpi, the other ends of which are respectively grounded through MOS transistors Q1 to Qi, as well as being connected to the terminal Er through resistors RR1 to RRi. The gates of the transistors Trp1 to Trpi are commonly connected to a terminal $\overline{CVprog}$ to which inverted signals of the signals input to the terminal CVprog are input. The gates of the transistors Q1 to Qi are respectively connected to the terminals RD1 to RDi. For erasing data, a data erase voltage, for example, +40 V is applied to the terminal Er.

The mode of operation of the semiconductor memory device will now be described, which memory is capable of selecting memory cells in units of bits and erasing data in units of bits. During writing, the terminal CVprog is at high level, and the terminal $\overline{CVprog}$ is at low level. Therefore, the transistors Tr1 to Tri are turned on, transistors Tc1 to Tcj are turned on, the transistors Trp1 to Trpi are turned off. Therefore, the output of the row decoder 152 is input to the row lines RL1 to RLi, and the output of the column decoder 150 is input to the digit lines DL1 to DLj. If the memory cell Mij is selected, the row line RLi is at high level, and the digit line DLj is at high level so that a program voltage is applied to the memory cell Mij. Therefore, the electrons are injected into the floating gate of the memory cell Mij, and the threshold voltage of this memory cell is raised, thus completing the writing.

Erasing of data only in the memory cell Mij, for example, will now be described. During erasing, the terminal CVprog is at low level, and the terminal $\overline{CVprog}$ is at high level. Since the transistors Tr1 to Tri are turned off, the output of the row decoder 152 is not directly input to the row lines RL1 to RLi. However, since the transistors Trp1 to Trpi are turned on, the high voltage from the erase terminal Er is decoded by the row decoder 152. In other words, when the memory cell Mij is selected, the output end RDi alone of the row decoder 152 is at high level, and all the remaining output ends RD1 to RD(i−1) are at low level. Therefore, since the transistor Qi alone is turned on, the row line RLi alone is at low level, that is, 0 V, and a high voltage, that is, the voltage applied to the erase terminal Er is input to all the remaining row lines RL1 to RL(i−1). The high voltage applied to the terminal $\overline{CVprog}$ is preferably at a higher level (e.g., +45 V) than the voltage level applied to the erase terminal Er. Consequently, the selected row line is at low level and the nonselected row lines are at high level during erasing.

The mode of operation of the circuit including the column decoder 150 will now be described. Since the terminal CVprog is at low level as has been described above, the transistors Tc1 to Tcj are turned off, and the output from the column decoder 150 is input to the gates of the transistors Tre1 to Trej through the nverters I1 to Ij, respectively. Since the memory cell Mij has been selected, the output CDj alone of the column decoder 150 becomes high level. Then, the transistor Trej alone is turned off, and the high voltage applied to the terminal Er is applied to the erase line Ej alone. On the other hand, the high voltage is applied to the control gates of the memory cells M1j to M(i−1)j. The potentials at the floating gates of the memory cells M1j to M(i−1)j may made high by increasing the coupling capacitances of the floating gates and the control gates of the memory cells. Therefore, the field emission is not caused between the floating gates and the erase gates of the memory cells M1j to M(i−1)j even when the high voltage is applied to the erase gates of the memory cells M1j to M(i−1)j. On the other hand, since the potential of the control gate of the memory cell Mij has a low level, that is, 0 V, the potential of the floating gate of the memory cell Mij is about 0 V even if the coupling capacitance between the control gate and the floating gate is great. Therefore the high voltage applied to the erase line Ej is directly applied across the floating gate and the erase gate so that the electrons are discharged from the floating gate of the memory cell Mij alone by the field emission.

The second embodiment according to the present invention will now be described with reference to FIG. 39. The same reference numerals as in the first embodiment in FIG. 38 denote the same parts in FIG. 39, so that the description thereof will be omitted. Only the chracteristic features of the second embodiment will be described. In the semiconductor memory device in the second embodiment, when data is read out or written, the terminal CVprog is set at high level and the terminal $\overline{CVprog}$ is set at low. level. On the other hand, when data is erased, the terminal CVprog is set at low level and the terminal $\overline{CVprog}$ is set at high level. The erase terminals Er are respectively connected to the erase lines E1, . . . , Ej through the MOS transistors Te1, . . . , Tej. Output terminals CD1, . . . , CDj of a column decoder 150 are respectively connected to the gates of the transistors Te1, . . . , Tej through boosters BS1, . . . , BSj. One end of a MOS transistor Qr the gate of which is connected to the terminal $\overline{CVprog}$ is grounded, and the other end thereof is connected to one end each of the transistors Q1, . . . , Qi.

FIG. 40 shows an example of the boosters BS1, . . . , BSj. This circuit utilizes a bootstrap. In the circuit, for example, a voltage of +5 V is supplied to an input terminal IN and a voltage +45 V is then output at an output terminal OUT. One end of a transistor T12 the gate of which is connected to the input terminal IN is grounded and the other end thereof is connected to one end of a transistor T11 and to the gate of a transistor T16. The gate of the transistor T11 is connected to the terminal $\overline{\text{CVprog}}$ and the gate of the transistor T14. The other end of the transistor T11 is connected to one end each of the transistors T13 and T14 and to the erase terminal Er. One end of the transistor T13 is connected to its gate, and the other end thereof is connected to one end of a capacitor Cl and the gate of a transistor T15. The other end of the capacitor Cl is connected to the output terminal OUT and one end of the transistor T15. Furthermore, the other end of the capacitor Cl is connected to the other end of a transistor T16 one end of which is grounded.

The other end of the transistor T14 whose one end is connected to the erase terminal is connected to the other end of the transistor T15. Therefore, at the stage of data erasure, for example, when the output end CDj of the column decoder shown in FIG. 39 is selected, the voltage of +45 V is supplied to the gate of the transistor Tej and only the transistor Tej is turned on. Therefore, the voltage of +40 V applied to the erase terminal Er is only at the erase line Ej.

On the other hand, when data is erased, the transistor Qr is turned on, while the transistors Tr1, ..., Tri are rendered nonconductive. For example, when a terminal RDi of the row decoder only is selected, the transistor Qi only is rendered conductive among the transistors Q1, ..., Qi. Therefore, through the transistors Qr and Qi, a row line RLi is set at low level, that is, at 0 V. The voltage of +40 V for erasing data is applied to row lines RL1, ..., RL(i−1) through resistors RR1, ..., RR(i−1). As a result, data is erased only from the memory cell Mij.

The third embodiment of the semiconductor memory device according to the present invention will now be described with reference to FIG. 41. The same reference numerals as the second embodiment in FIG. 39 denote the same parts in the third embodiment in FIG. 41, so that the description thereof will be omitted. Only the characteristic features of the third embodiment will be described. In the same manner as in the second embodiment, when data is read out or written, the terminal CVprog is set at high level and the terminal $\overline{\text{CVprog}}$ is set at low level. On the other hand, when data is erased, the terminal CVprog is set at low level and the terminal $\overline{\text{CVprog}}$ is set at high level. The level of the terminal $\overline{\text{CVprog}}$ is preferably higher than that of the terminal Er.

In order to prevent voltage drop for the erase voltage applied to the row lines RL1, ..., RLi, the boosters BC1, ..., BCi utilizing bootstraps are arranged between the erase terminals Er and the row lines RL1, ..., RLi, respectively. Transistors Q21, ..., Q2i are respectively arranged between the boosters BC1, ..., BCi and the row lines RL1, ..., RLi, to be rendered nonconductive so as to cut off the boosters BC1, ..., BCi from the row lines RL1, ..., RLi when data is read out, so that readout speed of the data may be increased. The booster BCi comprises the transistors Qi1, ..., Qi4 and the capacitor Cil. The gate of the transistor Qi2 is connected to the terminal $\overline{\text{CVprog}}$.

One end of the transistor Qi2 is connected to the terminal Er, the gate of the transistor Qi1 and one end of the transistor Qi1. Furthermore, the other end of the transistor Qi2 is connected to one end of the transistor Qi3 the gate of which is connected to the other end of the transistor Qi1 and one end of the capacitor Cil. The other end of the transistor Qi3 is connected to the other end of the capacitor Cil and one end each of the transistors Qi4 and Q2i. The other end of the transistor Qi4 is grounded and the gate of which is connected to the terminal RDi of the row decoder. The gate of the transistor Q2i is connected to the terminal $\overline{\text{CVprog}}$. When data is erased, for example, when the memory cell Mij is selected, the transistor Qi4 of the booster BCi is turned on, while the transistors Q14, ..., Q(i−1)4 of the boosters BC1, ..., BC(i−1) are rendered nonconductive. Therefore, the row line RLi only is grounded through the transistors Q2i and Qi4. A voltage of high level from the terminals Er is supplied to other row lines RL1, ..., RL(i−1). As a result, the data is erased from the memory cell Mij only.

If the coupling capacitance between the control gate and the floating gate is large in each memory cell in the three semiconductor memory devices described above, when a voltage of, for example, +40 V is supplied to the control gate, a voltage of +30 V is obtained at the floating gate. Therefore, the potential difference between the erase gate and the floating gate becomes 10 V, and the electrons are not then discharged by field emission.

In order to eliminate the above problem, the memory cell must be arranged in the following manner.

If a capacitance difference between the floating gate and the control gate is defined as $C_{FC}$, a capacitance between the floating gate and the source, the substrate and the drain is defined as $C_{FB}$, and a capacitance between the floating gate and the erase gate is defined as $C_{FE}$, the memory cell must be arranged to satisfy the following relations.

$$C_{FC} \geq 2C_{FB} \tag{1}$$

$$C_{FC} + C_{FB} \geq 5C_{FE} \tag{2}$$

Relation (1) is a condition in which data is not erased even if the erase voltage is supplied to the erase gate when the voltage is supplied to the control gate. Relation (2) is a condition in which the electrons are efficiently discharged by field emission from the floating gate to the erase gate when the control gate is set substantially at 0 V.

Furthermore, in order to solve a problem that the floating gate is charged at a positive potential due to excessive discharging of electrons from the floating gate of the memory cell when data is erased, the semiconductor memory device of the first embodiment must be arranged adopting the fifth and sixth groups of memory cells, so that proper data only is read out from the memory cell.

The fourth embodiment of the semiconductor memory device according to the present invention will now be described with reference to FIG. 42. Data is erased for each column unit in this semiconductor memory device. The semiconductor memory device is constituted by the first to sixth groups of memory cells which number i in the column direction and j in the row direction in a matrix form. Each memory cell M11, ..., or Mij is constituted by the control gate CG, the floating gate FG, the erase gate EG, the drain D and the source S. The drains D of the memory cells M11, ..., Mij aligned in the same columns are commonly connected to digit lines DL1, ..., DLj, respectively. The digit lines DL1, ..., DLj are connected to the output terminals of the column decoder 150, respectively. A column address is input to the column decoder 150 and an output end corresponding to the column address is selected when data is read out or written. A signal of high level, for example, signal of +5 V or +20 V is output at the selected output terminal. A signal of low level, for example, signal of 0 V is output at other output terminals which are not selected. The control gates CG of the memory cells aligned on the same row are commonly connected to the row lines RL1, ..., RLi, respectively. A row address is input to the row decoder 152. An output terminal is selected in correspondence with the row address when data is read out or written. A signal of high level is output only at the selected output terminal, while a signal of low level is output at the nonselected output terminals.

The erase gates EG numbering i of the respective memory cells aligned on the same column are commonly connected to the erase lines E1, ..., Ej, respectively. The erase lines E1, ..., Ej are respectively connected to the output terminals of the boosters BS through the N-channel MOS transistors Teb1, ..., Tebj of the enhancement type. The gates of the MOS transistors Teb1, ..., Tebj are connected to output terminals of an erase decoder 156. Furthermore, the sources S of all the memory cells M11, ..., Mij are commonly grounded.

The voltage booster BS boosts a voltage Vpp of +20 V for writing data or a power source voltage Vcc of +5 V during the period for which the control signal E for erasing data is set at high level (data erasing period) to produce a voltage of +40 V for erasing data. An erase column selection address is input to the erase decoder 156. Furthermore, while the data erase control signal E is at high level, an output terminal of the erase decoder 156 is determined in response to the erase column selection address. A signal of high level, for example, of +42 to +45 V is output at this output terminal of the erase decoder 156. A signal of low level, for example, of 0 V is output from other nonselected terminals of the erase decoder 156.

In the semiconductor memory device with this arrangement, when the data erase control signal E is set at high level for erasure of data, the voltage Vcc of +5 V or the voltage Vpp of +20 V is boosted by the booster BS and the data erase voltage of +40 V is output at the output terminal of the booster. Furthermore, when the data erase control signal E is at high level, a signal of high level is output at one of the output terminals of the erase decoder 156. When this output signal of high level is applied to the gate of the MOS transistor Tebj, the MOS transistor Tebj is turned on so that the data erase voltage of +40 V is applied to the erase line Ej. Therefore, data in the memory cells numbering i in the jth column are spontaneously erased. In this manner, a column whose data is to be erased is selected in response to an output from the erase decoder. When data is erased, all the digit lines DL1, ..., DLj and all the row lines RL1, ..., RLi are set at low level.

A data erase voltage may be applied from an external source by providing erase terminals instead of the voltage booster BS.

In the semiconductor memory device of the embodiment described above, since the erase gates EG of the memory cells aligned in the same column are commonly connected, data may be erased for each column unit. This cannot be accomplished in a semiconductor memory device of the ultraviolet ray erasable type. Furthermore, the erase decoder 156 only operates for erasing data, so that power consumption of the erase decoder 156 is very small.

The fifth embodiment of the semiconductor memory device according to the present invention will now be described with reference to FIG. 43. In the same manner as in the fourth embodiment, the semiconductor memory device according to the fifth embodiment may perform erasure for each column unit. The semiconductor memory device in this embodiment is the same as that in the fourth embodiment shown in FIG. 42 except that the erase lines E1, ..., Ej are selected in response to an output from the column decoder 150 instead of selecting the erase lines E1, ..., Ej by the erase decoder 156. The digit lines DL1, ..., DLj are connected to the output terminals of the column decoder 150 through the N-channel MOS transistors Tc1, ..., Tcj of the enhancement type, respectively. The gates of the MOS transistors Tc1, ..., Tcj are commonly connected and receive an inverted signal $\overline{E}$ of a data erase control signal E. The erase lines E1, ..., Ej are connected to the erase terminal Er to which the data erase voltage of +40 V is supplied, through the resistors Re1, ..., Rej. The N-channel MOS transistors Tre1, ..., Trej of the enhancement type are respectively arranged between the erase lines E1, ..., Ej and the ground potential. Outputs from inverters I1, ..., Ij which invert outputs from the column decoder 150 are connected to the gates of the MOS transistors Tre1, ..., Trej.

In the semiconductor memory device with this arrangement, when data is not erased, that is, when data is read out or written, the MOS transistors Tc1, ..., Tcj are all turned on since the signal $\overline{E}$ is at high level. Therefore, the outputs from the column decoder 150 are respectively supplied to the digit lines DL1, ..., DLj through the MOS transistors Tc1, ..., Tcj, so that data may be read out or written. On the other hand, when data is erased, the MOS transistors Tc1, ..., Tcj are rendered nonconductive since the signal $\overline{E}$ is at low level. Therefore, the outputs from the column decoder 150 are not output to the digit lines DL1, ..., DLj.

When the column decoder 150 selects the jth column, the MOS transistor Trej is turned off since the output from the inverter Ij is at low level. The MOS transistors Tre1, ..., Tre(i−1) are rendered conductive. Therefore, the data erase voltage of +40 V applied to the erase terminal Er is supplied only to the erase line Ej through the resistor Rej. The erase lines E1, ..., Ej−1 are respectively grounded through the MOS transistors Tre1, ..., Tre(i−1). However, since the resistors Re1, ..., Re(j−1) are respectively arranged between the erase terminal Er and the erase lines E1, ..., Ej−1, the voltage of the erase terminal Er is not dropped to the ground potential. As a result, data of the memory cells numbering i in the jth column are spontaneously erased. Furthermore, a column whose data is to be erased is selected in the semiconductor memory device in response to an output from the column decoder 150.

The sixth embodiment of the semiconductor memory device according to the present invention will now be described with reference to FIG. 44. In the same manner as in the fourth and fifth embodiments of the semiconductor memory devices, the semiconductor memory device of the sixth embodiment may perform erasure of data of every memory cells numbering i aligned on the same column. The semiconductor memory device in this embodiment is the same as the semiconductor memory devices in the fifth embodiment of FIG. 43 except that the erase lines El, ..., Ej are respectively selected by the N-channel MOS transistors Tel, ..., Tej of the enhancement type arranged between the erase terminal Er and the erase lines El, ..., Ej as shown in FIG. 44, instead of selecting the erase lines El, ..., Ej by the MOS transistors Trel, ..., Trej arranged between the erase lines El, ..., Ej and the ground potential, respectively, in the fifth embodiment shown in FIG. 43. The output terminals of the boosters BSl, ..., BSj are connected to the gates of the MOS transistors Tel, ..., Tej, respectively. The output voltages from the column decoder 150 are respectively supplied to the boosters BSl, ..., BSj. When the output voltage from the column decoder 150 is at high level, the boosters BSl, ..., BSj output a voltage of high level, for example, at +45 V.

Figure 43:
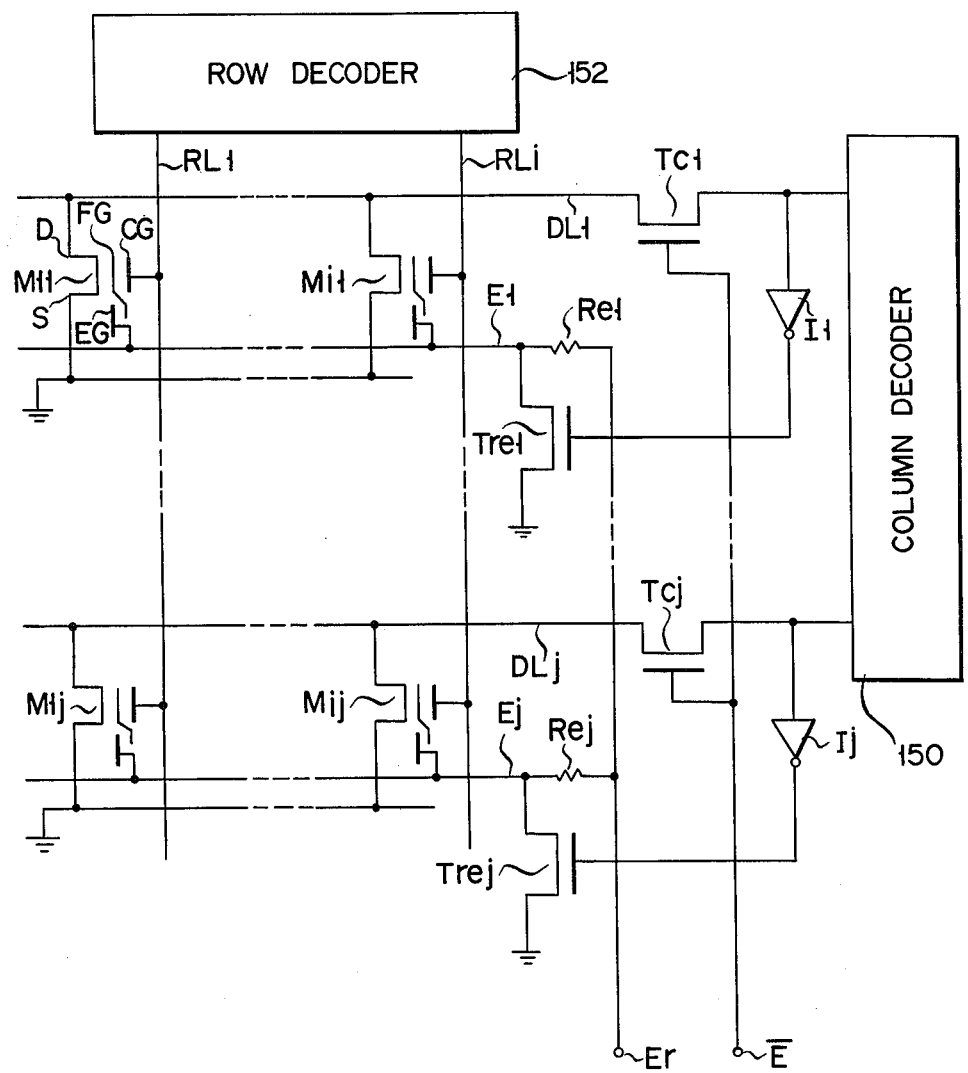
FIG. 43 is a circuit diagram of a fifth embodiment of the semiconductor memory device according to the present invention.

In the semiconductor memory device with this arrangement, when data is read out or written, in the same manner as the semiconductor memory device of the fifth embodiment as shown in FIG. 43, the MOS transistors Tcl, ..., Tcj are all turned on. Therefore, the output from the column decoder 150 is supplied to the digit lines DL1, ..., DLj so that data may be read out or written. On the other hand, when data is erased, in the same manner as in the semiconductor memory device of the fifth embodiment, the MOS transistors Tcl, ..., Tcj are all turned off so that the output from the column decoder 150 is not supplied to the digit lines DL1, ..., DLj, respectively. If the column decoder 150. selects the jth column, the voltage of +45 V is supplied from the booster BSj only and only the MOS transistor Tej connected to the erase line Ej is turned on. Other MOS transistors Tel, ..., Te(j−1) are rendered nonconductive. Therefore, the data erase voltage of +40 V applied to the erase terminal Er is only supplied to the erase line Ej through the MOS transistor Tej. As a result, data of the memory cells numbering i aligned on the jth column are spontaneously erased.

The boosters utilizing bootstraps as shown in FIG. 40 may be used in place of the boosters BSl, ..., BSj. This booster outputs a voltage of +45 V, for example.

The seventh embodiment of the semiconductor memory device according to the present invention will now be described with reference to FIG. 45. In the semiconductor memory device of this embodiment, writing efficiency and readout efficiency are increased. The memory cells numbering i in the column direction and j in the row direction are arranged in a matrix form. Each memory cell Mll, ..., or Mij is constituted by the control gate CG, the floating gate FG, the erase gate EG, the drain D and the source S. The drains D of the memory cells aligned in the same column are commonly connected to the digit lines DL1, ..., DLj, respectively. A column address is input to the column decoder 150. When data is read out or written, an output terminal of the column decoder is selected in response to this column address. A signal of high level, for example, of +5 or +20 V is output from this selected output terminal. A signal of low level, for example, of 0 V is output at other nonselected output terminals. The control gates of the memory cells aligned in the same row are commonly connected to the row lines RL1, ..., RLi, respectively. A row address is input to the row decoder 152. When data is read out or written, an output terminal of the row decoder 152 is selected in response to this row address. A signal of high level is output at the selected output terminal, while a signal of low level is output at the nonselected output terminals.

The erase gates EG of the memory cells numbering j aligned on the ith column are commonly connected to the erase line Ei. In other words, the erase gates EG of the memory cells numbering j aligned on the same row are commonly connected to the erase lines El, ..., Ei, respectively. The erase lines El, ..., Ei are respectively connected to the erase terminal Er through the N-channel MOS transistors Tel, ..., Tei of the enhancement type. When data is erased, the data erase voltage, for example, of +40 V is applied to the erase terminal Er. Furthermore, the erase lines El, ..., Ei are connected to the output terminals of the row decoder 152 through N-channel MOS transistor of the enhancement type Tedl, ..., Tedi, respectively. The gates of the MOS transistors Tel, ..., Tei are connected to a terminal $\overline{CVprog}$ to which is applied voltage $\overline{Vprog}$ higher than the sum of the data erase voltage and the threshold voltages of the MOS transistors Tel, ..., Tei, when data is erased. The gates of the MOS transistors Tedl, ..., Tedi are connected to a terminal CVprog to which is applied voltage Vprog higher than the sum of the data write voltage from the row decoder 152, for example, +20 V, and the threshold voltages of the MOS transistors Tedl, ..., Tedi.

In the semiconductor memory device with the arrangement described above, when data is erased, the data erase voltage of +40 V is applied to the erase terminal Er and the voltage $\overline{Vprog}$ is applied to the terminal $\overline{CVprog}$. In this condition, the MOS transistors Tel, ..., Tei respectively connected to the erase lines El, ..., Ei are turned on. Therefore, the data erase voltage is applied to the erase gates EG of all the memory cells through the transistors Tel, ..., Tei, respectively. All the data in the memory cells is erased.

When data is read out or written, the voltage Vprog is applied to the terminal CVprog. In this condition, the MOS transistors Tedl, ..., Tedi which are connected between the erase lines El, ..., Ei and the output terminals of the row decoder 152 are turned on. Therefore, the respective row lines RL1, ..., RLi are connected to the respective lines El, ..., Ei through the respective MOS transistors Tedl, ..., Tedi. When data is read out or written, if the row decoder 152 selects an output terminal of the ith column, a signal of high level, for example, of +5 or +20 V is supplied to the row line RLi and the erase line Ei.

If a capacitance between the floating gate FG and the control gate CG of each memory cell is defined as $C_{FC}$, a capacitance between the floating gate FG and the erase gate EG is defined as $C_{FE}$, and a capacitance between the floating gate FG and the substrate is defined as $C_{FB}$, a potential $V_F$ of the floating gate is given by the following relation when the same voltage V0 is applied to the control gate CG and the erase gate EG is applied.

$$V_F = (C_{FC}+C_{FE}) \cdot V0/(C_{FC}+C_{FE}+C_{FB}) \ldots \quad 3)$$

In writing or reading out data, if the output from the row decoder is simultaneously supplied to the same row line and the erase line and if substantially the same voltage is applied to the control gate CG and the erase gate EG of the selected memory cell, the potential of the floating gate FG may be increased by $\Delta V_F = (C_{FE}) \cdot V0/(C_{FC}+C_{FE}+C_{FB})$. Therefore, when data is read out, the output level of the memory cell is immediately stabilized at a proper level. Further, when data is written, the amount of data to be written in the memory cell, that is, the amount of charge may be increased. In other words, when data is read out or written, the output from the row decoder 152 is simultaneously supplied to the same row line and the erase line so that the erase gate EG operates as part of the control gate CG. Therefore, readout efficiency and writing efficiency are greatly improved.

When data writing and readout efficiencies are increased, the length of the part of the floating gate FG overlapping with the erase gate EG is made short. Therefore, the occupying area for a 1-bit memory is made small and the high packaging density of the semiconductor memory device is accomplished.

Figure 45:
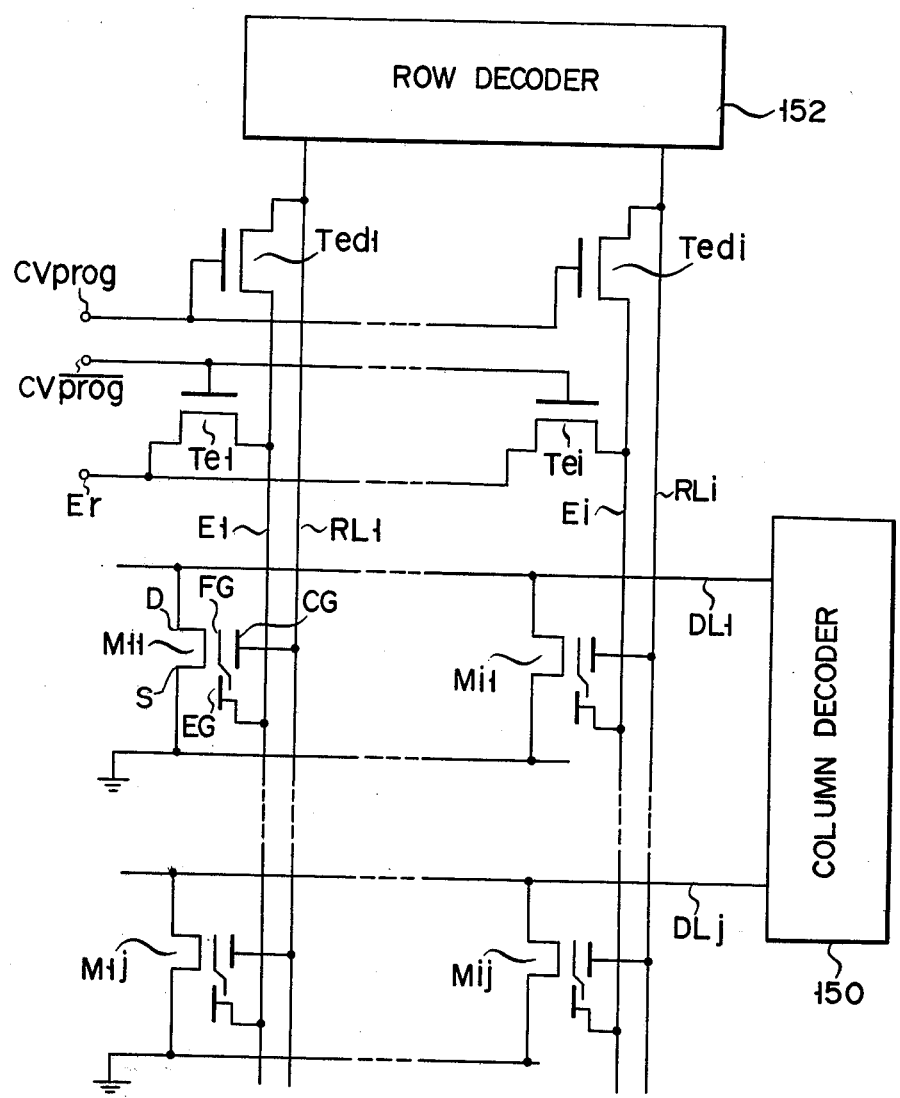
FIG. 45 is a circuit diagram of a seventh embodiment of the semiconductor memory device according to the present invention.

In the seventh embodiment of the semiconductor memory device shown in FIG. 45, data of all the memory cells are spontaneously erased. Alternatively, the semiconductor memory device may be arranged in such a manner that data of the memory cells of each row is erased.

What is claimed is:

1. A semiconductor memory device comprising:
a memory cell which includes
a semiconductor region of first conductivity type having an impurity region of second conductivity type,
a first conductive layer formed on said semiconductor region with a first insulating film interposed therebetween,
a second conductive layer which is formed on said semiconductor region with a second insulating film interposed therebetween for storing data, and
a third conductive layer which is formed on said second conductive layer with a third insulating film interposed therebetween and which is electrically insulated from said first and second conductive layers; and
a means for discharging an electron from said second conductive layer by field emission which includes
first means for applying a voltage of high level for erasing data to said first conductive layer to erase the stored data, and
second means for applying a voltage of low level to said third conductive layer to erase the stored data.

2. A semiconductor memory device according to claim 1, further including a capacitance $C_{FC}$ between said second conductive layer and said third conductive layer and a capacitance $C_{FB}$ between said second conductive layer and said semiconductor region and wherein $C_{FC} \geq 2C_{FB}$.

3. A semiconductor memory device according to claim 2, further including a capacitance $C_{FE}$ between said second conductive layer and said first conductive layer and wherein $C_{FC} + C_{FB} \geq 5C_{FE}$.

4. A semiconductor memory device according to claim 1, further including a substrate region of said semiconductor region and a channel in said substrate region and wherein said second conductive layer and said third conductive layer are formed on said substrate region, said second conductive layer has a width smaller than the length of said channel, and said third conductive layer has a width equal to or greater than the channel length.

5. A semiconductor memory device according to claim 1 or 4, further including a plurality of memory cells each including a semiconductor region and first through third conductive layers, said memory cells being arranged in a matrix of columns and rows, wherein each column of said matrix is associated with a different erase line and column line and wherein each row of matrix is associated with a different row line, wherein said first conductive layers of the plurality of memory cells of each column are commonly connected by their associated erase line, said impurity regions of the memory cells of each column are commonly connected by their associated column line, and said third conductive layers of each row are commonly connected by their associated row line, and wherein said first means is arranged in each erase line of said memory matrix, wherey data may be erased from the memory cells in each column of said memory matrix.

6. A semiconductor memory device according to claim 5, wherein said first means comprises:
a plurality of switching means each connected to each of said erase lines; and
voltage supplying means for supplying a voltage of high level to said switching means in order to apply a voltage of high level to said erase line for erasing said data.

7. A semiconductor memory device according to claim 6, wherein each of said switching means comprises:
a MOS transistor; and
switching signal supply means connected to a gate of said MOS transistor.

8. A semiconductor memory device according to claim 7, wherein said switching signal supply means is a decoder.

9. A semiconductor memory device according to claim 6, wherein each of said switching means comprises:
a first MOS transistor one end of which is connected to each erase line and the other end of which is grounded,
an inverter having an output which is connected to a gate of said first MOS transistor,
a column decoder connected to an input of said inverter,
a second MOS transistor which is arranged between the output of said column decoder and said column line, a voltage of low level being applied to a gate of said second MOS transistor when the data is erased and a voltage of high level being applied to the gate of said second MOS transistor when the data is read out or written; and
said voltage supplying means further comprising:
a resistor connected in series to one end of said first MOS transistor.

10. A semiconductor memory device according to claim 6, wherein said each switching means comprises:
a first MOS transistor one end of which is connected to the associated erase line and the other end of which is connected said voltage supplying means;
boost means an output of which is connected to a gate of said first MOS transistor;
a column decoder connected to an input of said boost means; and
a second MOS transistor arranged between said output of said column decoder and column line, a voltage of low level being applied to a gate of said second MOS transistor when the data is erased and a voltage of high level being applied to the gate of said second MOS transistor when the data is written or read out.

11. A semiconductor memory device according to claim 5, wherein said second means is provided in each of said row lines, whereby data may be erased for each bit unit.

12. A semiconductor memory device according to claim 11, wherein said second means includes means for setting a potential of a selected row line at high level when the data is read out or written; and wherein said second means further includes means for setting the potential of the selected row line at low level when the data is erased and potential of non-selected row lines at high level when the data is erased.

13. A semiconductor memory device according to claim 12, wherein said first means comprises:
first switching means connected to each erase line; and
voltage supplying means for supplying a voltage of high level to said first switching means in order to apply a voltage of high level to said erase line when the data is erased.

14. A semiconductor memory device according to claim 13, wherein said first switching means comprises:
a first MOS transistor one end of which is connected to each of said erase lines and the other end of which is grounded,
an inverter, an output of which is connected to a gate of said first MOS transistor,
a column decoder connected to an input of said inverter, and
a second MOS transistor arranged between each output of said column decoder and each column line, a voltage of low level being supplied to a gate of said second MOS transistor when the data is erased and a voltage of high level being supplied to the gate of the second MOS transistor when the data is read out or written; and
said voltage supplying means further comprising:
a resistor connected in series to one end of said first MOS transistor.

15. A semiconductor memory device according to claim 14, wherein said second means comprises:
a third MOS transistor one end of which is connected to each row line, a first control signal being supplied to a gate of said third MOS transistor which goes to a low level when the data is erased and which goes to a high level when the data is read out or written;
a fourth MOS transistor one end of which is connected to each row line, a second control signal which has an inverted relation with the first control signal being supplied to a gate of said fourth MOS transistor;
a fifth MOS transistor connected to the other end of said fourth MOS transistor, the other end of said fifth MOS transistor being grounded and a voltage of high level, which is equal to the voltage of high level for erasing the data being supplied to one end of said fifth MOS transistor; and
a row decoder connected to the other end of said third MOS transistor and a gate of said fifth MOS transistor.

16. A semiconductor memory device according to claim 14, wherein said second means comprises:
a third MOS transistor one end of which is connected to each row line, a first control signal being supplied to a gate of said third MOS transistor which goes to a low level when the data is erased and which goes to a high level when the data is read out or written;
a fourth MOS transistor one end of which is connected to said row line;
a fifth MOS transistor connected to the other end of said fourth MOS transistor, the other end of said fifth MOS transistor being grounded and a second control signal which has an inverted relation with said first control signal being supplied to a gate of said fifth MOS transistor;
a resistor;
voltage supply means for supplying a voltage which has the same level as the voltage of high level for erasing the data to one end of said fourth MOS transistor through a resistor; and
a row decoder connected to the other end of said third MOS transistor and the gate of said fifth MOS transistor.

17. A semiconductor memory device according to claim 14, wherein said second means comprises:
a third MOS transistor one end of which is connected to each row line, a first control signal being supplied to a gate of said third MOS transistor which goes to a low level when the data is erased and which goes to a high level when the data is written or read out;
a fourth MOS transistor one end of which is connected to said row line, a second control signal which has an inverted relation with said first control signal being supplied to a gate of said fourth MOS transistor; and
boost means to which is input a voltage equal to the voltage of high level for erasing the data and which boosts the input voltage to the other end of said fourth MOS transistor.

18. A semiconductor memory device according to claim 17, wherein said boost means comprises:
a fifth MOS transistor which receives at one end thereof a voltage equal to the voltage of high level for erasing the data, said second control signal being supplied to the gate of said fifth MOS transistor;
a sixth MOS transistor one end of which is connected to the other end of said fifth MOS transistor and the other end of which is connected to the other end of said fourth MOS transistor;
a seventh MOS transistor one end of which is connected to the other end of said sixth MOS transistor, the other end of which is grounded and a gate of which is connected to an output end of a row decoder;
an eighth MOS transistor one end of which is connected to one end of said fifth MOS transistor, the other end of which is connected to a gate of said sixth MOS transistor and a gate of which is connected to one end of said fifth MOS transistor; and
a capacitor connected to the gate of the sixth MOS transistor and to a node of said sixth and seventh MOS transistors.

19. A semiconductor memory device according to claim 13, wherein said each switching means comprises:
a first MOS transistor one end of which is connected to said erase line and the other end of which is connected said voltage supplying means;
a first boost means, an output of which is connected to a gate of said first MOS transistor;
a column decoder connected to an input of said first boost means; and
a second MOS transistor arranged between an output of said column decoder and column line, a voltage of low level being applied to a gate of said second MOS transistor when the data is erased and a voltage of high level being applied to the gate of said second MOS transistor when the data is written or read out.

20. A semiconductor memory device according to claim 19, wherein said second means comprises:
a third MOS transistor one end of which is connected to each row line, a first control signal being supplied to a gate of said third MOS transistor which goes low level when the data is erased and which goes high level when the data is read out or written;
a fourth MOS transistor one end of which is connected to each row line, a second control signal which has an inverted relation with the first control signal being supplied to a gate of said fourth MOS transistor;
a fifth MOS transistor connected to the other end of said fourth MOS transistor, the other end of said fifth MOS transistor being grounded and a voltage of high level which is equal to the voltage of high level for erasing the data being supplied to one end of said fifth MOS transistor through a resistor; and
a row decoder connected to the other end of said third MOS transistor and a gate of said fifth MOS transistor.

21. A semiconductor memory device according to claim 19, wherein said second means comprises:
a third MOS transistor one end of which is connected to each row line, a first control signal being supplied to a gate of said third MOS transistor which goes to a low level when the data is erased and which goes to a high level when the data is read out or written;
a fourth MOS transistor one end of which is connected to said row line;
a fifth MOS transistor connected to the other end of said fourth MOS transistor, the other end of said fifth MOS transistor being grounded and a second control signal which has an inverted relation with said first control signal being supplied to a gate of said fifth MOS transistor;
a resistor;
voltage supply means for supplying a voltage which has the same level as the voltage of high level for erasing the data to one end of said fourth MOS transistor through said resistor; and
a row decoder connected to the other end of said third MOS transistor and the gate of said fifth MOS transistor.

22. A semiconductor memory device according to claim 19, wherein said second means comprises:
a third MOS transistor one end of which is connected to each row line, a first control signal being supplied to a gate of said third MOS transistor which goes low level when the data is erased and which goes high level when the data is written or read out;
a fourth MOS transistor one end of which is connected to said row line, a second control signal which has an inverted relation with said first control signal being supplied to a gate of said fourth MOS transistor; and
a second boost means to which is input a voltage equal to the voltage of high level for erasing the data and which boosts the input voltage to supply to the other end of said fourth MOS transistor.

23. A semiconductor memory device according to claim 22, wherein said second boost means comprises:
a fifth MOS transistor which receives at one end thereof a voltage equal to the voltage of high level for erasing the data, said second control signal being supplied to the gate of said fifth MOS transistor;
a sixth MOS transistor one end of which is connected to the other end of said fifth MOS transistor and the other end of which is connected to the other end of said fourth MOS transistor;
a seventh MOS transistor one end of which is connected to the other end of said sixth MOS transistor, the other end of which is grounded and a gate of which is connected to an output end of a row decoder;
an eighth MOS transistor one end of which is connected to one end of said fifth MOS transistor, the other end of which is connected to a gate of said sixth MOS transistor and a gate of which is connected to one end of said fifth MOS transistor; and
a capacitor connected to the gate of the sixth MOS transistor and to a node of said sixth and seventh MOS transistors.

24. A semiconductor memory device according to claim 1 or 4, wherein a plurality of said memory cells are arranged in a matrix form by rows and columns, and
a third means is provided for supplying substantially the same voltage to said first conductive layers and said third conductive layers of said memory cells aligned on a selected row of said memory matrix when the data is read out or written.

25. A semiconductor memory device according to claim 24, wherein said first conductive layers of said memory cells in each row are commonly connected to a different row line, and said third conductive layers of said memory cells in each row unit are commonly connected to a different erase line; and wherein
said third means comprises:
a first MOS transistor one end of which is connected to said erase line, the other end of which receives a voltage of high level for erasing the data and a gate of which receives a first control signal, said first MOS transistor being rendered conductive by said first control signal when the data is erased, and
a second MOS transistor arranged between said erase line and said row line, a second control signal being supplied to a gate of said second MOS transistor in order to turn on said second MOS transistor when the data is read out or written.

* * * * *